United States Patent
Masuda et al.

(10) Patent No.: US 11,375,649 B2
(45) Date of Patent: Jun. 28, 2022

(54) COMPONENT SUPPLY DEVICE AND COMPONENT MOUNTING MACHINE USING THE SAME

(71) Applicant: YAMAHA HATSUDOKI KABUSHIKI KAISHA, Iwata (JP)

(72) Inventors: Ryouta Masuda, Shizuoka (JP); Kazuyoshi Oyama, Shizuoka (JP); Yusetsu Kobayashi, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 416 days.

(21) Appl. No.: 16/630,814

(22) PCT Filed: Aug. 1, 2017

(86) PCT No.: PCT/JP2017/027914
§ 371 (c)(1),
(2) Date: Jan. 13, 2020

(87) PCT Pub. No.: WO2019/026181
PCT Pub. Date: Feb. 7, 2019

(65) Prior Publication Data
US 2021/0015010 A1 Jan. 14, 2021

(51) Int. Cl.
*H05K 13/02* (2006.01)
*H05K 13/04* (2006.01)

(52) U.S. Cl.
CPC ....... *H05K 13/021* (2013.01); *H05K 13/0419* (2018.08); *H05K 13/0404* (2013.01)

(58) Field of Classification Search
CPC ............. H05K 13/021; H05K 13/0419; H05K 13/0404
See application file for complete search history.

(56) References Cited

U.S. PATENT DOCUMENTS

| 5,575,136 A | * | 11/1996 | Caldwell ................ B65B 69/00 53/381.1 |
| 2005/0000650 A1 | | 1/2005 | Bergstrom et al. |

(Continued)

FOREIGN PATENT DOCUMENTS

| CN | 202565666 U | 11/2012 |
| CN | 203597016 U | 5/2014 |

(Continued)

OTHER PUBLICATIONS

International Search Report issued in PCT/JP2017/027914; dated Oct. 10, 2017.

*Primary Examiner* — Saul Rodriguez
*Assistant Examiner* — Willie Berry, Jr.
(74) *Attorney, Agent, or Firm* — Studebaker & Brackett PC

(57) ABSTRACT

A component feeding device includes a tape lead-in mechanism that leads a component storage tape into a tape traveling path. A pair of tape holding portions are coupled to an operating lever such that the pair of tape holding portions are allowed to shift in posture between a holding posture in which the pair of tape holding portions are able to hold the component storage tape and a hold releasing posture in which the pair of tape holding portions release their hold on the component storage tape. As a result of turning together with the turned operating lever, the pair of tape holding portions shift in position between a send-off enabling position and a send-off disabling position at which the component storage tape is released from a state of being sent off. At the send-off disabling position, the pair of tape holding portions takes the hold releasing posture.

16 Claims, 30 Drawing Sheets

(56) References Cited

U.S. PATENT DOCUMENTS

2010/0313407 A1* 12/2010 Ohno ................. H05K 13/0452
      29/771
2015/0296669 A1   10/2015 Kitani et al.
2017/0034970 A1    2/2017 Ohashi et al.
2017/0347502 A1* 11/2017 Ohashi ............... H05K 13/0417

FOREIGN PATENT DOCUMENTS

| | | |
|---|---|---|
| CN | 106165561 A | 11/2016 |
| EP | 3 393 224 A1 | 10/2018 |
| JP | 2015-115412 A | 6/2015 |
| JP | 2015-122474 A | 7/2015 |
| JP | 2016-092060 A | 5/2016 |
| WO | 0176994 A1 | 10/2001 |
| WO | 2014/041712 A1 | 3/2014 |
| WO | 2017/104031 A1 | 6/2017 |

* cited by examiner

COMPONENT SUPPLY DEVICE AND COMPONENT MOUNTING MACHINE USING THE SAME

CROSS-REFERENCE TO RELATED APPLICATION

This application is a National Stage of International Patent Application No. PCT/JP2017/027914, filed Aug. 1, 2017, the entire content of which is incorporated herein by reference.

BACKGROUND

Technical Field

The present disclosure relates to a component feeding device that feeds components stored in a component storage tape and to a component mounter having the component feeding device.

Background Art

A component mounter for mounting (packaging) electronic components (which will hereinafter be simply referred to as "components") on a board, such as a printed wiring board, is equipped with a component feeding device that supplies a component to a component take-out position. As the component feeding device, a device that uses a component storage tape storing components therein is known. The component storage tape is composed of a carrier tape having component storage portions in which components are stored, and a cover tape that is pasted on the carrier tape in such a way as to cover the component storage portions. Such a component feeding device is disclosed in, for example, JP-A-2015-115412 and JP-A-2015-122474.

Each of component feeding devices disclosed in JP-A-2015-115412 and JP-A-2015-122474 includes a tape traveling path that is a path leading to a component take-out position of the component storage tape, and a tape lead-in mechanism that leads the component storage tape into the tape traveling path. The tape lead-in mechanism includes a tape send-off unit that sends off the component storage tape toward the tape traveling path, and a positional shift mechanism that after the component storage tape is lead into the tape traveling path, causes the component storage tape to shift in position downward so that the component storage tape is released from a state of being sent off by the tape send-off unit.

In the component feeding device disclosed in JP-A-2015-115412, the positional shift mechanism causes a first tape guide to move downward, the first tape guide being selected out of a first tape guide and a second tape guide that guide both ends in a tape width direction of the component storage tape. This causes the component storage tape to shift in position downward. In the component feeding device disclosed in JP-A-2015-122474, the positional shift mechanism causes a lever to turn downward, and thereby pushes the component storage tape downward. This causes the component storage tape to shift in position downward.

According to the component feeding devices disclosed in JP-A-2015-115412 and JP-A-2015-122474, however, when the component storage tape shifts in position downward, both ends in the tape width direction of the component storage tape are not held. This raises a possibility that a torsion or the like may develop in the component storage tape during its downward shift in position. In such a case where a torsion has developed in the component storage tape, the traveling performance of the component storage tape on the tape traveling path deteriorates, bringing a concern that the component feeding performance of the component feeding device may deteriorate.

SUMMARY

The present disclosure has been conceived in view of the above circumstances, and provides a component feeding device that ensures steady traveling of a component storage tape lead into a tape traveling path to allow steady component feeding, and a component mounter having the component feeding device.

A component feeding device according to one aspect of the present disclosure is a device that transfers a component to a component take-out position, using a component storage tape having a plurality of component storage portions storing the components therein, the component storage portions being arranged at given intervals. This component feeding device includes a tape traveling path that is a path leading to the component take-out position of the component storage tape, and a tape lead-in mechanism that leads the component storage tape into the tape traveling path. The tape lead-in mechanism includes a pair of frames arranged to face each other across a gap in a tape width direction of the component storage tape, the pair of frames each having an opening; a first tape send-off portion fitted to the pair of frames in such a way as to be on an upper side relative to the opening, the first tape send-off portion sending off the component storage tape in a tape send-off direction in which the component storage tape heads for the tape traveling path; a pair of tape holding portions disposed between the pair of frames in such a way as to be on a lower side relative to the first tape send-off portion, the pair of tape holding portions holding both ends in the tape width direction of the component storage tape sent off by the first tape send-off portion, respectively; an operating lever extending in the tape send-off direction, the operating lever being supported on the pair of frames such that applying an operation force to an upstream end in the tape send-off direction of the operating lever causes the operating lever to turn around a first pivot disposed on a downstream end in the tape send-off direction and extending in the tape width direction; and a coupling portion coupling the pair of tape holding portions to the operating lever such that the pair of tape holding portions are allowed to turn together with the turned operation lever and that as a result of the turn, the pair of tape holding portions are allowed to change in posture between a holding posture in which the pair of tape holding portions are able to hold the component storage tape and a hold releasing posture in which the pair of tape holding portions release a hold on the component storage tape. As a result of turning together with the turned operating lever, the pair of tape holding portions shift in position between a send-off enabling position at which the component storage tape can be sent off by the first tape send-off portion and a send-off disabling position at which the component storage tape is released from a state of being sent off by the first tape send-off portion, the send-off disabling position facing the opening on the lower side relative to the send-off enabling position. When set at the send-off disabling position, the pair of tape holding portions take the hold releasing posture.

A component mounter according to another aspect of the present disclosure includes: the above component feeding device; and a head unit that takes out a component transferred to the component take-out position by the component feeding device.

Objects, features, and advantages of the present disclosure will be clarified through the following detailed description and the accompanying drawings.

DETAILED DESCRIPTION

A component feeding device and a component mounter according to embodiments of the present disclosure will now be described with reference to drawings. In the following description, the X-axis, the Y-axis, and the Z-axis in the rectangular coordinate system are used to explain directional relations. The X-axis direction is the direction parallel with a horizontal plane, the Y-axis direction is the direction perpendicular to the X-axis direction on a horizontal plane, and the Z-axis direction is the vertical direction perpendicular to both the X and Y directions. One side of the X-axis direction is referred to as "+X-side", and the other side of the same that is opposite to the one side is referred to as "−X-side". One side of the Y-axis direction is referred to as "+Y-side", and the other side of the same that is opposite to the one side is referred to as "−Y-side". One side, i.e., the upper side of the Z-axis direction is referred to as "+Z-side", and the other side, i.e., the lower side of the same that is opposite to the one side is referred to as "−Z-side".

Configuration of Component Mounter

Figure 1:
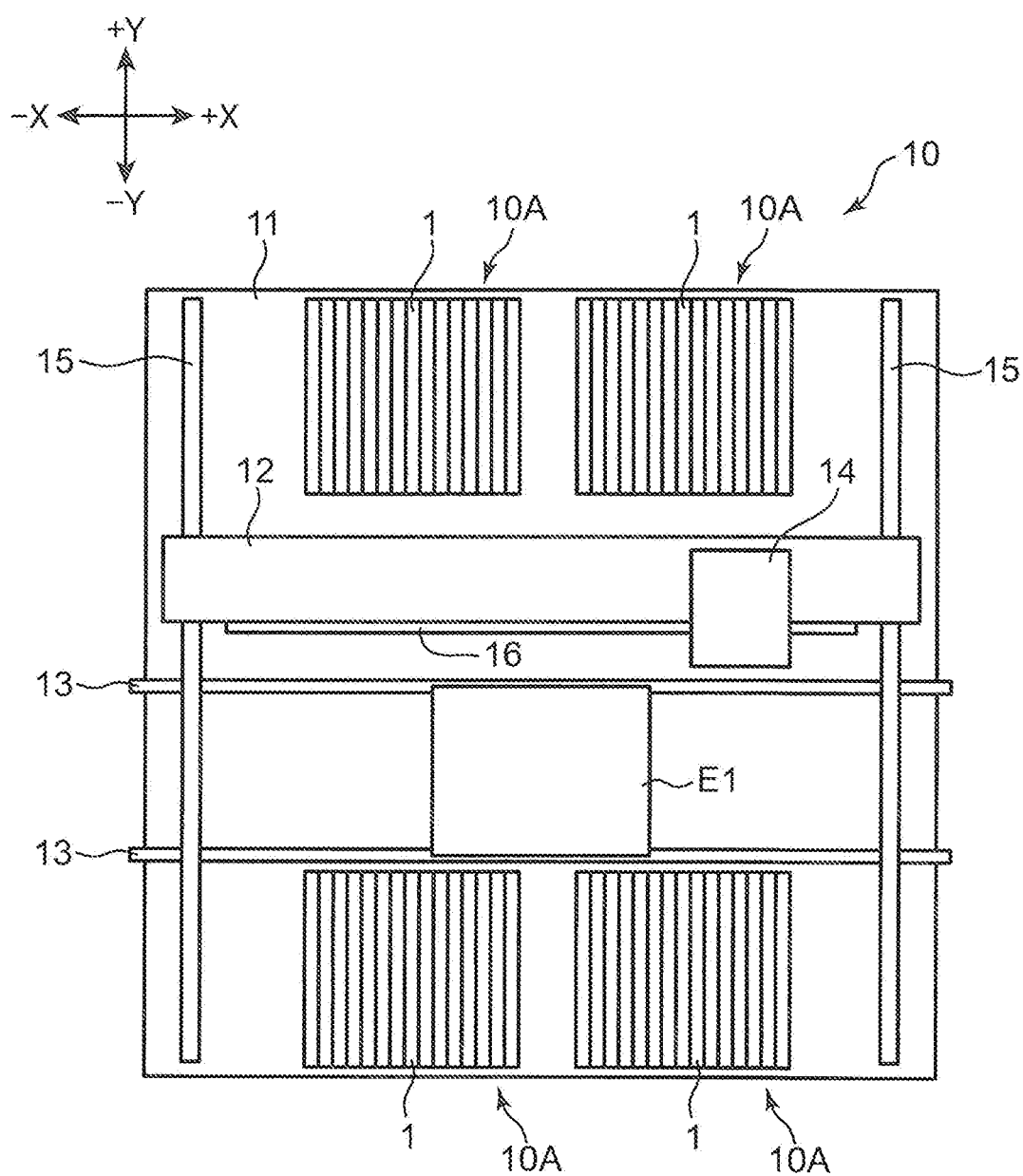
FIG. 1 is a top plan view of a component mounter according to one embodiment of the present disclosure.

FIG. 1 is a top plan view of a component mounter 10 according to one embodiment of the present disclosure. The component mounter 10 is an apparatus that mounts (packages) components on a board E1 to manufacture an electronic circuit board (component-carrying board). The component mounter 10 includes a component feeding section 10A, in which a plurality of component feeding devices 1 are arranged in the X-axis direction, a body frame 11, a mobile frame 12, conveyors 13, a head unit 14, first drive mechanisms 15, and a second drive mechanism 16.

The body frame 11 is a structure in which units making up the component mounter 10 are arranged. The body frame 11 is formed into a substantially rectangular shape in a plan view in the Z-axis direction. The conveyors 13 extend in the X-axis direction and are arranged in the body frame 11. The conveyors 13 transfer the board E1 in the X-axis direction. The board E1 on the conveyors 13 is transferred by the conveyors 13 to a given work location (component mounting location where a component is mounted on the board E1), where the board E1 is positioned.

The mobile frame 12 extends in the X-axis direction, and is supported by the body frame 11 such that the mobile frame 12 is allowed to move in a given direction (Y-axis direction). The mobile frame 12 carries the head unit 14. The head unit 14 is mounted on the mobile frame 12 such that the head unit 14 is allowed to move in the X-axis direction. In other words, the head unit 14 can be moved in the Y-axis direction as a result of movement of the mobile frame 12 in the Y-axis direction and can independently move in the X-axis direction along the mobile frame 12. The head unit 14 can move between the component feeding device 1 and the given work location to which the board E1 is transferred by the conveyors 13. The head unit 14 takes out a component, which is supplied to a component take-out position by the component feeding device 1, and mounts (packages) the taken out component on the board E1.

The head unit 14 has a suction nozzle, which is a holder capable of sucking and holding the component to be mounted on the board E1. The suction nozzle can communicate with any one of a negative pressure generator, a positive pressure generator, and the fresh air, via an electric selector valve. Specifically, supplying a negative pressure to the suction nozzle allows the nozzle to suck/hold the component (to take out the component). Afterward, supplying a positive pressure to the suction nozzle causes the nozzle to release the component. According to this embodiment, a holder different from the suction nozzle may be adopted. For example, a chuck that grips and holds a component may be used in place of the suction nozzle.

The first drive mechanisms 15 are disposed on a +X-side end and a −X-side end of the body frame 11, respectively. The first drive mechanisms 15 are mechanisms that move the mobile frame 12 in the Y-axis direction. Each first drive mechanisms 15 includes a drive motor, a ball screw shaft extending in the Y-axis direction and connected to the drive motor, and a ball nut disposed on the mobile frame 12 and screwed on the ball screw shaft. According to the first drive mechanism 15 configured in this manner, as a result of the rotation of the ball screw shaft caused by the drive motor, the ball nut moves back and forth along the ball screw shaft, which causes the mobile frame 12 to move in the Y-axis direction.

The second drive mechanism 16 is disposed on the mobile frame 12. The second drive mechanism 16 is a mechanism that moves the head unit 14 in the X-axis direction along the mobile frame 12. Similar to the first drive mechanism 15, the second drive mechanism 16 includes, for example, a drive motor, a ball screw shaft extending in the X-axis direction and connected to the drive motor, and a ball nut disposed on the head unit 14 and screwed on the ball screw shaft. According to the second drive mechanism 16 configured in this manner, as a result of the rotation of the ball screw shaft caused by the drive motor, the ball nut moves back and forth along the ball screw shaft, which causes the head unit 14 to move in the X-axis direction.

Configuration of Component Feeding Device

Figure 2:
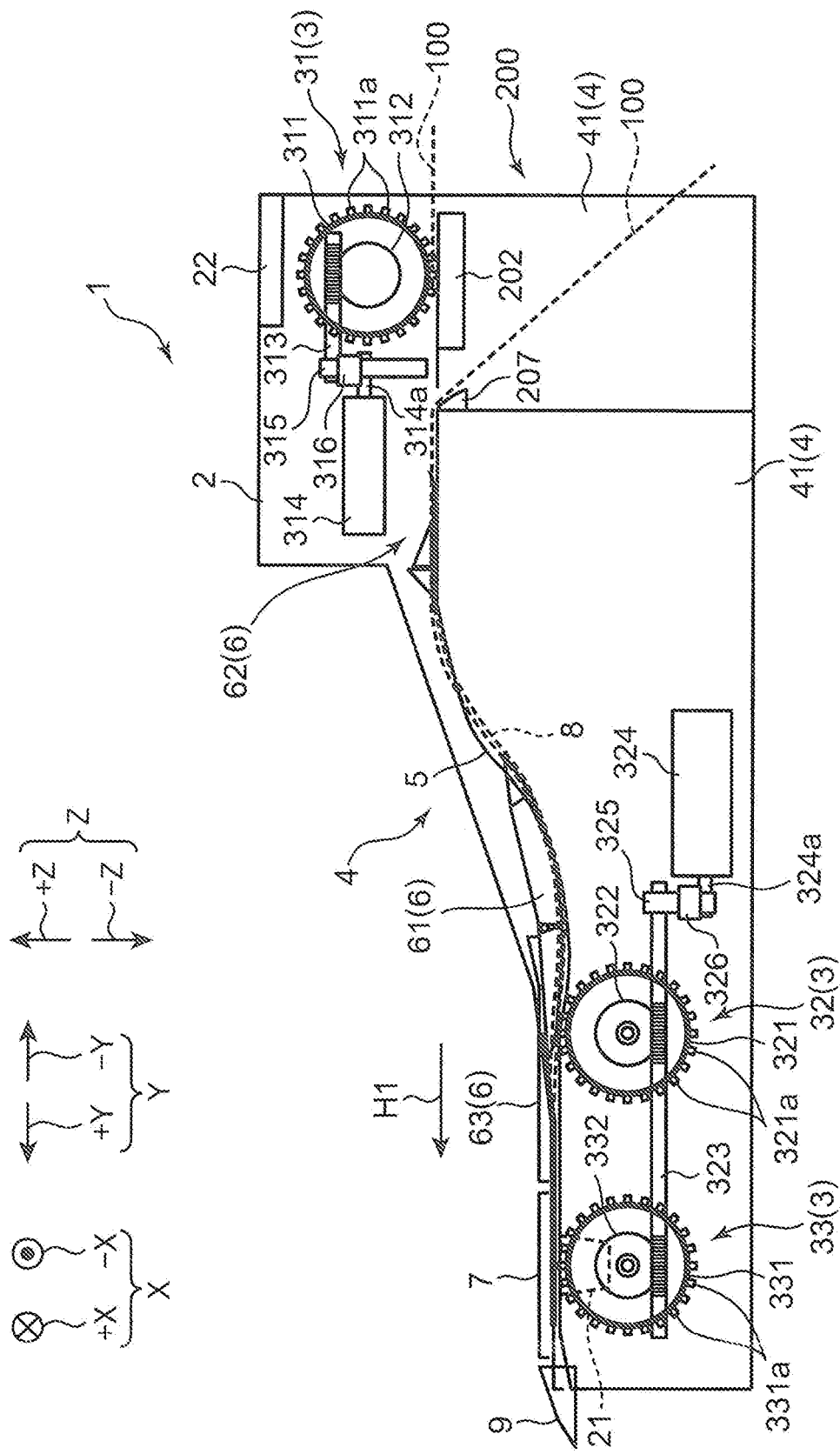
FIG. 2 is a side view of a component feeding device having the component storage tape attached thereto.

FIG. 2 is a side view of a component feeding device 1 included in the component mounter 10. The component feeding device 1 is a device that sends off a component storage tape 100, which stores components therein, in a tape send-off direction H1 to supply a component to a component take-out position 21. The component supplied to the component take-out position 21 by the component feeding device 1 is taken out from the component storage tape 100 by the head unit 14 included in the component mounter 10, and then is mounted on the board E1.

Figure 3A:
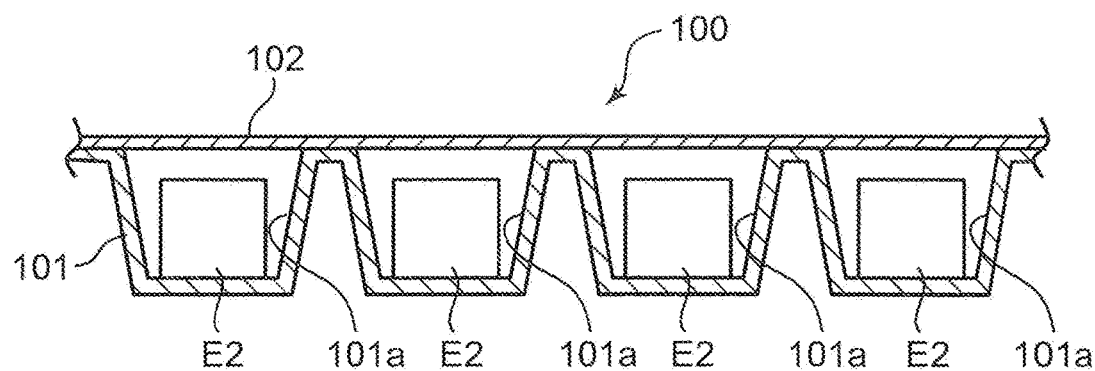
FIGS. 3A and 3B show configuration diagrams of the component storage tape used in the component feeding device.
Figure 3B:
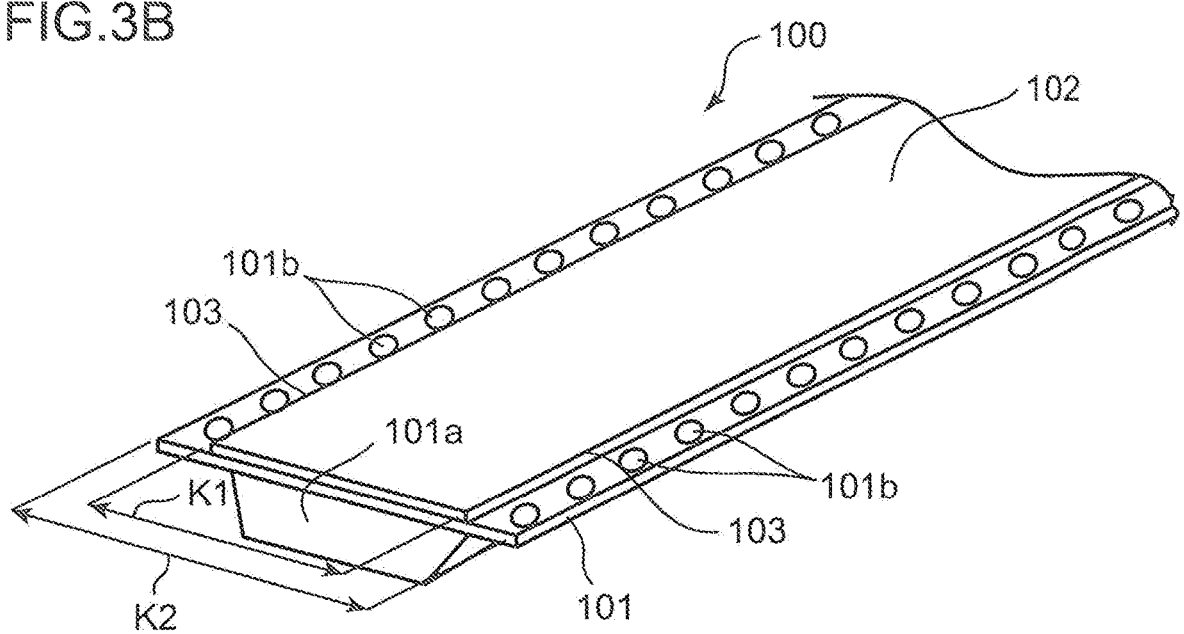

Before description of a configuration of the component feeding device 1, the component storage tape 100 will be described with reference to FIGS. 3A and 3B. FIGS. 3A and 3B show configuration diagrams of the component storage tape 100 used in the component feeding device 1. FIG. 3A is a sectional view showing a section of the component storage tape 100 cut along the tape send-off direction H1. FIG. 3B is a perspective view of the component storage tape 100.

The component storage tape 100 includes a carrier tape 101 and a cover tape 102, and is attached to the component feeding device 1. The carrier tape 101 is a tape having a plurality of component storage portions 101a storing components E2 therein, the component storage portions 101a being arranged at given intervals. The carrier tape 101 has holes 101b arranged at given intervals on its both ends in a width direction. These holes 101b are fitted to teeth of first sprockets 311, second sprockets 321, and third sprockets 331 of a tape send-off unit 3, which will be described later. "The holes 101b of the component storage tape 100 are fitted to the teeth of the first sprockets 311, the second sprockets 321, and the third sprockets 331" indicates a state in which the teeth are fitted in the holes 101b to allow sending off the component storage tape 100 in a motion interlocked with the rotation of the first sprockets 311, the second sprockets 321, and the third sprockets 331.

The cover tape 102 is a tape pasted on the carrier tape 101 in such a way as to cover the component storage portions 101a. The cover tape 102 is pasted on the carrier tape 101 by joining both ends in the width direction of the cover tape 102 to the carrier tape 101. As a result, on the component storage tape 100, joined portions 103, which result from the cover tape 102 being joined to the carrier tape 101, are formed respectively on both ends in the width direction of an upper surface of the carrier tape 101 such that the joined portions 103 extend linearly along edges in the width direction of the cover tape 102. In the width direction of the carrier tape 101, the joined portions 103 are located inward relative to the holes 101b.

According to the component storage tape 100 configured in the above manner, a length K1 between the joined portions 103 formed respectively on both ends in the width direction of the carrier tape 101 is substantially equal to a length in the width direction of the cover tape 102. A length K2 in the width direction (tape width) of the component storage tape 100 is equal to a length in the width direction of the carrier tape 101. The component storage tape 100 is a tape with a large width, having the tape width K2 of, for example, 32 mm or more.

Figure 4:
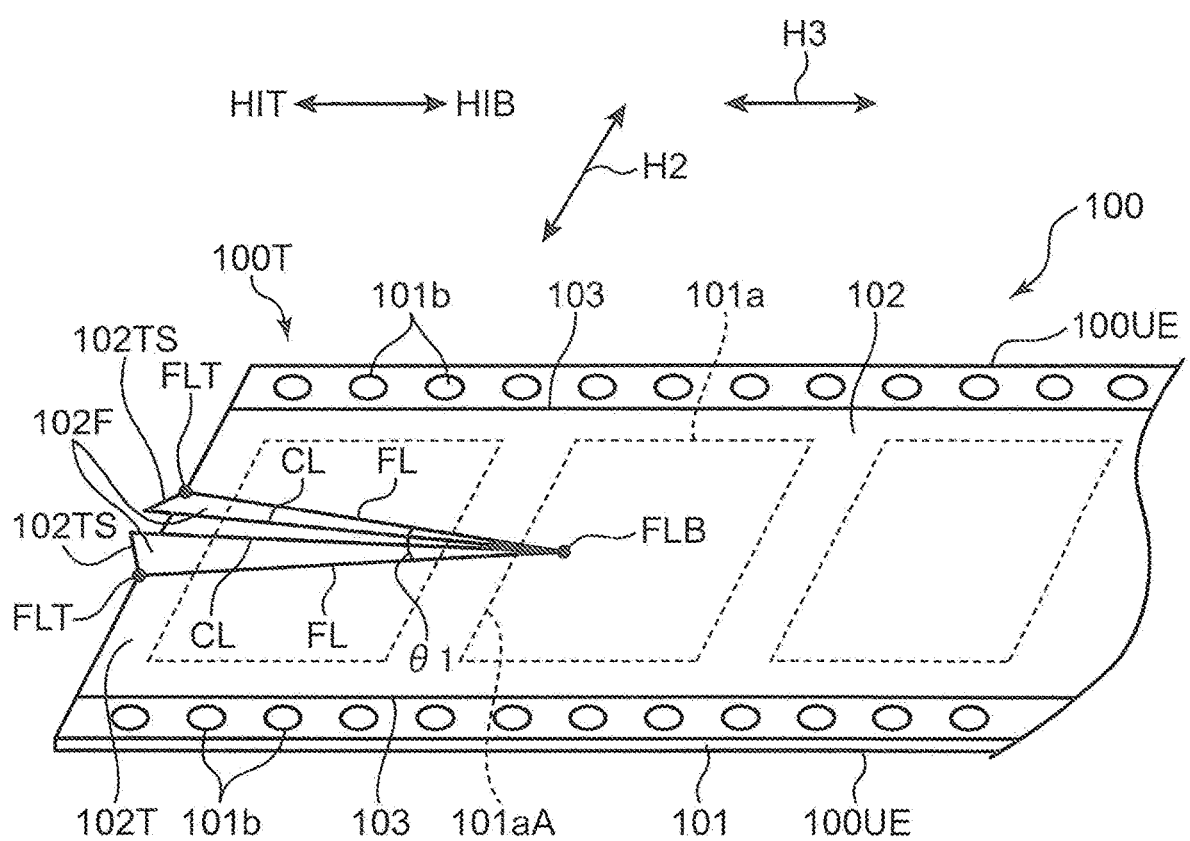
FIG. 4 is a perspective view showing a state of a tip end of the component storage tape.

According to this embodiment, before being attached to the component feeding device 1, the component storage tape 100 has its tip end 100T subjected to processing of a tip end of a tape, as shown in FIG. 4. The processing of a tip end of a tape will be summarized as follows. A tip end 102T of the cover tape 102 is cut along a longitudinal direction H3, from a given position (e.g., central position) between both ends in a tape width direction H2, the given position being on a tip edge 102TS of the cover tape 102. As a result, a pair of cut parts are formed on the tip end 102T of the cover tape 102, the cut parts being divided parts formed on both sides in the tape width direction H2 across a cut line CL. Subsequently, the pair of cut parts are lifted such that respective tip edges 102TS of the cover tape 102 on the pair of cut parts are separated upward from the carrier tape 101. A pair of lifted parts are thus formed. The pair of lifted parts are then each folded along a fold FL. This creates a pair of triangular fold pieces 102F each formed of the tip edge 102TS, the cut line CL, and the fold FL serving as three sides.

By the above processing of a tip end of a tape, the pair of right-triangular fold pieces 102F each having the fold FL serving as an oblique side are formed on the tip end 102T of the cover tape 102 as a result of lifting the cover tape 102 off the carrier tape 101 and folding lifted parts of the cover tape 102. On the tip end 102T of the cover tape 102, end points FLB on the rear end side H1B of respective folds FL of the pair of fold pieces 102F coincide to form a single end point FLB located at a midpoint in the tape width direction H2. In contrast, end points FLT on the tip end side H1T of respective folds FL of the pair of fold pieces 102F are separated from each other in the tape width direction H2 and are located slightly offset to the midpoint to be closer to both ends in the tape width direction H2. The folds FL of the pair of fold pieces 102F extend linearly from the end points FLT on the tip end side H1T to the end point FLB on the rear end side H1B in such a way as to be inwardly diagonal in the tape width direction H2 relative to a longitudinal direction H3. An angle θ1 made by respective folds FL of the pair of fold pieces 102F is an acute angle.

As shown in FIG. 2, the component feeding device 1 includes a device body 2, the tape send-off unit 3, a tape traveling path forming unit 4, a component exposing unit 6, a tape traveling guide unit 7, a lid member 8, a tape ejection guide unit 9, and a tape lead-in mechanism 200. The device body 2 is an enclosure in which units making up the component feeding device 1 are housed. To the device body 2, an operation unit 22 is annexed. The operation unit 22 is a unit to which an instruction to cause the component feeding device 1 to operate is input by an operator.

Figure 5:
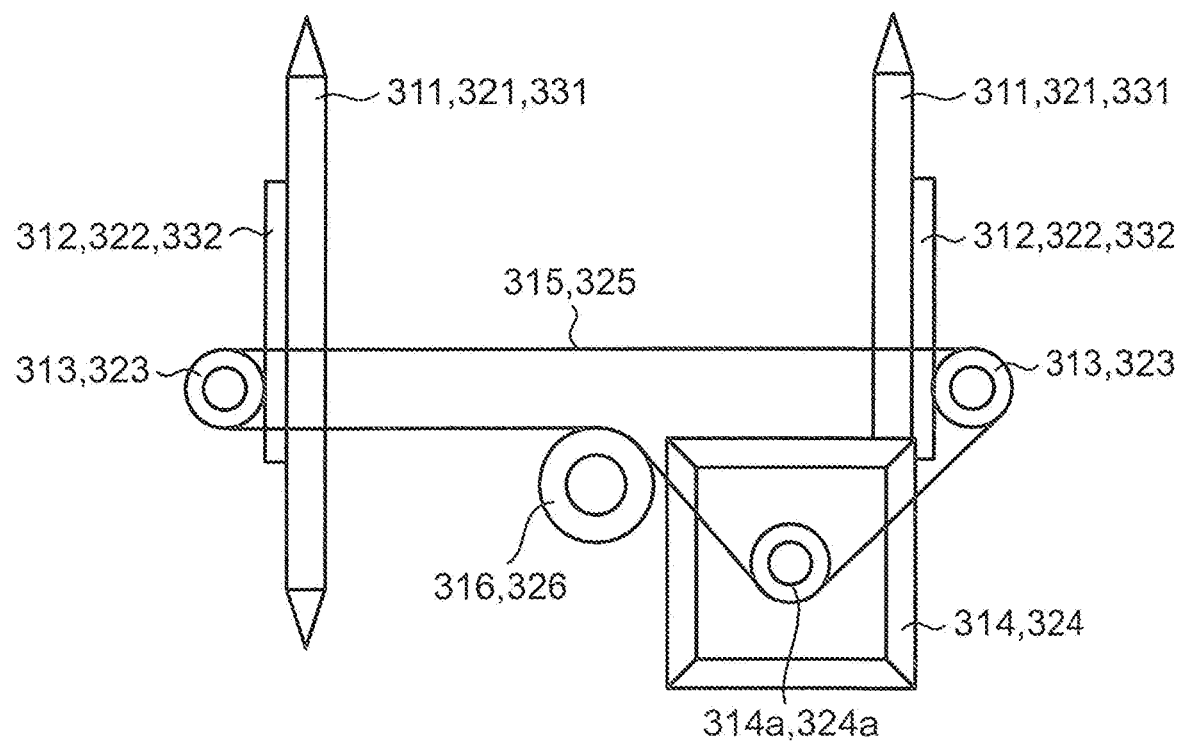
FIG. 5 is a view of a tape send-off unit seen in a tape send-off direction, the tape send-off unit being included in the component feeding device.
Figure 6:
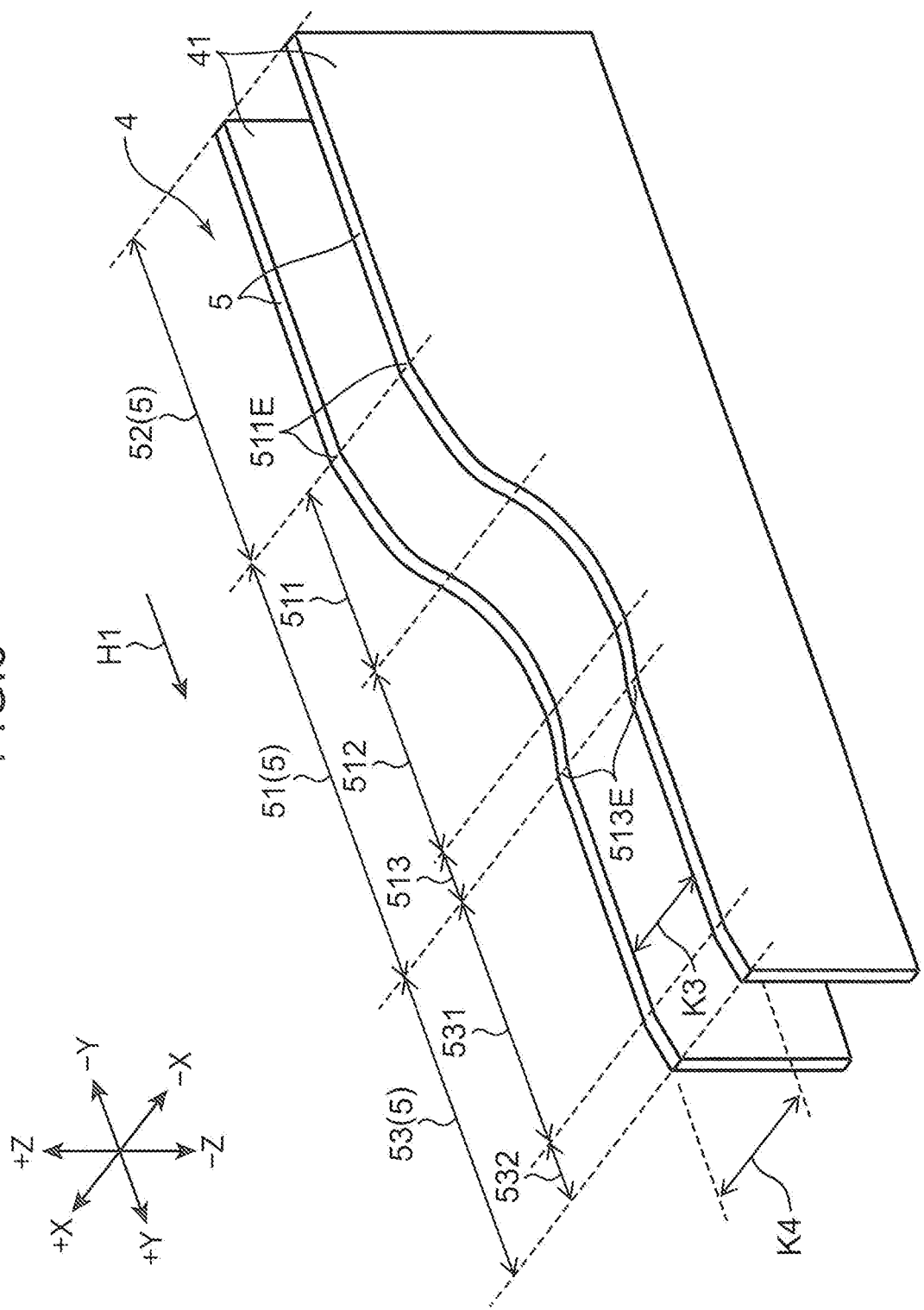
FIG. 6 is a perspective view of a configuration of a tape traveling path forming unit included in the component feeding device.

FIG. 5 is a schematic diagram of a configuration of the tape send-off unit 3 included in the component feeding device 1, showing a view of the tape send-off unit 3 seen in the tape send-off direction H1. FIG. 6 is a perspective view of a configuration of the tape traveling path forming unit 4 included in the component feeding device 1.

The tape send-off unit 3 sends off the component storage tape 100, which has the cover tape 102 located on its upper surface side, in the given tape send-off direction H1 along the direction of arrangement of the component storage portions 101a, toward the component take-out position 21. The tape send-off direction H1, in which the component storage tape 100 is sent off by the tape send-off unit 3 toward the component take-out position 21, is the direction of heading from the −Y-side to the +Y-side. The tape send-off unit 3 intermittently sends off the component storage tape 100 in the tape send-off direction H1 so that the component storage portions 101a reach the component take-out position 21 one by one at given time intervals. The tape send-off unit 3 is configured to be capable of executing a loading operation of sending off the component storage tape 100 in the tape send-off direction H1 toward the component take-out position 21 and an unloading operation of sending off the component storage tape 100 in a direction of heading from the +Y-side to the −Y-side, which is opposite to the tape send-off direction H1.

The tape traveling path forming unit 4 forms a tape traveling path 5 through which the component storage tape 100 sent off by the tape send-off unit 3 travels to reach the component take-out position 21. As shown in FIGS. 2 and 6, the tape traveling path forming unit 4 includes a pair of guide walls 41.

The pair of guide walls 41 are a pair of walls arranged counter to each other across a given gap in the X-axis direction and extending in the Y-axis direction in the device body 2. The component storage tape 100 sent off by the tape send-off unit 3 has lower surface ends 100UE (see FIG. 4), which are both ends in the tape width direction H2 (X-axis direction) of a lower surface of the component storage tape 100. These lower surface ends 100UE are guided respectively by upper end faces of the pair of guide walls 41. In other words, the tape traveling path 5 for the component storage tape 100 is formed along the upper end faces of the pair of guide walls 41. From the pair of guide walls 41, areas are cut out, the areas being occupied by a pair of second sprockets 321 of a second tape send-off portion 32 of the tape send-off unit 3 and a pair of third sprockets 331 of a third tape send-off portion 33 of the same. These second and third sprockets 321 and 331 will be described later.

A distance K3 between respective inner surfaces of the pair of guide walls 41, the inner surfaces being counter to each other, is determined to be substantially equal with the length K1 between joined portions 103 of the component storage tape 100. A distance K4 between respective outer surfaces of the pair of guide walls 41 is determined to be substantially equal with the tape width K2 of the component storage tape 100.

As shown in FIG. 6, the tape traveling path 5 formed by the upper end faces of the pair of guide walls 41 includes a first traveling path 51, a second traveling path 52, and a third traveling path 53. The first traveling path 51 of the tape traveling path 5 makes up a sloped portion of a curved shape. The first traveling path 51 is formed into a curved shape in which a lowermost downstream end in the tape send-off direction H1 is located on the lower side (−Z-side) relative to an uppermost upstream end. The first traveling path 51 has a first curved area 511 on the uppermost upstream side in the tape send-off direction H1, a second curved area 512 continuous with the downstream side in the tape send-off direction H1 of the first curved area 511, and a third curved area 513 continuous with the downstream side in the tape send-off direction H1 of the second curved area 512.

The first curved area 511 of the first traveling path 51 is formed into an upward curved shape in a view in the X-axis direction. The second curved area 512 of the first traveling path 51 is formed into a downward curved shape in a view in the X-axis direction. The third curved area 513 of the first traveling path 51 is formed into an upward curved shape in a view in the X-axis direction. In this third curved area 513, a lowermost downstream end 513E in the tape send-off direction H1 is located on the lower side (−Z-side) relative to an uppermost upstream end 511E in the tape send-off direction H1 of the first curved area 511 and is at the same height in the vertical direction (Z-axis direction) as the height of the component take-out position 21.

The second traveling path 52 of the tape traveling path 5 is continuous with the upstream side in the tape send-off direction H1 of the first traveling path 51. According to this embodiment, the second traveling path 52 is formed in such a way as to extend horizontally from the upstream side to the downstream side in the tape send-off direction H1.

The third traveling path 53 of the tape traveling path 5 is continuous with the downstream side in the tape send-off direction H1 of the first traveling path 51, and leads to the component take-out position 21. According to this embodiment, the third traveling path 53 has a horizontal area 531 and a sloped area 532. The horizontal area 531 is an area that is continuous with the lowermost downstream end 513E of the third curved area 513 of the first traveling path 51 and that extends horizontally along the tape send-off direction H1. A downstream end in the tape send-off direction H1 of the horizontal area 531 of the third traveling path 53 matches the component take-out position 21 in the tape send-off direction H1. In this manner, the component take-out position 21 is located in the horizontal area 531, which is the horizontal area of the third traveling path 53. This configuration improves the accuracy of a process of taking out a component E2 from the component storage tape 100 at the component take-out position 21. The sloped area 532 is an area that is continuous with the downstream side in the tape send-off direction H1 of the horizontal area 531 and that slopes downward in the forward direction.

A configuration of the tape send-off unit 3 will be described specifically with reference to FIGS. 2 and 5. The tape send-off unit 3 includes a first tape send-off portion 31, a second tape send-off portion 32, and a third tape send-off portion 33.

The first tape send-off portion 31 makes up a part of the tape lead-in mechanism 200, which will be described later. The first tape send-off portion 31 is located on the upstream side in the tape send-off direction H1 relative to the second traveling path 52 which is an upstream-side-path making up the tape traveling path 5. The first tape send-off portion 31 sends off the component storage tape 100 with its tip end provided as a free end, toward the second traveling path 52 of the tape traveling path 5. As a result, the component storage tape 100 is lead into the second traveling path 52 of the tape traveling path 5. The component storage tape 100, which is sent off by the first tape send-off portion 31 to the second traveling path 52, travels along the second traveling path 52 and then travels on the first traveling path 51. The tape lead-in mechanism 200 will be described in detail later.

The first tape send-off portion 31 includes the pair of first sprockets 311, a pair of first worm wheel 312, a pair of first worms 313, a first servomotor 314, a first belt 315, and a first tension roller 316.

Figure 20:
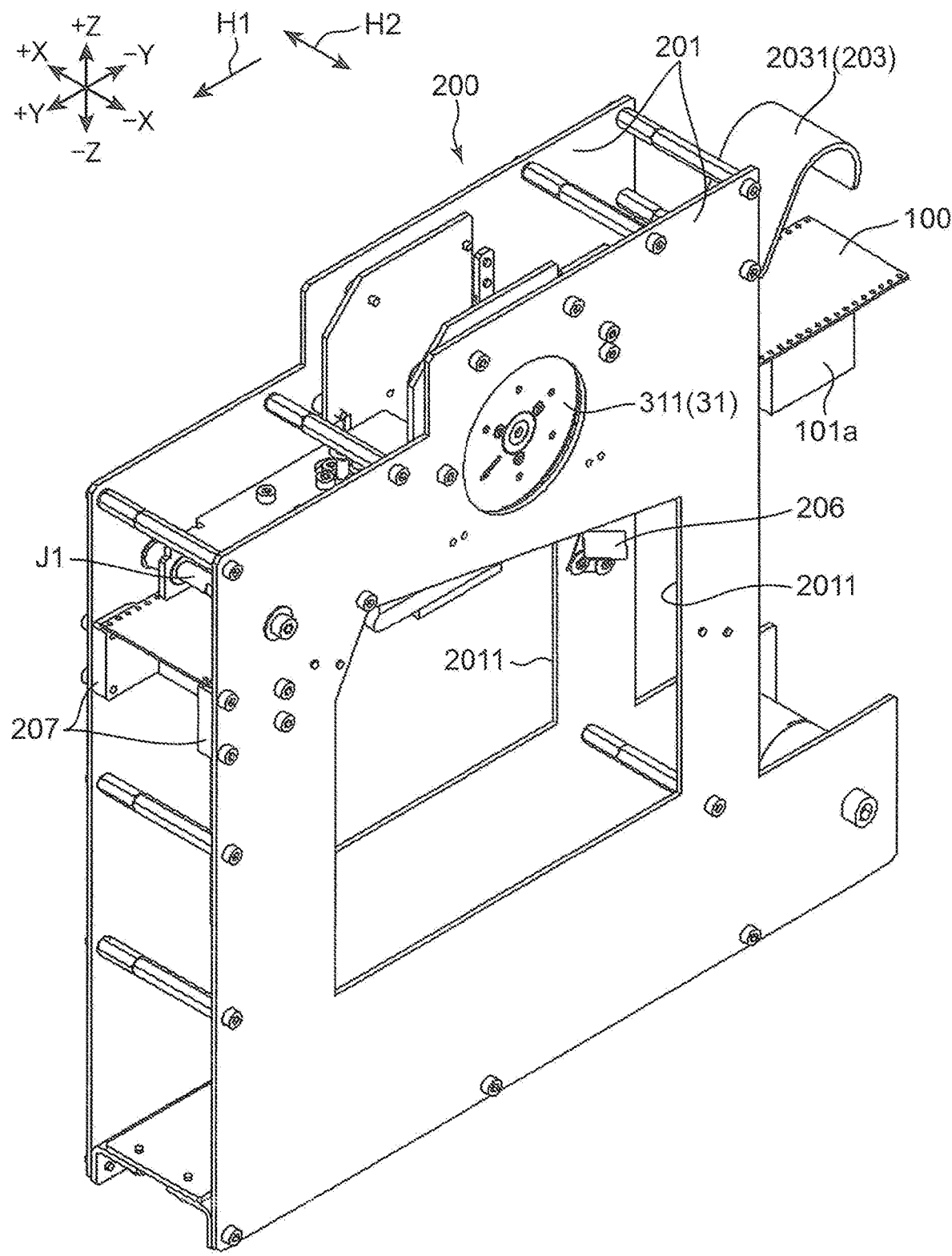
FIG. 20 is a perspective view of a tape lead-in mechanism included in the component feeding device.

The pair of first sprockets 311 are disc-shaped sprockets that are supported on a pair of frames 201 (see FIG. 20 showing the frames 201 which will be described later) in such a way as to be capable of rotating around an axis extending in the X-axis direction (tape width direction H2). The pair of frames 201 make up a part of the tape lead-in mechanism 200, which will be described later. The pair of first sprockets 311 have a plurality of teeth 311a arranged circumferentially at given intervals. Respective sets of teeth 311a of the pair of first sprockets 311 can be fitted in respective groups of holes 101b formed on both ends in the tape width direction H2 of the carrier tape 101 of the component storage tape 100. The pair of first sprockets 311 each have a built-in one-way clutch that transmits a torque in one direction only.

The pair of first worm wheels 312 are worm gears that are arranged coaxial respectively with the pair of first sprockets 311. The pair of first worms 313 are screw gears that engage respectively with the pair of first worm wheels 312.

The first servomotor 314 is a driving source that generates a driving force that causes the pair of first sprockets 311 to rotate. The first servomotor 314 has a motor output shaft 314a that outputs the driving force. The first belt 315 is an endless belt which is stretched with a tension between the motor output shaft 314a and the pair of first worms 313. The first belt 315 runs through a looped path as a result of the rotation of the first servomotor 314. The first tension roller 316 is a roller that is in contact with the peripheral surface of the first belt 315 to give a tension to the first belt 315.

According to the first tape send-off portion 31 configured in the above manner, the rotation driving force of the first servomotor 314 is transmitted to the pair of first worm wheels 312 via the first belt 315 and the pair of first worms 313, thus causing the pair of first worm wheels 312 to rotate. When the pair of first worm wheels 312 rotate, their rotation causes the pair of first sprockets 311 to rotate in an interlocked motion. As the pair of first sprockets 311 rotate, the first sprockets 311 send off the component storage tape 100 including the carrier tape 101 having the holes 101b in which the teeth 311a of the first sprockets 311 are fitted.

The second tape send-off portion 32 is disposed on the downstream side in the tape send-off direction H1 of the first tape send-off portion 31. The second tape send-off portion 32 is disposed on a downstream end in the tape send-off direction H1 of the first traveling path 51 of the tape traveling path 5, that is, disposed on an upstream end in the tape send-off direction H1 of the third traveling path 53. The second tape send-off portion 32 receives the component storage tape 100, which is sent off by the first tape send-off portion 31 to travel on the first traveling path 51, and intermittently sends off the component storage tape 100 toward the component take-out position 21. The second tape send-off portion 32 thus causes the component storage tape 100 to travel on the third traveling path 53. The second tape send-off portion 32 intermittently sends off the component storage tape 100 such that the center of the component storage portion 101a matches the component take-out position 21.

Similar to the first tape send-off portion 31, the second tape send-off portion 32 includes the pair of second sprockets 321, a pair of second worm wheel 322, a pair of second worms 323, a second servomotor 324, a second belt 325, and a second tension roller 326.

The pair of second sprockets 321 are disc-shaped sprockets that are supported on the device body 2 in such a way as to be capable of rotating respectively around an axis extending in the X-axis direction (tape width direction H2). The pair of second sprockets 321 have a plurality of teeth 321a arranged circumferentially at given intervals. On the pair of second sprockets 321, teeth 321a located on the +Z-side in the Z-axis direction are exposed from the upper end faces of the pair of guide walls 41. Respective sets of teeth 321a of the pair of second sprockets 321 can be fitted in respective groups of holes 101b formed on both ends in the tape width direction H2 of the carrier tape 101 of the component storage tape 100.

The pair of second worm wheels 322 are worm gears that are arranged coaxial respectively with the pair of second sprockets 321. The pair of second worms 323 are screw gears that engage respectively with the pair of second worm wheels 322.

The second servomotor 324 is a driving source that generates a driving force that causes the pair of second sprockets 321 to rotate. The second servomotor 324 has a motor output shaft 324a that outputs the driving force. The second belt 325 is an endless belt which is stretched with a tension between the motor output shaft 324a and the pair of second worms 323. The second belt 325 runs through a looped path as a result of the rotation of the second servomotor 324. The second tension roller 326 is a roller that is in contact with the peripheral surface of the second belt 325 to give a tension to the second belt 325.

According to the second tape send-off portion 32 configured in the above manner, the rotation driving force of the second servomotor 324 is transmitted to the pair of second worm wheels 322 via the second belt 325 and the pair of second worms 323, thus causing the pair of second worm wheels 322 to rotate. When the pair of second worm wheels 322 rotate, their rotation causes the pair of second sprockets 321 to rotate in an interlocked motion. As the pair of second sprockets 321 rotate, the second sprockets 321 send off the component storage tape 100 including the carrier tape 101 having the holes 101b in which the teeth 321a of the second sprockets 321 are fitted.

When the tip end 100T of the component storage tape 100 sent off by the first tape send-off portion 31 reaches the pair of second sprockets 321 and, at the tip end 100T of the component storage tape 100, the holes 101b of the carrier tape 101 are fitted to the teeth 321a of the pair of second sprockets 321, the first servomotor 314 comes to a stop. When the first servomotor 314 stops in this manner, a rotating shaft of the first sprockets 311 stops. However, the one-way clutch interposed between the rotating shaft and each of the first sprockets 311 allows the first sprockets 311 to rotate in a motion interlocked with the travel of the component storage tape 100, which is sent off by the rotation of the pair of second sprockets 321, even when the rotating shaft does not rotate.

The third tape send-off portion 33 is disposed on a downstream end in the tape send-off direction H1 of the horizontal area 531 of the third traveling path 53 of the tape traveling path 5. In other words, the third tape send-off portion 33 is disposed close to the component take-out position 21 on the downstream side in the tape send-off direction H1 of the second tape send-off portion 32. The third tape send-off portion 33 sends off the component storage tape 100 as the third tape send-off portion 33 makes an interlocked motion with the second tape send-off portion 32. The third tape send-off portion 33 receives the component storage tape 100, which is sent off by the second tape send-off portion 32 to travel on the third traveling path 53, and sends off the component storage tape 100 to cause it to pass the component take-out position 21. In the above configuration in which the third tape send-off portion 33 is disposed close to the component take-out position 21 and receives the component storage tape 100 in such a location, the component storage tape 100 can be sent off in a state in which the component storage tape 100 is positioned highly accurately relative to the component take-out position 21.

The third tape send-off portion 33 includes the pair of third sprockets 331, and a pair of third worm wheels 332. The above expression "the third tape send-off portion 33 is disposed close to the component take-out position 21" means that, in a view in the X-axis direction, the third tape send-off portion 33 is disposed such that the component take-out position 21 is in an area occupied by the pair of third sprockets 331 in the tape send-off direction H1. In a view in the X-axis direction, the component take-out position 21 may be directly above the top (uppermost end) of the pair of third sprockets 331 or may be at a position shifted in the Y-axis direction from the position directly above the top of the pair of third sprockets 331. When the component take-out position 21 is determined to be a position shifted in the Y-axis direction from the position directly above the top of the pair of third sprockets 331, it is preferable that the component take-out position 21 be shifted not toward the downstream side but toward the upstream side in the tape send-off direction H1. The reason for preferring this arrangement is that, at the position shifted toward the upstream side, an area of component storage tape 100 that passes the component take-out position 21, the component storage tape 100 being sent off by the pair of third sprockets 331 of the third tape send-off portion 33, is in a state of being pulled and therefore hardly deforms, in which case the component storage tape 100 is positioned highly accurately relative to the component take-out position 21.

The pair of third sprockets 331 are disc-shaped sprockets that are supported on the device body 2 in such a way as to be capable of rotating respectively around an axis extending in the X-axis direction (tape width direction H2). The pair of third sprockets 331 have a plurality of teeth 331a arranged circumferentially at given intervals. On the pair of third sprockets 331, teeth 331a located on the +Z-side are exposed from the upper end faces of the pair of guide walls 41. Respective sets of teeth 331a of the pair of third sprockets 331 can be fitted in respective groups of holes 101b formed on both ends in the tape width direction H2 of the carrier tape 101 of the component storage tape 100.

The pair of third worm wheels 332 are worm gears that are arranged coaxial respectively with the pair of third sprockets 331. The pair of third worm wheels 332 engage respectively with the pair of second worms 323.

According to the third tape send-off portion 33 configured in the above manner, which operates in the same manner as the second tape send-off portion 32 does, the rotation driving force of the second servomotor 324 is transmitted to the pair of third worm wheels 332 via the second belt 325 and the pair of second worms 323, thus causing the pair of third worm wheels 332 to rotate. When the pair of third worm wheels 332 rotate, their rotation causes the pair of third sprockets 331 to rotate in an interlocked motion. As the pair of third sprockets 331 rotate, the third sprockets 331 send off the component storage tape 100 including the carrier tape 101 having the holes 101b in which the teeth 331a of the third sprockets 331 are fitted.

Figure 7:
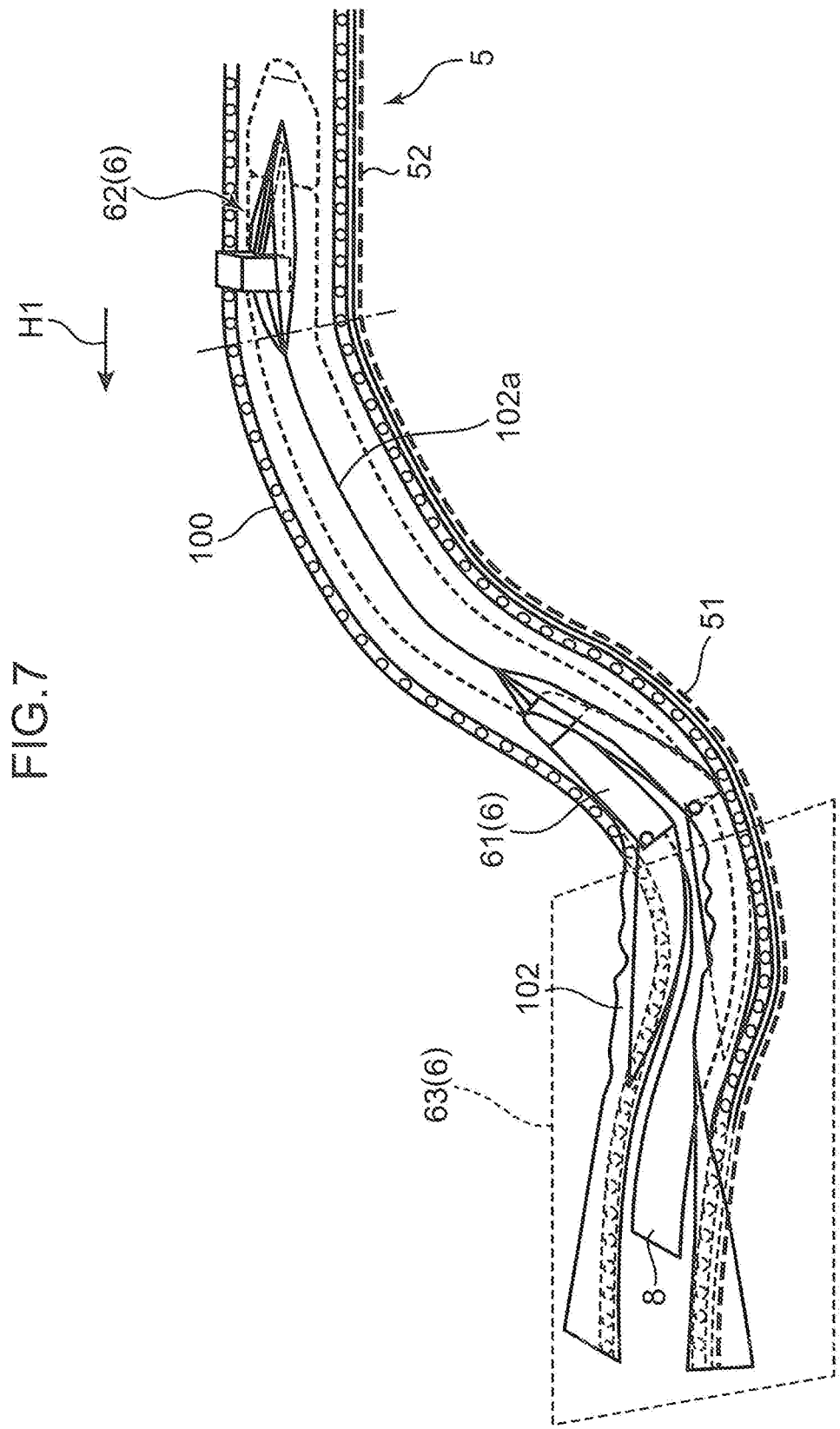
FIG. 7 is a perspective view of a configuration of a component exposing unit included in the component feeding device.

FIG. 7 is a perspective view of a configuration of the component exposing unit 6 included in the component feeding device 1. The component exposing unit 6 carries out a component exposing process of lifting the cover tape 102 of the component storage tape 100, which travels on the tape traveling path 5, along the joined portions 103 serving as starting points, where the cover tape 102 is joined to the carrier tape 101, and pushing lifted parts of the cover tape 102 to outside of the side edges in the tape width direction H2 of the component storage tape 100 while folding the lifted parts downward (toward the −Z-side) to expose the component E2 stored in the component storage portion 101a. The component exposing unit 6 includes a cover tape lifting portion 61, a cover tape pre-processing portion 62, and a cover tape post-processing portion 63.

The cover tape lifting portion 61 is disposed on the first traveling path 51 of the tape traveling path 5. The cover tape lifting portion 61 carries out a lifting process of lifting the cover tape 102 off the carrier tape 101 such that an extent of lifting the cover tape 102 off the carrier tape 101 increases continuously on the component storage tape 100, which travels on the first traveling path 51.

Between the pair of guide walls 41, the cover tape pre-processing portion 62 is disposed on the second traveling path 52 of the tape traveling path 5. Before the cover tape lifting portion 61 carries out the lifting process, the cover tape pre-processing portion 62 carries out pre-processing of cutting the cover tape 102.

The cover tape post-processing portion 63, which is located on the upper side (+Z-side) relative to the cover tape lifting portion 61, is disposed on the first traveling path 51 of the tape traveling path 5. The cover tape post-processing portion 63 carries out post-processing of pushing lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101a open to the outside.

Figure 8:
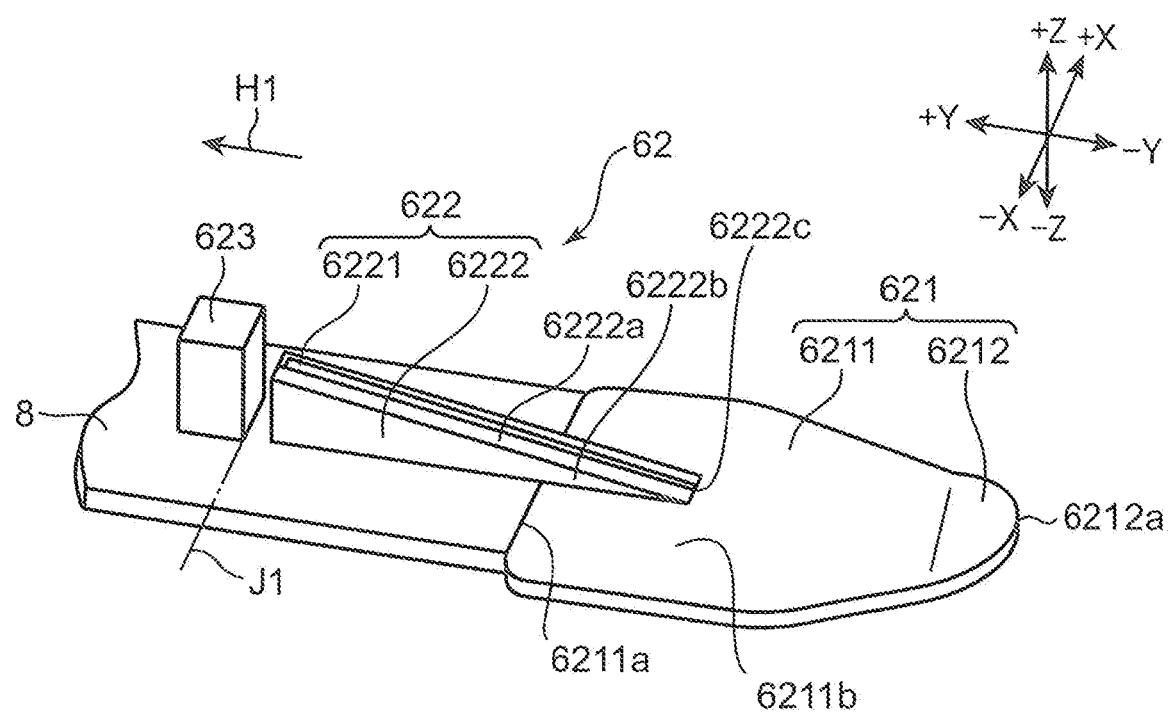
FIG. 8 is a perspective view of a configuration of a cover tape pre-processing portion of the component exposing unit.
Figure 9:
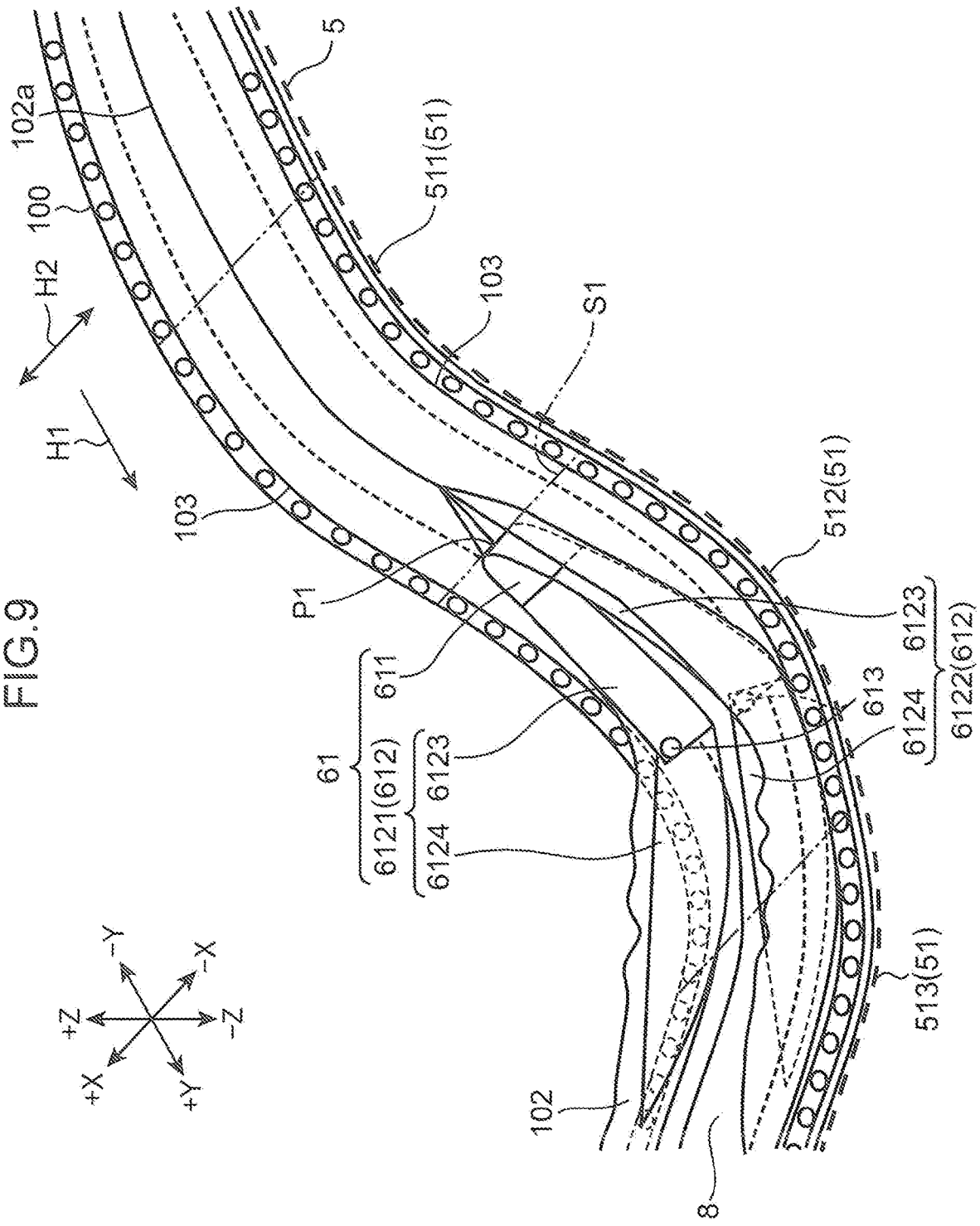
FIG. 9 is a perspective view of a configuration of a cover tape lifting portion of the component exposing unit.
Figure 10:
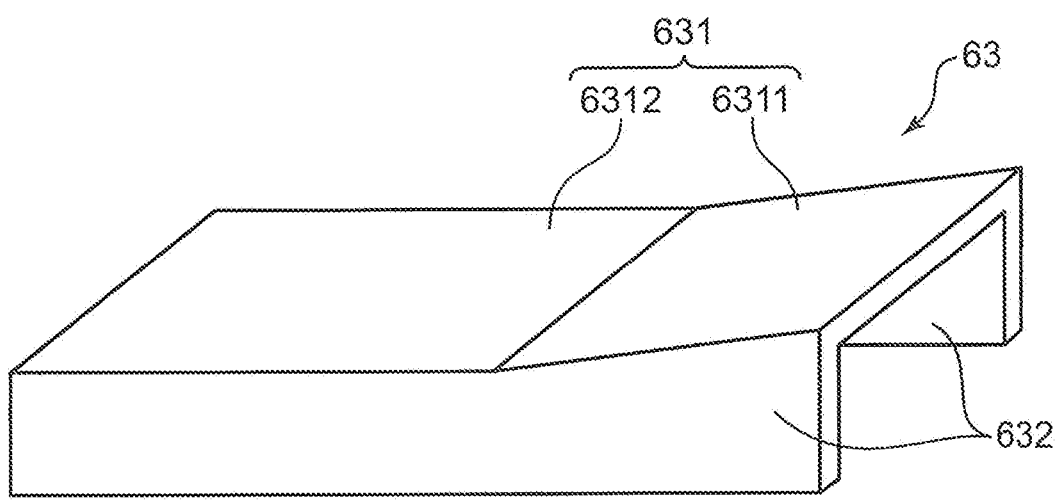
FIG. 10 is a perspective view of a configuration of a cover tape post-processing portion of the component exposing unit.
Figure 11:
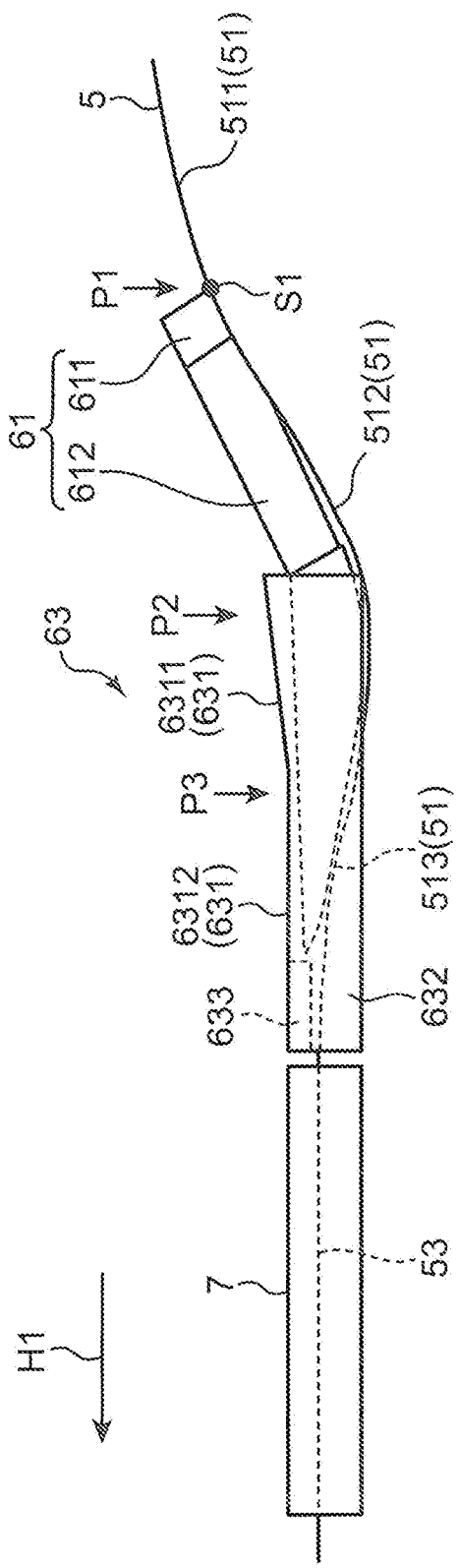
FIG. 11 is a side view of the cover tape post-processing portion.
Figure 12:
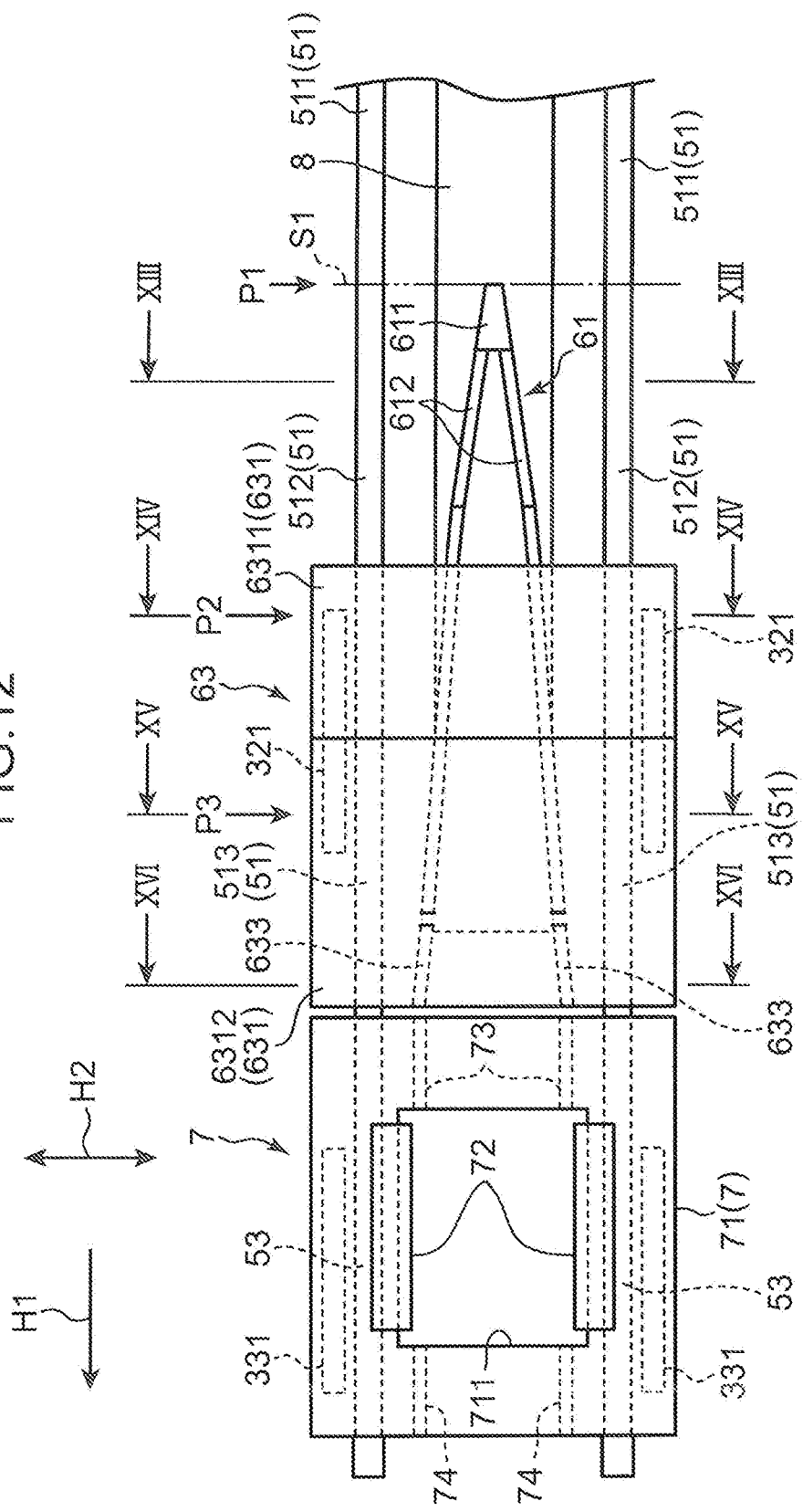
FIG. 12 is a top plan view of the cover tape post-processing portion.
Figure 13:
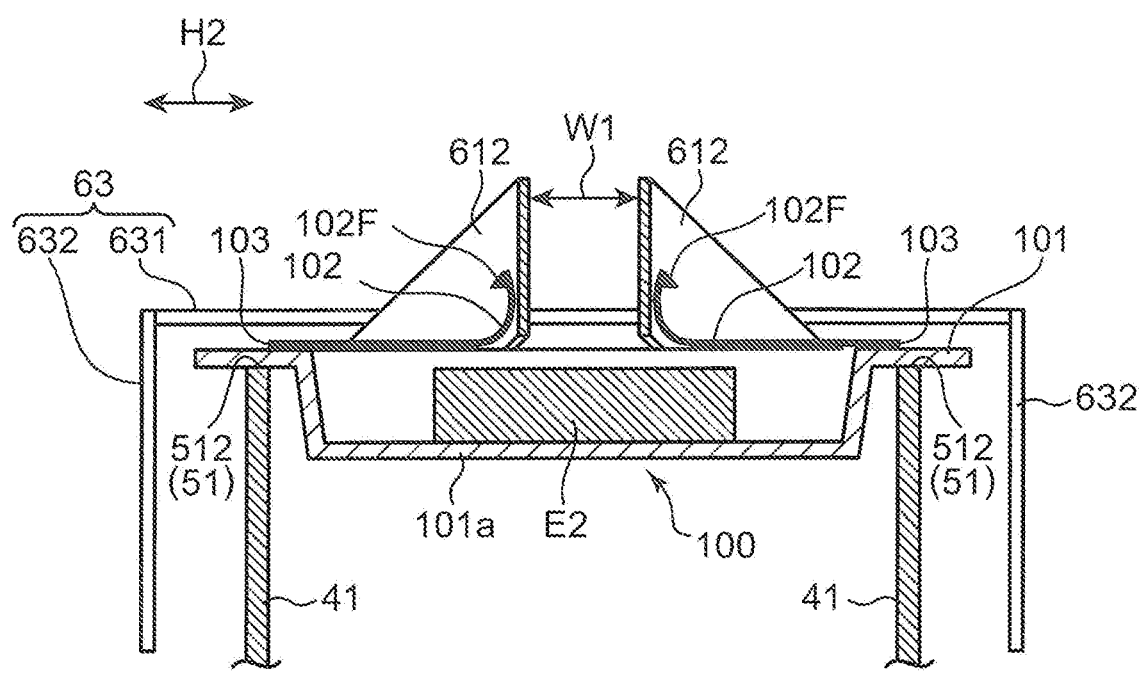
FIG. 13 is a sectional view of the cover tape post-processing portion of FIG. 12, the sectional view being taken along a XIII-XIII section line.
Figure 14:
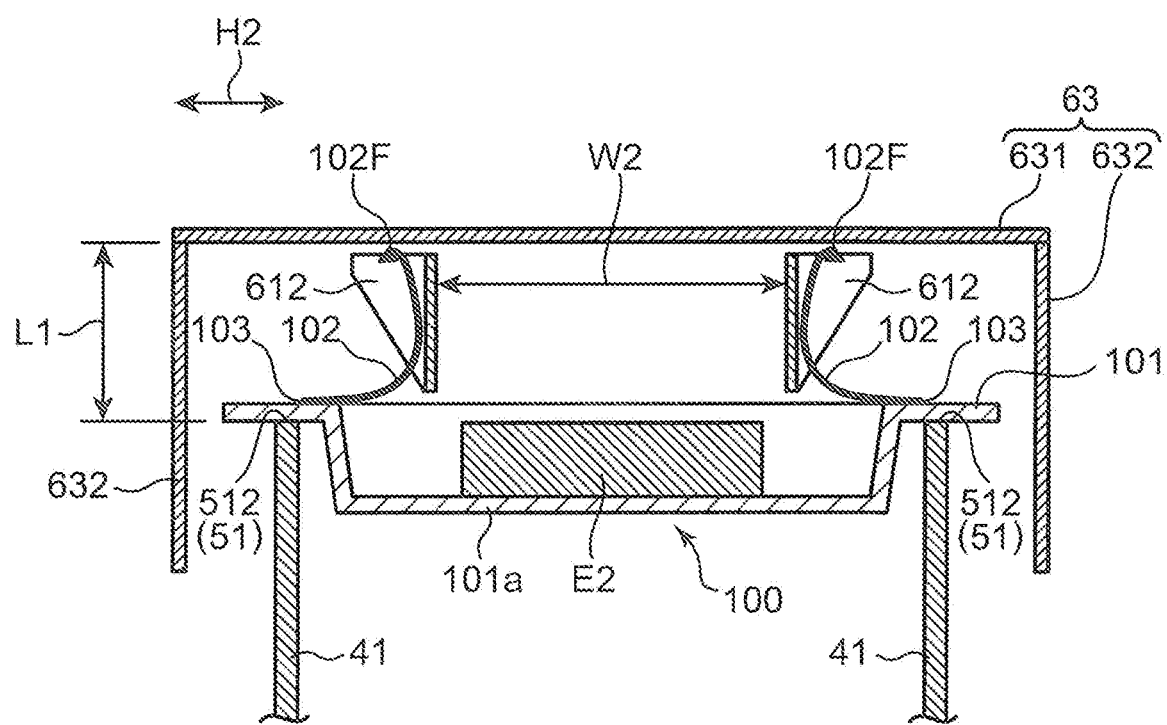
FIG. 14 is a sectional view of the cover tape post-processing portion of FIG. 12, the sectional view being taken along a XIV-XIV section line.
Figure 15:
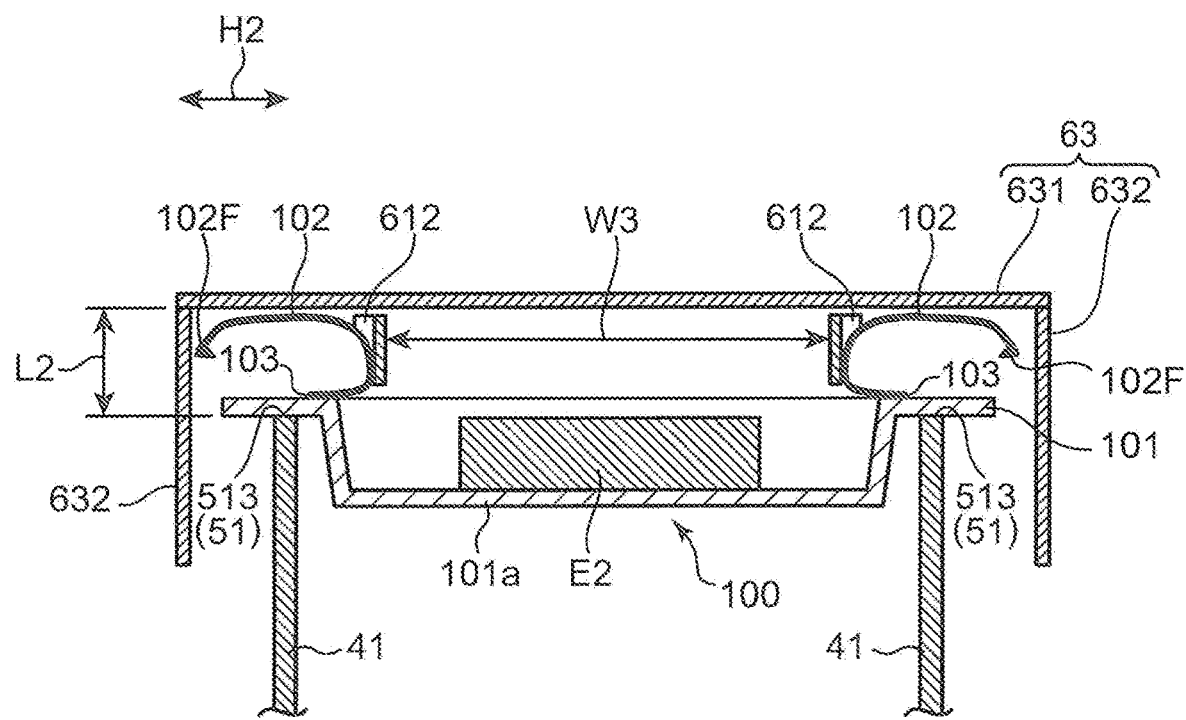
FIG. 15 is a sectional view of the cover tape post-processing portion of FIG. 12, the sectional view being taken along a XV-XV section line.
Figure 16:
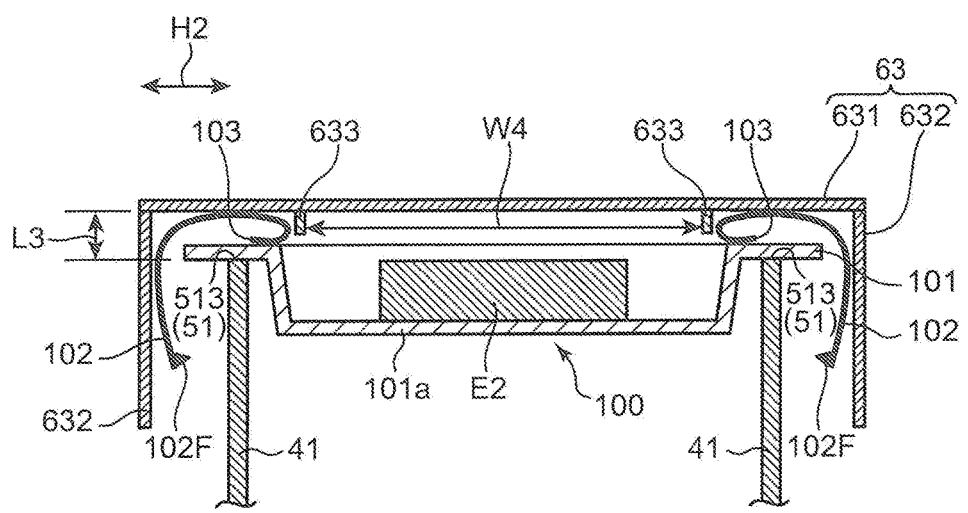
FIG. 16 is a sectional view of the cover tape post-processing portion of FIG. 12, the sectional view being taken along a XVI-XVI section line.

A configuration of the component exposing unit 6 included in the component feeding device 1 will then be described in detail with reference to FIG. 7 and FIGS. 8 to 16. FIG. 8 is a perspective view of a configuration of the cover tape pre-processing portion 62 of the component exposing unit 6. FIG. 9 is a perspective view of a configuration of the cover tape lifting portion 61 of the component exposing unit 6. FIG. 10 is a perspective view of a configuration of the cover tape post-processing portion 63 of the component exposing unit 6. FIG. 11 is a side view of the cover tape post-processing portion 63. FIG. 12 is a top plan view of the cover tape post-processing portion 63. FIG. 13 is a sectional view of the cover tape post-processing portion 63 of FIG. 12, the sectional view being taken along a XIII-XIII section line. FIG. 14 is a sectional view of the cover tape post-processing portion 63 of FIG. 12, the sectional view being taken along a XIV-XIV section line. FIG. 15 is a sectional view of the cover tape post-processing portion 63 of FIG. 12, the sectional view being taken along a XV-XV section line. FIG. 16 is a sectional view of the cover tape post-processing portion 63 of FIG. 12, the sectional view being taken along a XVI-XVI section line. Positions at which the cover tape post-processing portion 63 is cut to take the sectional views of FIGS. 13 to 16 are in the order of heading from the upstream side toward the downstream side in the tape send-off direction H1, that is, FIG. 13, FIG. 14, FIG. 15, and FIG. 16 represent the sectional views taken in order at those positions.

As described above, between the pair of guide walls 41, the cover tape pre-processing portion 62 is disposed on the second traveling path 52 of the tape traveling path 5. Before the cover tape lifting portion 61 carries out the lifting process of lifting the cover tape 102, the cover tape pre-processing portion 62 carries out the pre-processing of cutting the cover tape 102 on the component storage tape 100, which is sent off by the first tape send-off portion 31 of the tape lead-in mechanism 200, which will be described later, and travels on the second traveling path 52 as the tip end of the component storage tape 100 is provided as a free end. As shown in FIG. 8, the cover tape pre-processing portion 62 includes an insertion member 621, a cover tape cutting portion 622, and a support portion 623.

The insertion member 621 is a member that is inserted between the cover tape 102 and the carrier tape 101 of the component storage tape 100, which is sent off by the first tape send-off portion 31 and travels on the second traveling path 52 as the tip end of the component storage tape 100 is provided as a free end. The insertion member 621 is formed into a plate-like shape. The insertion member 621 has a base portion 6211, and an insertion front end 6212 continuous with an upstream end in the tape send-off direction H1 of the base portion 6211. To a downstream end 6211a in the tape send-off direction H1 of the base portion 6211 of the insertion member 621, a lid member 8, which will be described later, is connected.

In the insertion member 621, the insertion front end 6212 slopes upward against the base portion 6211 such that the insertion front end 6212 tilts upward (toward the +Z-side) from its part connected to the base portion 6211 toward a front edge 6212a, which is an upstream end in the tape send-off direction H1. In other words, in a state in which the insertion member 621 is inserted between the cover tape 102 and the carrier tape 101, the base portion 6211 is substantially parallel with the cover tape 102, and the insertion front end 6212 slopes upward in such a way as to separate from the carrier tape 101 across a gap and head to the cover tape 102.

The insertion front end 6212 of the insertion member 621 is made into the above sloped structure. This prevents a case where when the component storage tape 100 with the insertion member 621 being inserted between the cover tape 102 and the carrier tape 101 is sent off by the first tape send-off portion 31, the insertion front end 6212 comes in contact with a storage portion connection area located between adjacent component storage portions 101a of the carrier tape 101. As a result, smooth traveling of the component storage tape 100 is maintained to allow efficient transfer of the component E2 to the component take-out position 21.

The insertion front end 6212 of the insertion member 621 is formed into a tapered shape such that the insertion front end 6212 tapers off toward its front edge 6212a to reduce in width. On the component storage tape 100 in which the insertion member 621 is inserted, triangular fold pieces 102F are formed on a tip end 102T of the cover tape 102, as shown in FIG. 4. These fold pieces 102F facilitate insertion of the insertion member 621 between the cover tape 102 and the carrier tape 101.

The insertion member 621 is supported by the support portion 623. According to this embodiment, the support portion 623 is disposed on an upper surface of the lid member 8 (which will be described later) connected to the downstream end 6211a in the tape send-off direction H1 of the base portion 6211 of the insertion member 621, and is fixed to the device body 2. In this configuration, the support portion 623 supports the insertion member 621 via the lid member 8.

The cover tape cutting portion 622 cuts the cover tape 102 of the component storage tape 100, which is sent off by the first tape send-off portion 31 and travels on the second traveling path 52 as the tip end of the component storage tape 100 is provided as a free end. The cover tape cutting portion 622 cuts the cover tape 102 at a given position (e.g., central position) between both ends in the width direction of the cover tape 102. A cut part 102a (see FIG. 7) of the cover tape 102 cut by the cover tape cutting portion 622 extends linearly along the tape traveling path 5.

The cover tape cutting portion 622 includes a cutter 6221 that cuts the cover tape 102, and a holding portion 6222. The holding portion 6222 has a holding surface 6222a that holds the cutter 6221 in such a way as to expose its cutter edge.

The cover tape cutting portion 622 is supported by the support portion 623 via the lid member 8 such that, in an area 6222b of the holding portion 6222, the area 6222b at least being on the upstream side in the tape send-off direction H1, a surface opposite to the holding surface 6222a is in contact with an upper surface 6211b of the base portion 6211 of the insertion member 621. On the cover tape cutting portion 622, the cutter 6221 held by the holding surface 6222a of the holding portion 6222 faces upward (the +Z-side). According to this configuration, when the component storage tape 100 traveling on the second traveling path 52 passes the cover tape cutting portion 622, the insertion member 621 is interposed between an upstream end 6222c of the cover tape cutting portion 622 and the carrier tape 101. This prevents the upstream end 6222c of the cover tape cutting portion 622 from coming in contact with the component E2 stored in the component storage portion 101a of the carrier tape 101. A case where the component E2 is damaged by the cover tape cutting portion 622 coming in contact therewith, therefore, is prevented.

It is preferable that on the holding portion 6222 of the cover tape cutting portion 622, the holding surface 6222a be a sloped surface sloping downward from the downstream side to the upstream side in the tape send-off direction H1. In this configuration, when the component storage tape 100 travels on the second traveling path 52 and passes the cover tape cutting portion 622, the component storage tape 100 is guided along the holding surface 6222a of the holding portion 6222, the holding surface 6222a being formed as a sloped surface. As a result, traveling resistance that arises when the component storage tape 100 passes the cover tape cutting portion 622 can be reduced.

The insertion member 621 may be supported by the support portion 623 via the lid member 8 such that the insertion member 621 can be rocked around a given axis J1 extending in the X-axis direction (tape width direction H2). To allow the cover tape cutting portion 622 to rock in a motion interlocked with the rocking of the insertion member 621, the area 6222b of the holding portion 6222, the area 6222b at least being on the upstream side in the tape send-off direction H1, is set in contact with the upper surface 6211b of the base portion 6211 of the insertion member 621. Because of this configuration, for example, when the component storage tape 100 with a warp travels on the tape traveling path 5, the insertion member 621 and the cover tape cutting portion 622, which are inserted between the cover tape 102 and the carrier tape 101, are allowed to rock in response to the warp of the component storage tape 100. Thus, the case where the insertion front end 6212 of the insertion member 621 comes in contact with the storage portion connection area of the carrier tape 101 can be prevented in a steady manner.

As shown in FIG. 9, between the pair of guide walls 41, the cover tape lifting portion 61 is disposed on the first traveling path 51 of the tape traveling path 5. On the component storage tape 100 traveling on the first traveling path 51, the cover tape lifting portion 61 comes in contact with the cut part 102a of the cover tape 102 cut by the cover tape cutting portion 622, thereby lifting the cover tape 102 off the carrier tape 101. The cover tape lifting portion 61 includes a lifting start portion 611 and a lifting extent adjusting portion 612.

The lifting start portion 611 makes up an upstream part in the tape send-off direction H1 of the cover tape lifting portion 61. The lifting start portion 611 has a contact starting point P1 at which contact with the cover tape 102 starts, and starts lifting of the cover tape 102 off the carrier tape 101 from the contact starting point P1. The cover tape lifting portion 61 is disposed such that the contact starting point P1 of the lifting start portion 611 is located at the midpoint between the pair of guide walls 41. In other words, the contact starting point P1 of the lifting start portion 611 is on the cut part 102a of the cover tape 102 cut by the cover tape cutting portion 622. On the cover tape lifting portion 61, the lifting start portion 611 is fixed to the lid member 8 described later.

On the tip end 102T of the cover tape 102, the tip end 102T being in contact with the contact starting point P1 of the lifting start portion 611, the triangular fold pieces 102F are formed, as shown in FIG. 4. This helps the lifting start portion 611 smoothly start the lifting of the cover tape 102.

On the cover tape lifting portion 61, the lifting extent adjusting portion 612 is continuous with a downstream end in the tape send-off direction H1 of the lifting start portion 611. The lifting extent adjusting portion 612 continuously increases an extent of lifting of the cover tape 102 off the carrier tape 101 as the component storage tape 100 travels on the first traveling path 51. As shown in FIG. 9, the lifting extent adjusting portion 612 is composed of a pair of lifting adjusting pieces 6121 and 6122. Each of the pair of lifting adjusting pieces 6121 and 6122 is a plate-like member that extends from a connection part, where the lifting adjusting piece is connected to the lifting start portion 611, to approach each of the guide walls 41. Downstream ends in the tape send-off direction H1 of the pair of lifting adjusting pieces 6121 and 6122 are in contact respectively with the joined portions 103 where the cover tape 102 is joined to the carrier tape 101, the joined portions 103 being formed on both ends in the tape width direction H2 of the cover tape 102.

On the lifting extent adjusting portion 612, a separation distance between the pair of lifting adjusting pieces 6121 and 6122 in the tape width direction H2 increases gradually from the upstream side toward the downstream side in the tape send-off direction H1. It is understood by referring to FIGS. 13 to 15 that the separation distance between the pair of lifting adjusting pieces 6121 and 6122 increases from the upstream side toward the downstream side in the tape send-off direction H1 in the order of a separation distance W1 (FIG. 13), a separation distance W2 (FIG. 14), and a separation distance W3 (FIG. 15). The pair of lifting adjusting pieces 6121 and 6122 making up the lifting extent adjusting portion 612 allow the continuous increase of the extent of lifting of the cover tape 102 off the carrier tape 101.

The first traveling path 51 of the tape traveling path 5, the first traveling path 51 bearing the cover tape lifting portion 61 placed thereon, is of a curved shape as described above. Because of this, compared with a case of placing the cover tape lifting portion 61 on a traveling path extending horizontally along the tape send-off direction H1, for example, the traveling distance of the component storage tape 100 that travels along the first traveling path 51 and passes the cover tape lifting portion 61 is increased. Besides, on the first traveling path 51, the lowermost downstream end 513E in the tape send-off direction H1 is located on the lower side relative to the uppermost upstream end 511E. As a result, on the cover tape 102 having been subjected to the lifting process by the cover tape lifting portion 61, the development of a tensile stress acting in a direction of heading from the downstream end in the tape send-off direction H1 to the contact starting point P1 of the lifting start portion 611 is inhibited. Thus, buckling/deformation of the carrier tape 101 caused by the tensile stress of the cover tape 102 is prevented when the cover tape lifting portion 61 carries out the lifting process on the cover tape 102. As a result, smooth traveling of the component storage tape 100 is maintained to allow efficient transfer of the component E2 to the component take-out position 21.

As shown in FIG. 9, each of the pair of lifting adjusting pieces 6121 and 6122 making up the lifting extent adjusting portion 612 has a first adjusting piece 6123 and a second adjusting piece 6124 connected to a downstream end in the tape send-off direction H1 of the first adjusting piece 6123 via a connection member 613. The second adjusting piece 6124 is connected to the first adjusting piece 6123 in such a way as to be capable of rocking on the connection member 613. The pair of the lifting adjusting pieces 6121 and 6122 each having the first adjusting piece 6123 and the second adjusting piece 6124 are thus capable of rocking in response to a change in traveling behavior of the component storage tape 100 on the first traveling path 51. Thus, a drop in the steadiness of the lifting process of lifting the cover tape 102 by the pair of the lifting adjusting pieces 6121 and 6122 is prevented.

As described above, the first traveling path 51, on which the cover tape lifting portion 61 is placed, have the first curved area 511 on the uppermost upstream side in the tape send-off direction H1, the second curved area 512 continuous with the downstream side in the tape send-off direction H1 of the first curved area 511, and the third curved area 513 continuous with the downstream side in the tape send-off direction H1 of the second curved area 512.

In a view in the X-axis direction (tape width direction H2), the curve of the first traveling path 51 in the Z-axis direction (vertical direction) in the first curved area 511 and the same in the second curved area 512 are different from each other. The sign of a curvature, therefore, changes in these curved areas 511 and 512. When the component storage tape 100 travels along such a first traveling path 51, a force of causing the component storage tape 100 to warp in the Z-axis direction (vertical direction) acts on the component storage tape 100 and this force acts in opposite directions respectively in the first curved area 511 and the second curved area 512 when the component storage tape 100 passes these curved areas. For this reason, for example, when the cover tape lifting portion 61 is placed on the first traveling path 51 to lie across the first curved area 511 and the second curved area 512, it raises a possibility that the steadiness of the lifting process of lifting the cover tape 102 by the cover tape lifting portion 61 may drop.

To prevent such a case, the cover tape lifting portion 61 is disposed such that the contact starting point P1 of the lifting start portion 611 is located on a boundary 51 between the first curved areas 511 and the second curved areas 512 or located close to the boundary 51, as shown in FIG. 9. In such a configuration, the cover tape lifting portion 61 has the contact starting point P1 located on the boundary 51 between the first curved areas 511 and the second curved areas 512 or located close to the boundary 51, the contact starting point P1 being the uppermost upstream end of the cover tape lifting portion 61. The cover tape lifting portion 61, therefore, does not lie across the first curved areas 511 and the second curved areas 512 but lies on the second curved areas 512. Thus, a drop in the steadiness of the lifting process of lifting the cover tape 102 by the cover tape lifting portion 61 is prevented. On the cover tape lifting portion 61, the pair of lifting adjusting pieces 6121 and 6122 extend across the second curved area 512 and the third curved area 513 of the first traveling path 51 in the tape send-off direction H1.

When traveling on the first curved area 511 and the second curved area 512 of the first traveling path 51, the component storage tape 100 warps while traveling. The component storage tape 100 travels on the first traveling path 51 in a case where the component storage tape 100 is sent off by the first tape send-off portion 31 of the tape lead-in mechanism 200, the first tape send-off portion 31 being disposed on the upstream side of the first traveling path 51, and in another case where the component storage tape 100 is sent off by the second tape send-off portion 32 disposed on the downstream side of the first traveling path 51. In both cases, the direction of warp of the component storage tape 100 during traveling changes when the component storage tape 100 passes a point of curvature change, i.e., a boundary between the first curved area 511 and the second curved area 512, and, consequently, traveling behavior of the component storage tape 100 on the first traveling path 51 changes. Specifically, the component storage tape 100 sent off by the first tape send-off portion 31 warps upward (toward the +Z-side) on the first curved areas 511 and warps downward (toward the −Z-side) on the second curved areas 512. The component storage tape 100 sent off by the second tape send-off portion 32, on the other hand, warps downward (toward the −Z-side) on the first curved areas 511 and warps upward (toward the +Z-side) on the second curved areas 512.

As described above, according to the cover tape lifting portion 61 of this embodiment, only the lifting start portion 611 is fixed to the lid member 8, which will be described later, and the second adjusting pieces 6124 are connected to the first adjusting pieces 6123 in such a way as to be capable of rocking on the connection members 613, respectively. Because of this configuration, the cover tape lifting portion 61 can rock in response to a change in traveling behavior of the component storage tape 100 on the first traveling path 51. Thus, a drop in the steadiness of the lifting process of lifting the cover tape 102 by the cover tape lifting portion 61 is prevented.

On the first traveling path 51, the third curved area 513 continuous with the downstream side in the tape send-off direction H1 of the second curved area 512, on which the cover tape lifting portion 61 is placed, are formed into an upward curved shape. On the lowermost downstream ends in the tape send-off direction H1 of the third curved areas 513, as described above, the second tape send-off portion 32 having the pair of second sprockets 321 is disposed. The third curved areas 513 are formed into the upward curved shapes so that when the holes 101b of the carrier tape 101 are fitted to the teeth 321a of the pair of second sprockets 321 on the tip end of the component storage tape 100, which is sent off by the first tape send-off portion 31 and travels on the third curved areas 513, fitting the holes 101b to the teeth 321a is facilitated.

The lid member 8 included in the component feeding device 1 will then be described. The lid member 8 is a member that covers at least a part of each of openings of the component storage portions 101a of the component storage tape 100 having been subjected to the exposing process by the component exposing unit 6, the exposing process being carried out to expose the component E2 in the component storage portion 101a. In a configuration in which the component feeding device 1 includes the lid member 8, the lid member 8 prevents the component E2 from leaping out of the component storage portion 101a when the component storage tape 100 having been subjected to the exposing process is sent off by the tape send-off unit 3. The component feeding device 1, therefore, is allowed to steadily perform transfer of the component to the component take-out position 21.

According to this embodiment, the lid member 8 extends from the downstream end 6211a in the tape send-off direction H1 of the base portion 6211 of the insertion member 621 to the component take-out position 21 along the tape traveling path 5. The lid member 8, which is connected to the downstream end 6211a of the base portion 6211 of the insertion member 621, is inserted between the cover tape 102 and the carrier tape 101 of the component storage tape 100 sent off by the tape send-off unit 3. In this state, the lid member 8 covers the component storage portion 101a along the tape traveling path 5. The lid member 8 thus has a function of guiding the component storage tape 100 in its traveling, the component storage tape 100 being sent off by the tape send-off unit 3, while being inserted between the cover tape 102 and the carrier tape 101.

As mentioned above, when the component storage tape 100 travels on the first curved area 511 and the second curved area 512 of the first traveling path 51, the component storage tape 100 warps while traveling. This raises a possibility that, on the component storage tape 100 traveling on the first curved area 511 and the second curved area 512 of the first traveling path 51, a frictional force created by contact between the lid member 8, which covers the component storage portion 101a, and the carrier tape 101 may increase.

It is therefore preferable that the lid member 8 be a member having flexibility. In a configuration in which the lid member 8 is a flexible member, when the component storage tape 100 warps while traveling on the first curved area 511 and the second curved area 512 of the first traveling path 51, the lid member 8 warps in response to the warp of the component storage tape 100. As a result, on the component storage tape 100 traveling on the first curved area 511 and the second curved area 512 of the first traveling path 51, an increase in the frictional force created by contact between the lid member 8, which covers the component storage portion 101a, and the carrier tape 101 can be suppressed. Traveling resistance that arises when the component storage tape 100 travels on the tape traveling path 5, therefore, can be reduced. It is also preferable that the lid member 8 be made of a metal so that no static electricity is generated by the lid member 8. The lid member 8 may be of a structure in which a conductive layer is formed on the surface of a base material made of plastic or the like.

On the component exposing unit 6, the cover tape post-processing portion 63 is disposed on the upper side (+Z-side) relative to the cover tape lifting portion 61. The cover tape post-processing portion 63 pushes lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101a open to the outside. As shown in FIGS. 10 to 16, the cover tape post-processing portion 63 includes an upper regulating portion 631 and side regulating portions 632.

On the cover tape post-processing portion 63, the upper regulating portion 631 is set above and facing to the first traveling path 51 of the tape traveling path 5 across a gap. The upper regulating portion 631 carries out first post-processing of regulating the upward movement of lifted parts of the cover tape 102 lifted by the cover tape lifting portion 61 while pushing the lifted parts of the cover tape 102 to outside of respective side edges in the tape width direction H2 of the component storage tape 100 to make the component storage portion 101a open to the outside. The gap between the upper regulating portion 631 and the first traveling path 51 of the tape traveling path 5 is determined such that the gap becomes narrower as it extends from the upstream side to the downstream side in the tape send-off direction H1. It is understood by referring to FIGS. 14 to 16 that the gap between the upper regulating portion 631 and the first traveling path 51 becomes narrower to take three forms of gaps L1 (FIG. 14), L2 (FIG. 15), and L3 (FIG. 16) in the size decreasing order as the gap extends from the upstream side to the downstream side in the tape send-off direction H1. In this configuration, the upper regulating portion 631 can push the lifted parts of the cover tape 102 to the outside such that an extent of outward movement of the lifted parts toward respective side edges in the tape width direction H2 of the cover tape 102 increases in response to a continuous increase in an extent of lifting by the lifting extent adjusting portion 612. As a result, the component storage portion 101a can be opened to the outside effectively, which facilitates taking out the component E2 at the component take-out position 21.

The upper regulating portion 631 has an upper regulation starting point P2 (see FIGS. 11 and 12), which serves as a point of starting regulation of the upward movement of the cover tape 102 lifted by the cover tape lifting portion 61. On the tip end 102T of the cover tape 102, the tip end 102T coming in contact with the upper regulation starting point P2 of the upper regulating portion 631, the triangular fold pieces 102F (see FIG. 4) are formed, as shown in FIG. 14. This allows the upper regulating portion 631 to smoothly push outward the lifted parts of the cover tape 102 lifted by the cover tape lifting portion 61.

According to this embodiment, as shown in FIGS. 10 and 11, the upper regulating portion 631 has a first upper regulating area 6311 and a second upper regulating area 6312. The first upper regulating area 6311 is counter to the second curved area 512 of the first traveling path 51 and extends from the upstream side to the downstream side in the tape send-off direction H1, as a downward slope. The second upper regulating area 6312 is continuous with the downstream side in the tape send-off direction H1 of the first upper regulating area 6311. The second upper regulating area 6312 is counter to the third curved area 513 of the first traveling path 51 and extends horizontally along the tape send-off direction H1. In this configuration, a gap between the first upper regulating area 6311 of the upper regulating portion 631 and the second curved area 512 of the first traveling path 51 becomes narrower in correspondence to the downward slope of the first upper regulating area 6311. A gap between the second upper regulating area 6312 of the upper regulating portion 631 and the third curved area 513 of the first traveling path 51, on the other hand, becomes narrower in correspondence to the upward curved shapes of the third curved area 513. In other words, the gap between the upper regulating portion 631 and the first traveling path 51 can be determined such that the gap becomes narrower as it extends from the upstream side to the downstream side in the tape send-off direction H1.

On a lower surface (surface counter to the first traveling path 51) of the second upper regulating area 6312 of the upper regulating portion 631, a pair of lifting extent adjusting auxiliary pieces 633 are formed as projections on a downstream end in the tape send-off direction H1, as shown in FIGS. 11, 12, and 16. The pair of lifting extent adjusting auxiliary pieces 633 are plate-like projections that project from downstream ends of the pair of lifting adjusting pieces 6121 and 6122 to approach the pair of guide walls 41, respectively, while extending from the upstream side to the downstream side in the tape send-off direction H1. A separation distance between the pair of lifting extent adjusting auxiliary pieces 633 along the tape width direction H2 increases gradually as the lifting extent adjusting auxiliary pieces 633 extend from the upstream side to the downstream side in the tape send-off direction H1. A separation distance W4 between the pair of lifting extent adjusting auxiliary pieces 633 (FIG. 16) is larger than a separation distance W3 between the pair of lifting adjusting pieces 6121 and 6122 on their downstream side (FIG. 15). On the downstream side of the pair of lifting adjusting pieces 6121 and 6122, the pair of lifting extent adjusting auxiliary pieces 633 continuously increase the extent of lifting of the cover tape 102.

On the cover tape post-processing portion 63, the side regulating portions 632 are extended downward from both ends in the width direction of the upper regulating portion 631, respectively, such that the side regulating portions 632 face the side end faces of the component storage tape 100, respectively, from the outside of the pair of guide walls 41 in the tape width direction H2. The side regulating portions 632 carry out second post-processing of regulating the sidewise movement of the lifted parts of the cover tape 102, the lifted parts being pushed to outside of respective side edges in the tape width direction H2 of the component storage tape 100 by the upper regulating portion 632, while folding the lifted parts downward.

When the lifted parts of the cover tape 102 pushed outward by the upper regulating portion 631 are folded downward by the side regulating portions 632, the carrier tape 101 may possibly buckle or deform. To prevent such a case, the cover tape post-processing portion 63 is configured such that a side regulating starting point P3 (see FIGS. 11 and 12), which serves as a point of starting the downward folding of the lifted parts of the cover tape 102 by the side regulating portions 632, is located in the second upper regulating area 6312 of the upper regulating portion 631, the second upper regulating area 6312 extending horizontally in the tape send-off direction H1. This inhibits the buckling or deformation of the carrier tape 101 when the lifted parts of the cover tape 102 are folded downward from the side regulating starting point P3.

On the tip end 102T of the cover tape 102, the tip end 102T coming in contact with the side regulating starting point P3 of the side regulating portions 632, the triangular fold pieces 102F are formed, as shown in FIG. 15 (see FIG. 4). This allows the side regulating portions 632 to smoothly fold the lifted parts of the cover tape 102 downward, the lifted parts being pushed to outside of respective side edges in the tape width direction H2 of the component storage tape 100 by the upper regulating portion 631.

Figure 17:
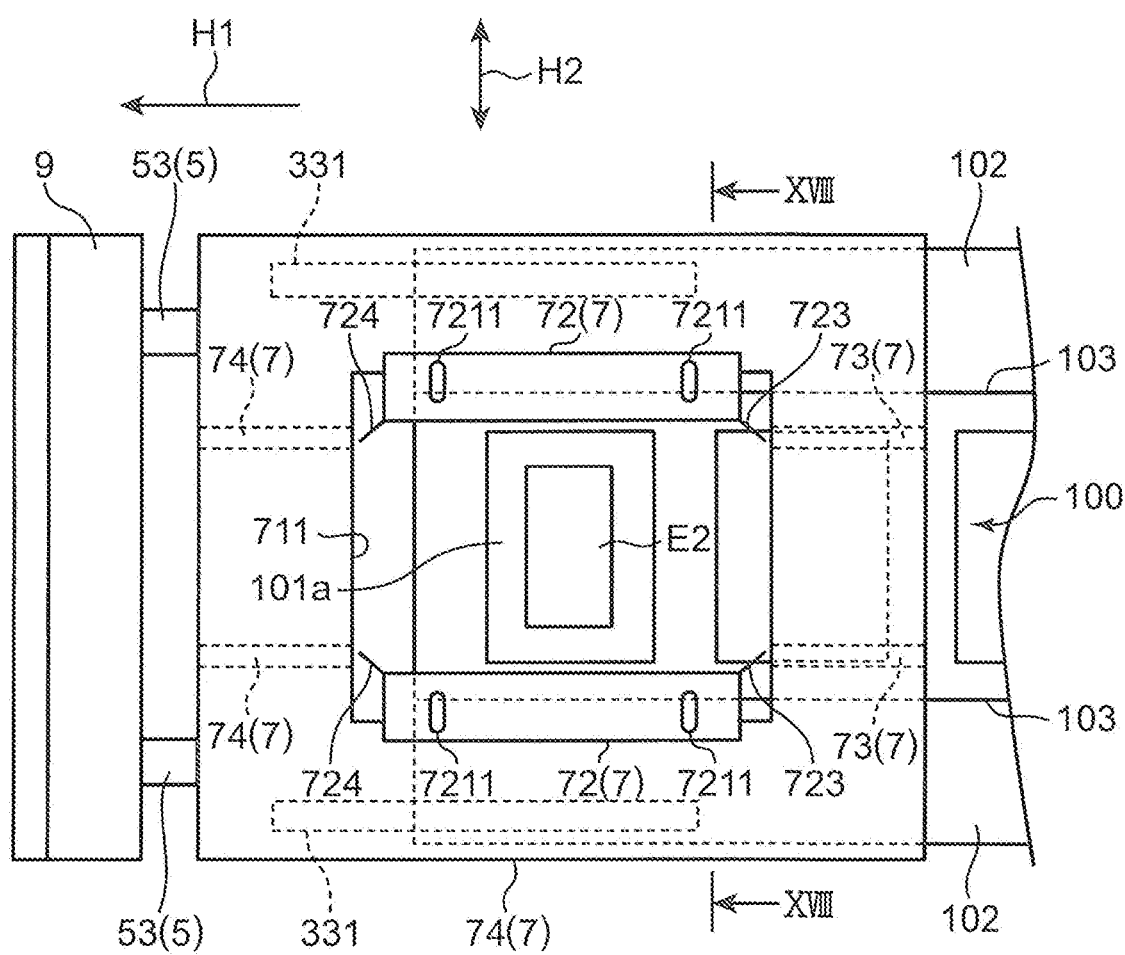
FIG. 17 is a top plan view of a tape traveling guide unit included in the component feeding device.
Figure 18:
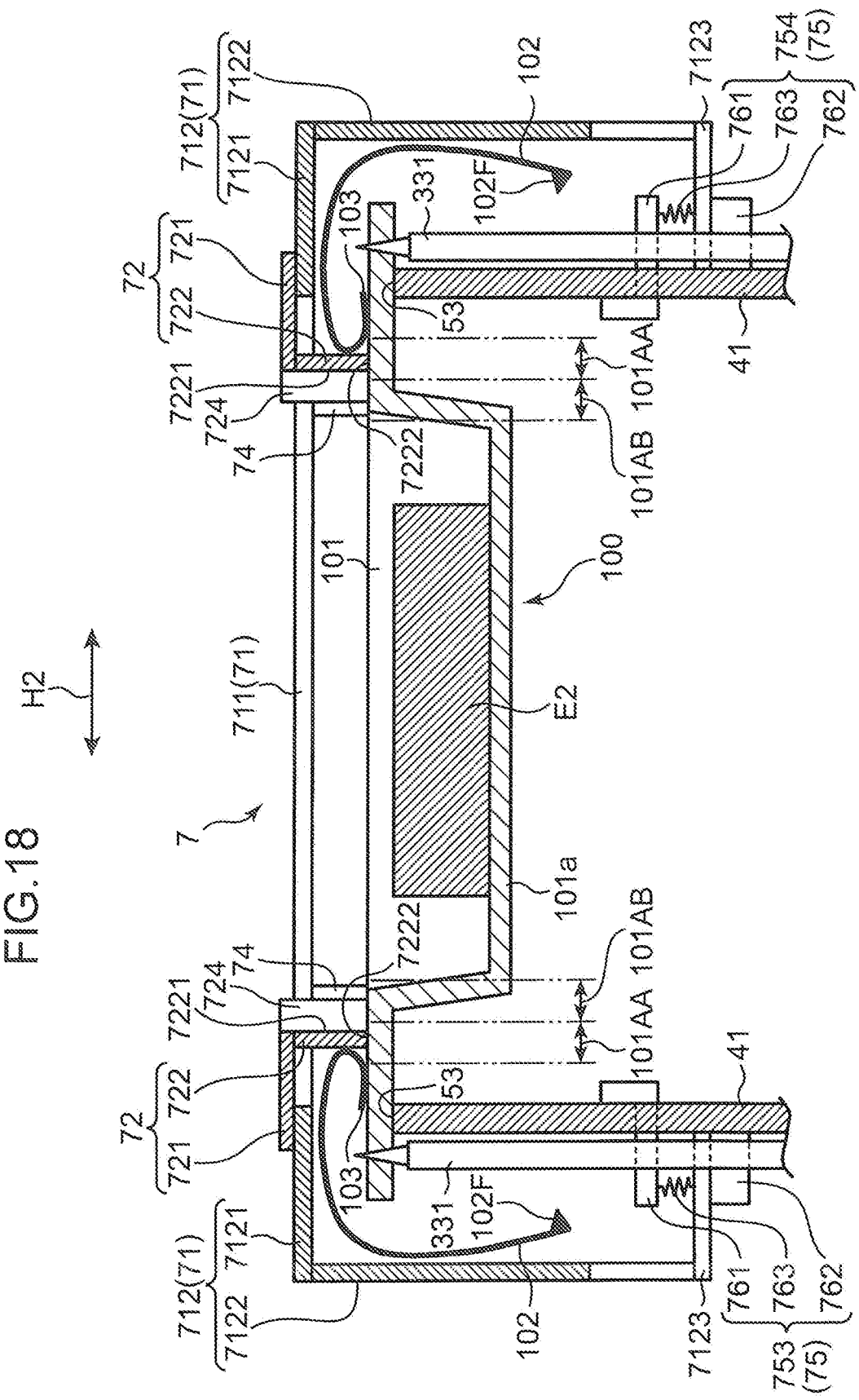
FIG. 18 is a sectional view of the tape traveling guide unit of FIG. 17, the sectional view being taken along a XVIII-XVIII section line.
Figure 19:
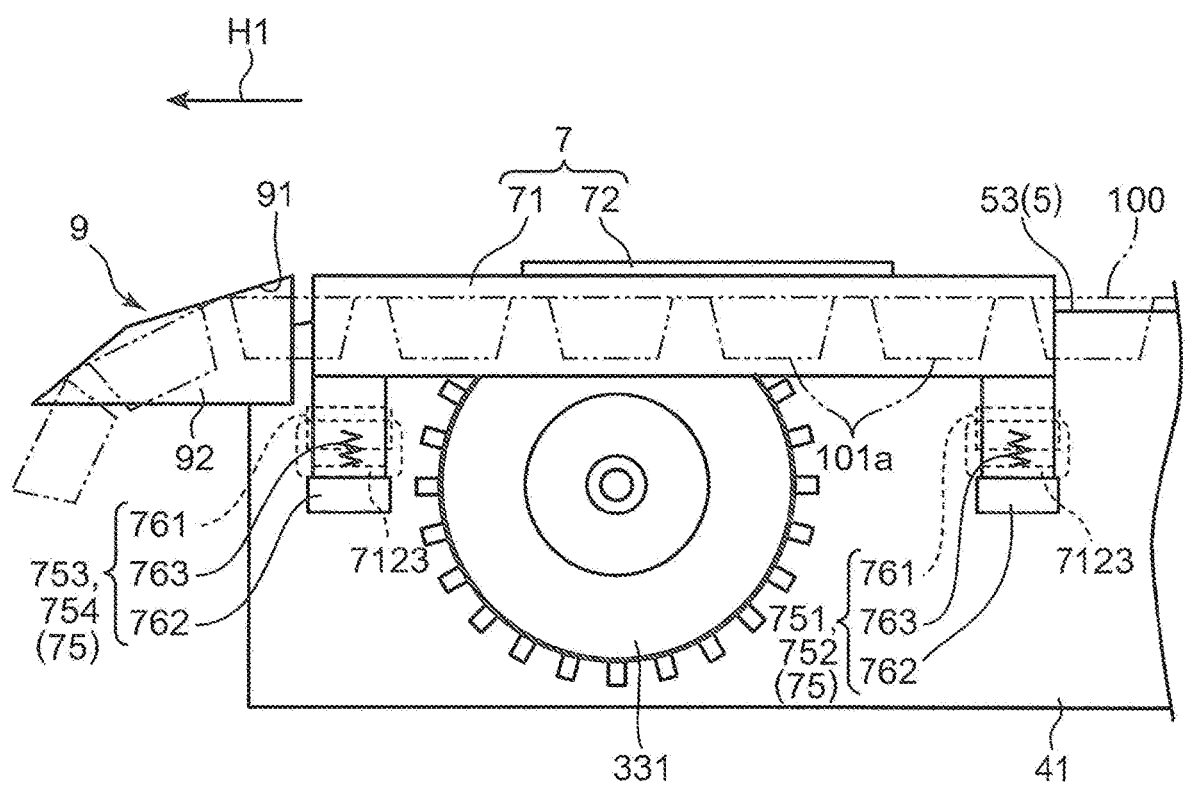
FIG. 19 is a side view of the tape traveling guide unit.

The tape traveling guide unit 7 included in the component feeding device 1 will then be described with reference to FIGS. 17 to 19. FIG. 17 is a top plan view of the tape traveling guide unit 7. FIG. 18 is a sectional view of the tape traveling guide unit 7 of FIG. 17, the sectional view being taken along a XVIII-XVIII section line. FIG. 19 is a side view of the tape traveling guide unit 7.

At the downstream side in the tape send-off direction H1 of the component exposing unit 6, the tape traveling guide unit 7 is disposed on the horizontal area 531 of the third traveling path 53 of the tape traveling path 5. In other words, the tape traveling guide unit 7 is located close to the component take-out position 21. The tape traveling guide unit 7 guides the component storage tape 100 having been subjected to the component exposing process by the component exposing unit 6 to help the component storage tape 100 in traveling on the third traveling path 53 toward the component take-out position 21. The tape traveling guide unit 7 includes a guide body 71 and opening width defining members 72.

On the tape traveling guide unit 7, the guide body 71 makes up the body of the tape traveling guide unit 7, and has an opening 711 and a cover tape path demarcating portion 712. On the component storage tape 100 traveling on the third traveling path 53, the opening 711 faces the component storage portion 101a made open to the outside by the component exposing process by the component exposing unit 6. The opening 711 is formed into a rectangular shape having a given length in the tape send-off direction H1. The opening 711 is located underneath the component take-out position 21. In other words, the head unit 14 of the component mounter 10 takes out the component E2, which is transferred to the component take-out position 21 by the component feeding device 1, through the opening 711.

The cover tape path demarcating portion 712 of the guide body 71 is disposed outside the opening 711 in the tape width direction H2. As shown in FIG. 18, on the component storage tape 100 that travels on the third traveling path 53 after being subjected to the component exposing process by the component exposing unit 6, the cover tape path demarcating portion 712 defines cover tape paths through which the lifted parts of the cover tape 102 travel, the lifted parts being pushed outward in the tape width direction H2 along the joined portions 103, serving as starting points, where the cover tape 102 is joined to the carrier tape 101, and folded downward. The cover tape path demarcating portion 712 has upper counter portions 7121, which are counter to the cover tape 102 from a location above the part of upper end faces of pair of guide walls 41 that form the third traveling path 53, and side counter portions 7122, which are counter to the cover tape 102 from a location outside the pair of guide walls 41 in the tape width direction H2. The upper counter portions 7121 are plate-like structures extending outward horizontally from both opening edges in the tape width direction H2 of the opening 711. The side counter portions 7122 are plate-like structures extending downward from outside edges of the upper counter portions 7121.

On the tape traveling guide unit 7, the opening width defining members 72 are fitted respectively to both opening edges in the tape width direction H2 of the opening 711 of the guide body 71, and define the opening width in the tape width direction H2 of the opening 711. As shown in FIG. 18, on the component storage tape 100 that travels on the third traveling path 53, each opening width defining member 72 comes in contact with a first specific area 101AA of the upper surface of the carrier tape 101, the first specific area 101AA being between the component storage portion 101a and the joined portion 103 in the tape width direction H2. Each opening width defining member 72 thus applies a downward pressure to the first specific area 101AA of the upper surface of the carrier tape 101.

Specifically, each opening width defining member 72 has a base 721 and an extended piece 722 extended downward from the base 721. The base 721 is formed into a rectangular plate-like shape extending along the opening edge in the tape width direction H2 of the opening 711, and is fitted to the upper counter portion 7121. In a top plan view, an inner edge in the tape width direction H2 of the base 721 is located within the opening 711. The extended piece 722 is formed into a rectangular plate-like shape, whose one long side is connected to the inner edge in the tape width direction H2 of the base 721. The extended piece 722 is extended downward from the inner edge of the base 721 and is inserted in the opening 711. In a state in which the extended piece 722 is inserted in the opening 711, a surface (surface located inside in the tape width direction H2) of the extended piece 722 serves as a defining surface 7221 (see FIG. 18) that defines the opening width in the tape width direction H2 of the opening 711. In the state in which the extended piece 722 is inserted in the opening 711, a lower surface of the extended piece 722 serves as a pressure-applying surface 7222 (see FIG. 18) that applies a pressure to the first specific area 101AA of the upper surface of the carrier tape 101. The extended piece 722 has also a function of regulating the inward displacement of the cover tape 102 in the tape width direction H2.

On the component storage tape 100 that travels on the third traveling path 53 after being subjected to the component exposing process by the component exposing unit 6, as described above, the lifted parts of the cover tape 102 are pushed outward in the tape width direction H2 relative to the carrier tape 101 and are folded downward. Because the cover tape 102 is in this state, when the component storage tape 100 traveling on the third traveling path 53 passes the tape traveling guide unit 7, a force that causes the cover tape 102 to rise acts on the tape traveling guide unit 7. When the cover tape path demarcating portion 712 of the guide body 71 applies an excessive force to the cover tape 102 to prevent it from rising, it may impair the steadiness of traveling of the component storage tape 100 on the third traveling path 53 and may also create a resistive force against traveling, which raises a possibility that the traveling performance of the component storage tape 100 may deteriorate.

To avoid such a case, on the tape traveling guide unit 7, each opening width defining member 72, which defines the opening width of the opening 711 serving as the opening for taking out the component E2, applies a downward pressure to the first specific area 101AA of the upper surface of the carrier tape 101. This ensures that the component storage tape 100 travels steadily on the third traveling path 53. Meanwhile, on the tape traveling guide unit 7, the cover tape path demarcating portion 712 of the guide body 71 does not put constraint on the cover tape 102 but rather allows the cover tape 102 to rise to some extent, thereby demarcating a path that embraces the cover tape 102. This reduces the traveling resistance that arises when the component storage tape 100 travels on the third traveling path 53, thus improving the traveling performance of the component storage tape 100.

On the component storage tape 100, the length of the component storage portion 101a in the tape width direction H2 is determined in accordance with the size of the component E2 stored in the component storage portion 101a. In other words, on the component storage tape 100, the length of the component storage portion 101a in the tape width direction H2 varies depending on the size of the component E2 even when the tape width K2 remains the same. For this reason, it is necessary for each opening width defining member 72 to define the opening width of the opening 711 in accordance with the length of the component storage portion 101a in the tape width direction H2. To meet this requirement, as shown in FIG. 17, the base 721 of each opening width defining member 72 is fitted to the upper counter portion 7121 via fitting portions 7211 of elongated holes extending in the tape width direction H2. These fitting portions 7211 allow changing the position of the defining surface 7221 of the extended piece 722, which is extended downward from the base 721, in the tape width direction H2. Thus, the opening width defining member 72 can define the opening width of the opening 711 in accordance with the length of the component storage portion 101a in the tape width direction H2, using the defining surface 7221 of the extended piece 722.

As shown in FIGS. 17 and 18, the tape traveling guide unit 7 further includes a pair of tape guide-in portions 73 and a pair of tape guide-out portions 74. Each of the pair of tape guide-in portions 73 is a bar-like member extending along the tape send-off direction H1. The pair of tape guide-in portions 73 are fitted to a part of guide body 71 that is on the upstream side in the tape send-off direction H1 of the opening 711 such that the tape guide-in portions 73 are separated in the tape width direction H2 across a gap. Each of the pair of tape guide-in portions 73 comes in contact with a second specific area 101AB located inward in the tape width direction H2 relative to the first specific area 101AA with which the pressure-applying surface 7222 of the extended piece 722 comes in contact, the second specific area 101AB being an area of the upper surface of the carrier tape 101. In this configuration, each of the pair of tape guide-in portions 73 guides the lifted part of the cover tape 102 into the cover tape path defined by the cover tape path demarcating portion 712 while regulating the inward displacement of the cover tape 102 in the tape width direction H2.

Each of the pair of tape guide-out portions 74 is a bar-like member extending along the tape send-off direction H1. The pair of tape guide-out portions 74 are fitted to a part of guide body 71 that is on the downstream side in the tape send-off direction H1 of the opening 711 such that the tape guide-out portions 74 are separated in the tape width direction H2 across a gap. Each of the pair of tape guide-out portions 74 comes in contact with the second specific area 101AB of the upper surface of the carrier tape 101. In this configuration, each of the pair of tape guide-out portions 74 guides the lifted part of the cover tape 102 out of the cover tape path defined by the cover tape path demarcating portion 712 while regulating the inward displacement of the cover tape 102 in the tape width direction H2.

As shown in FIGS. 17 and 18, each opening width defining member 72 further has a first projection 723 projecting from an upstream end in the tape send-off direction H1 of the extended piece 722, and a second projection 724 projecting from a downstream end in the tape send-off direction H1 of the extended piece 722. The first projection 723 extends slantly toward a downstream end in the tape send-off direction H1 of the tape guide-in portion 73. The second projection 724 extends slantly toward an upstream end in the tape send-off direction H1 of the tape guide-out portion 74.

On the component storage tape 100 having traveled on the third traveling path 53 and passed the pair of tape guide-in portions 73, the lifted parts of the cover tape 102 come in contact with respective first projections 723 of the opening width defining members 72 and are guided into the cover tape paths defined by the cover tape path demarcating portion 712. In this manner, the lifted parts of the cover tape 102 of the component storage tape 100 having passed the pair of tape guide-in portions 73 are guided smoothly into the cover tape path demarcating portion 712.

Then, on the component storage tape 100 traveling on the third traveling path 53, the lifted parts of the cover tape 102 having passed through the cover tape path demarcating portion 712 come in contact with respective second projections 724 of the opening width defining members 72 and are guided to the tape guide-out portions 74. In this manner, the lifted parts of the cover tape 102 having passed through the cover tape path demarcating portion 712 can smoothly be guided out of the cover tape path demarcating portion 712.

As FIGS. 18 and 19, the tape traveling guide unit 7 further includes a connecting mechanism 75 that connects the guide body 71 to the pair of guide walls 41 such that the guide body 71 can shift in position in the vertical direction (Z-axis direction). The connecting mechanism 75 has a first connecting portion 751 and a second connecting portion 752, and a third connecting portion 753 and a fourth connecting portion 754. The first connecting portion 751 and the second connecting portion 752 connect both ends in the tape width direction H2 of the guide body 71, the ends being on the upstream end side in the tape send-off direction H1, to the pair of guide walls 41, respectively. The third connecting portion 753 and the fourth connecting portion 754 connect both ends in the tape width direction H2 of the guide body 71, the ends being on the downstream end side in the tape send-off direction H1, to the pair of guide walls 41, respectively.

Each of the first connecting portion 751, the second connecting portion 752, the third connecting portion 753, and the fourth connecting portion 754 has an upper limit stopper 761, a lower limit stopper 762, and a biasing member 763. The upper limit stopper 761 is fitted to each of the pair of guide walls 41 and determines an upper limit position of the guide body 71 that shifts in position vertically (in the Z-axis direction). The lower limit stopper 762 is fitted to each of the pair of guide walls 41 in such a way as to be under the upper limit stopper 761 and determines a lower limit position of the guide body 71 that shifts in position vertically (in the Z-axis direction). The fitting position of the lower limit stopper 762 on each of the pair of guide walls 41 in the vertical direction (Z-axis direction) is determined so that the component storage tape 100 is allowed to travel on the third traveling path 53 as the upper surface of the carrier tape 101 is kept in contact with the extended pieces 722, the first projections 723, the second projections 724, the tape guide-in portions 73, and the tape guide-out portions 74. In other words, in a state in which the guide body 71 is stopped at its lower limit position by the lower limit stopper 762, a gap slightly larger than the thickness of the carrier tape 101 is formed between the extended pieces 722, the first projections 723, the second projections 724, the tape guide-in portions 73, and the tape guide-out portions 74 and the third traveling path 53.

The biasing member 763 is disposed between the upper limit stopper 761 and the lower limit stopper 762 and applies a downward pressure to the guide body 71 to allow it to shift in position vertically (in the Z-axis direction). The biasing member 763 is provided as, for example, a compression coil spring. The biasing member 763 has one end fixed to the upper limit stopper 761 and the other end fixed to a pressurized portion 7123 of the guide body 71. The pressurized portion 7123 is a projection projecting inward from a lower edge of the side counter portion 7122 of the cover tape path demarcating portion 712 of the guide body 71. The pressurized portion 7123 is disposed between the upper limit stopper 761 and the lower limit stopper 762 and receives a pressure applied by the biasing member 763.

On the tape traveling guide unit 7, the guide body 71 is connected to the pair of guide walls 41 via the connecting mechanism 75 such that the guide body 71 can shift in position in the vertical direction. In this configuration, it is ensured that the component storage tape 100 travels steadily on the third traveling path 53 as the upper surface of the carrier tape 101 is kept in contact with the extended pieces 722, the first projections 723, the second projections 724, the tape guide-in portions 73, and the tape guide-out portions 74.

When the component E2 transferred to the component take-out position 21 is taken out by the head unit 14 through the opening 711 of the guide body 71, the component storage tape 100 is ejected out of the component feeding device 1. The component storage tape 100 having passed through the tape traveling guide unit 7 droops down when ejected out of the component feeding device 1. At this time, the component storage tape 100 is folded at the storage portion connection area between adjacent component storage portions 101a of the carrier tape 101 and droops down as a consequence. In this manner, the component storage tape 100 folded at the area between adjacent component storage portions 101a shows a tendency to bulge upward.

It is difficult to suppress an upward bulging motion of the component storage tape 100 by the downward pressure that the opening width defining members 72 of the tape traveling guide unit 7 applies to the carrier tape 101. Given this fact, it is possible that the upward bulging of the component storage tape 100 ejected out of the component feeding device 1 may lift the guide body 71 up. It is conceivable that to regulate such an upward positional shift of the guide body 71 caused by the upward bulging of the component storage tape 100, the downward pressure that the pressure-applying members 763 of the connecting mechanism 75 apply to the guide body 71 may be increased. In this case, however, the increased downward pressure creates traveling resistance that hampers traveling of the component storage tape 100 on the third traveling path 53.

To avoid such a case, according to this embodiment, the component storage tape 100 is ejected out of the component feeding device 1 through the tape ejection guide unit 9. As shown in FIG. 19, on the downstream side in the tape send-off direction H1 of the tape traveling guide unit 7, the tape ejection guide unit 9 is fitted to downstream ends in the tape send-off direction H1 of the pair of guide walls 41. The tape ejection guide unit 9 guides the component storage tape 100 having passed the tape traveling guide unit 7 to eject the component storage tape 100 on the downstream side. The tape ejection guide unit 9 includes an upper surface regulating portion 91 and side surface regulating portions 92.

On the tape ejection guide unit 9, the upper surface regulating portion 91 comes in contact with the upper surface of the component storage tape 100 having passed the tape traveling guide unit 7, thereby regulating an upward motion of the component storage tape 100. On the tape ejection guide unit 9, the side surface regulating portions 92 come in contact with side end faces of the component storage tape 100 having passed the tape traveling guide unit 7, thereby regulating a lateral motion of the component storage tape 100. In this manner, the upward bulging of the component storage tape 100 ejected out of the component feeding device 1 is suppressed.

Tape Lead-in Mechanism

Figure 21:
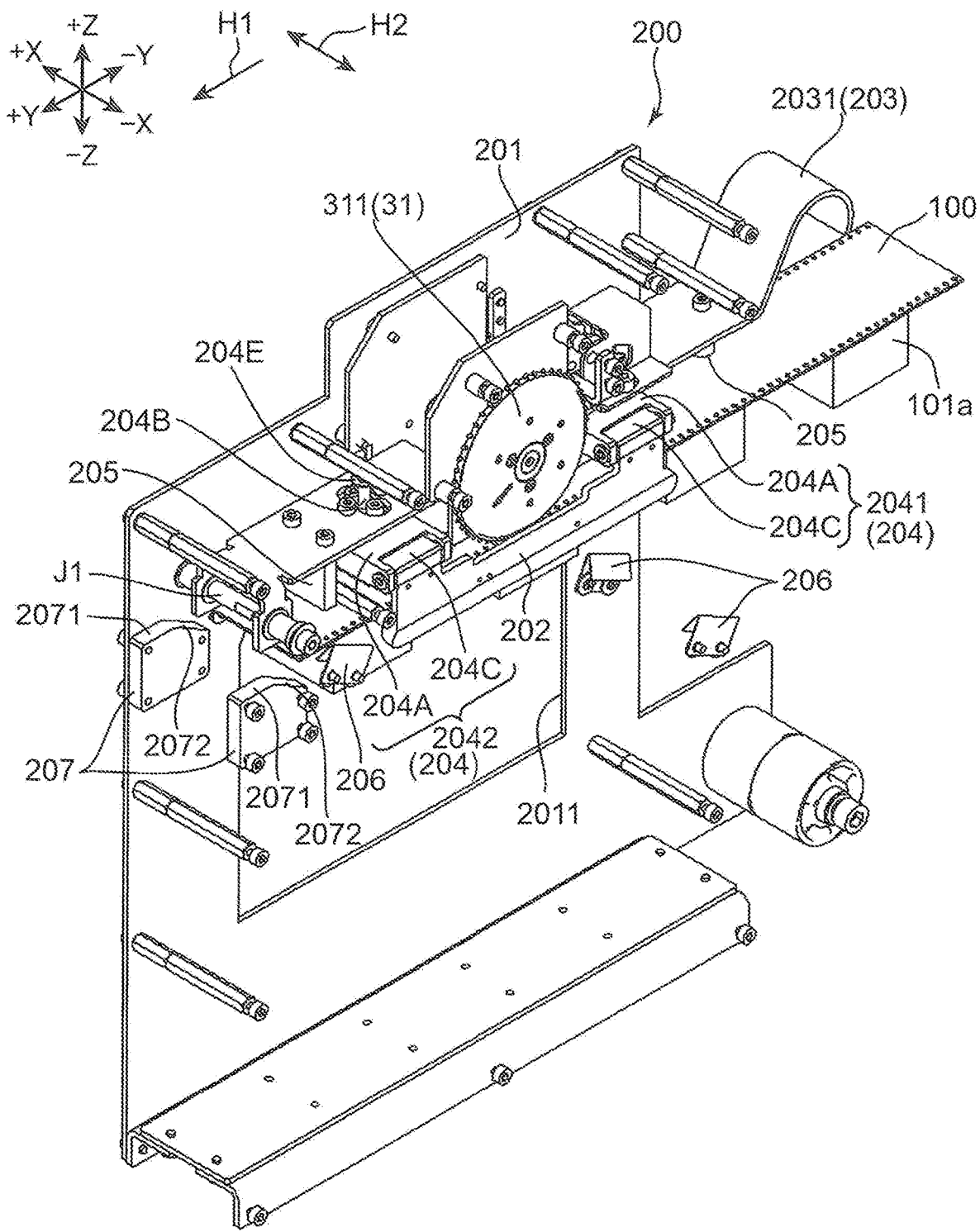
FIG. 21 is a perspective view of the tape lead-in mechanism from which one frame is removed, showing a state in which a pair of tape holding portions are set at a send-off enabling position.
Figure 22:
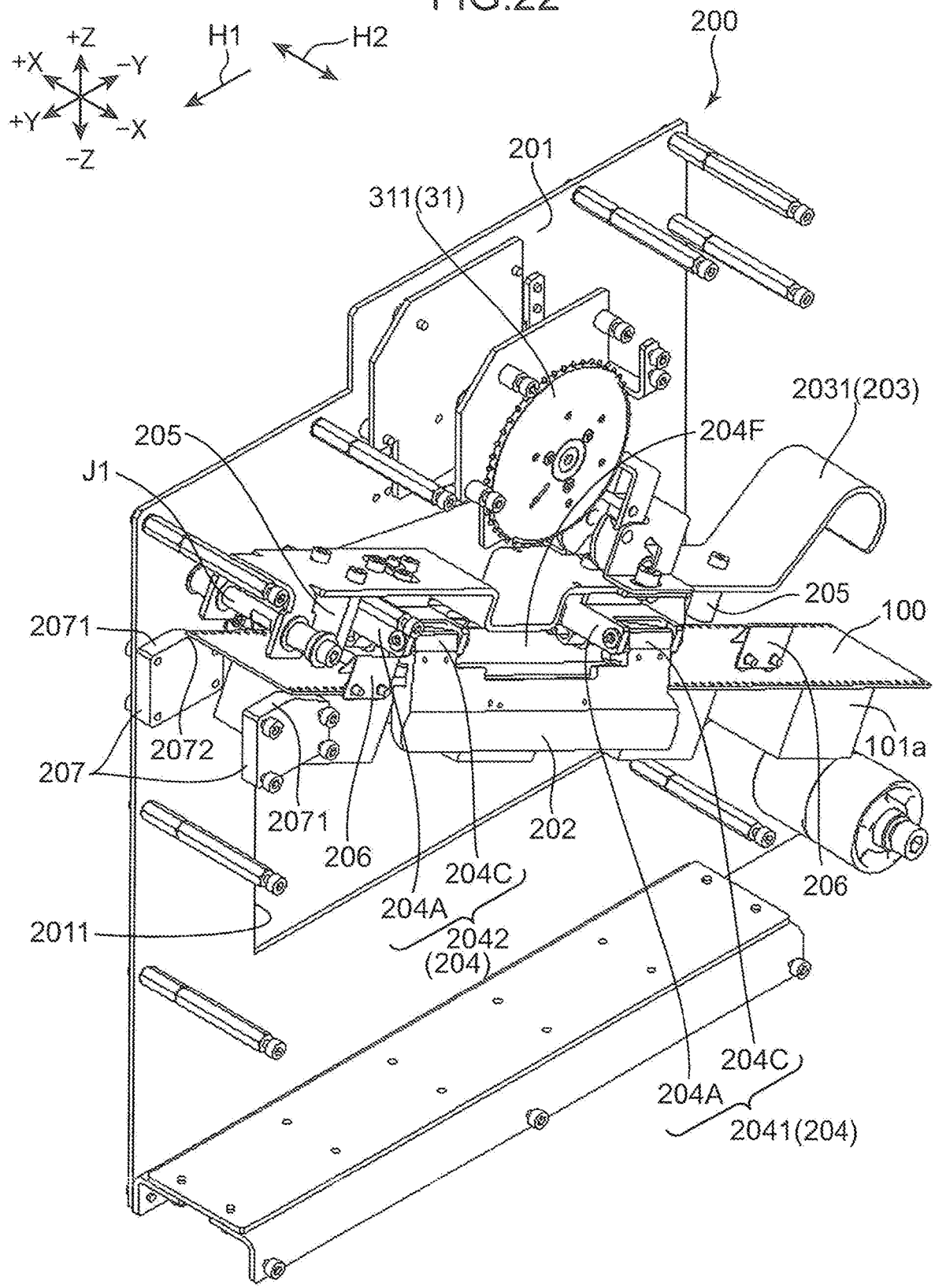
FIG. 22 is a perspective view of the tape lead-in mechanism from which one frame is removed, showing a state in which the pair of tape holding portions are set at a send-off disabling position.
Figure 23:
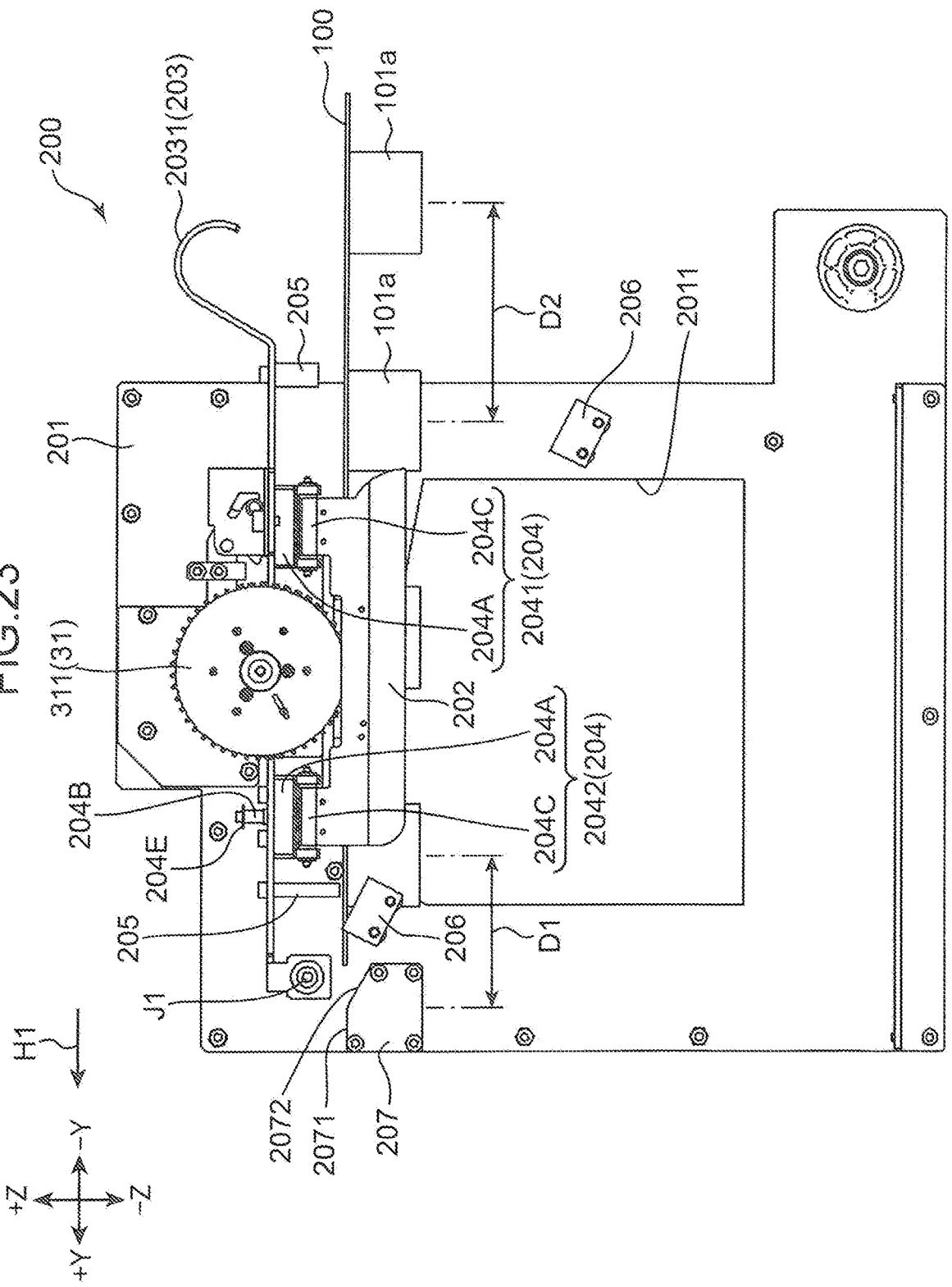
FIG. 23 is a side view of the tape lead-in mechanism from which one frame is removed, showing a state in which the pair of tape holding portions are set at the send-off enabling position.
Figure 24:
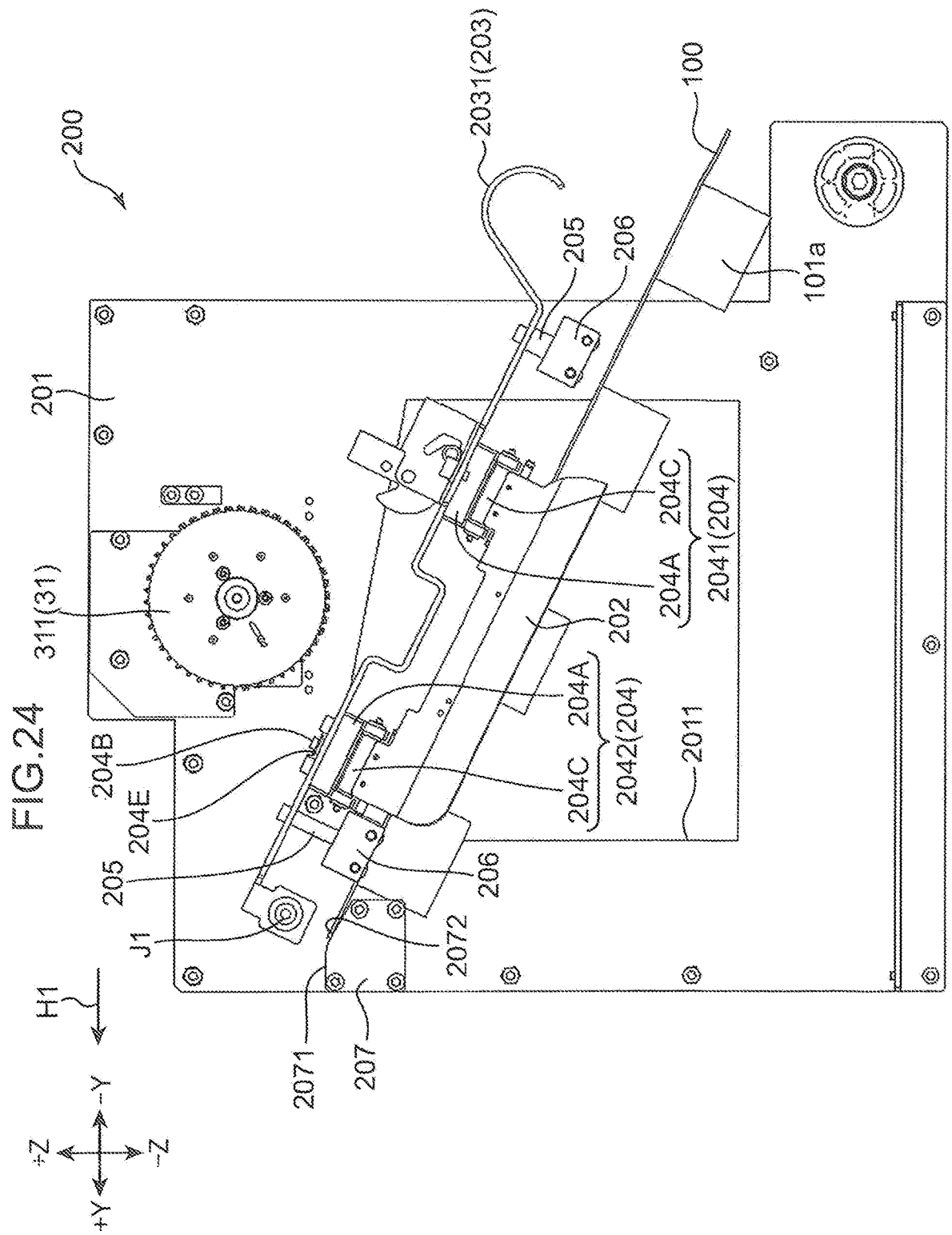
FIG. 24 is a side view of the tape lead-in mechanism from which one frame is removed, showing a state in which the pair of tape holding portions are set at the send-off disabling position.
Figure 25:
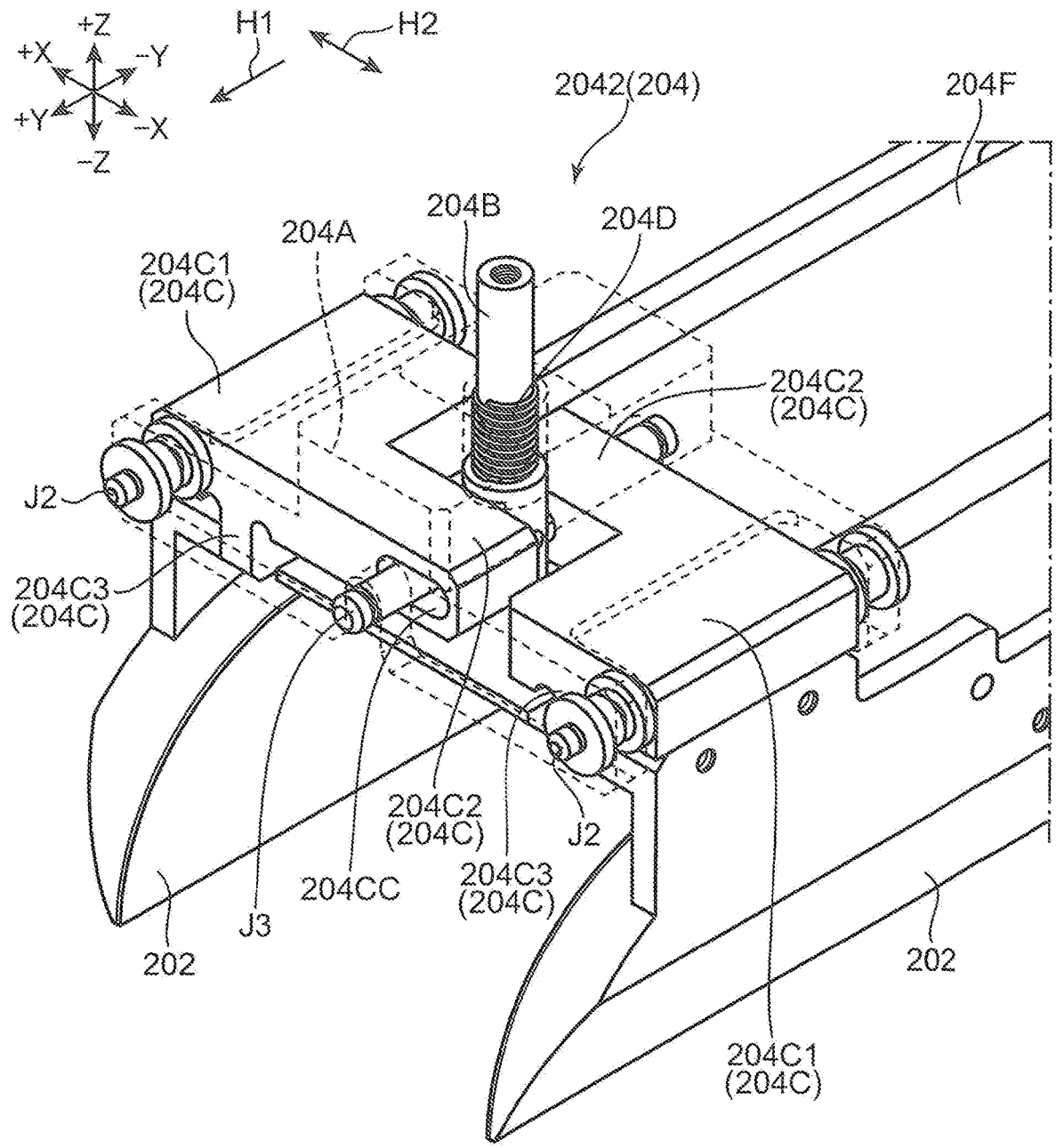
FIG. 25 is an enlarged perspective view of the vicinity of a coupling portion in the tape lead-in mechanism, showing a state in which the pair of tape holding portions are set at the send-off enabling position.
Figure 26:
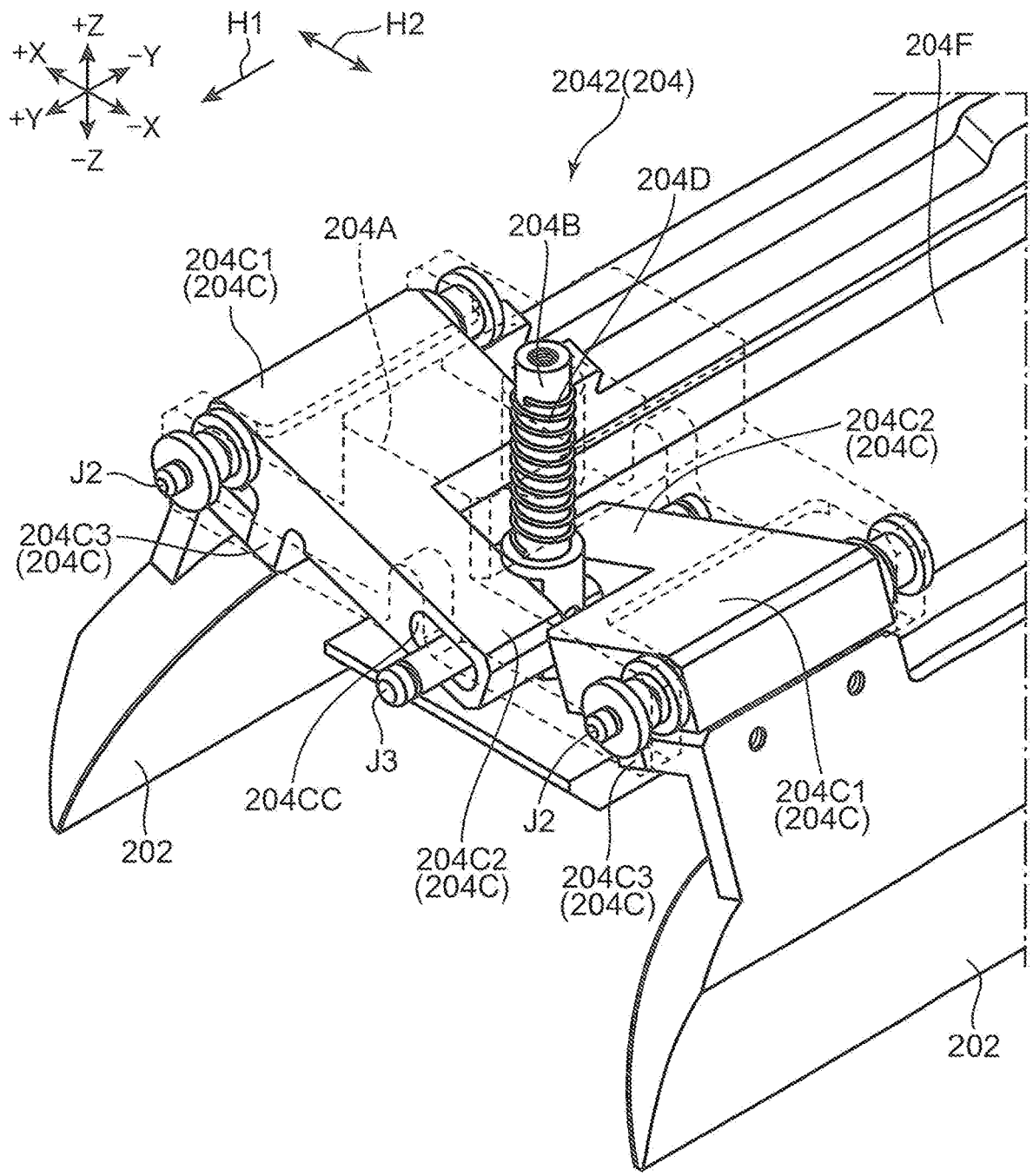
FIG. 26 is an enlarged perspective view of the vicinity of the coupling portion in the tape lead-in mechanism, showing a state in which the pair of tape holding portions are set at the send-off disabling position.
Figure 27:
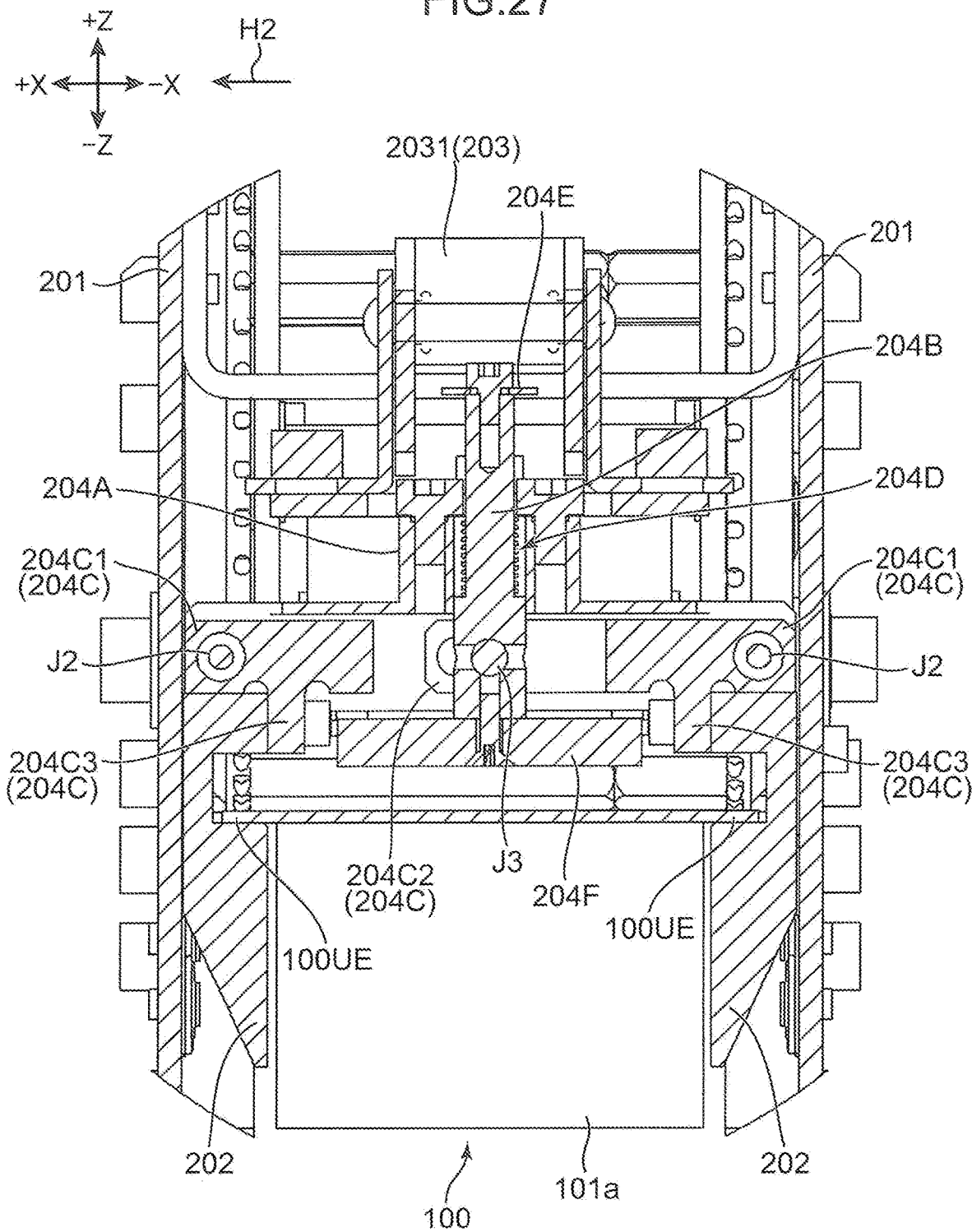
FIG. 27 is an enlarged sectional view of the vicinity of the coupling portion in the tape lead-in mechanism, showing a state in which the pair of tape holding portions are set at the send-off enabling position.
Figure 28:
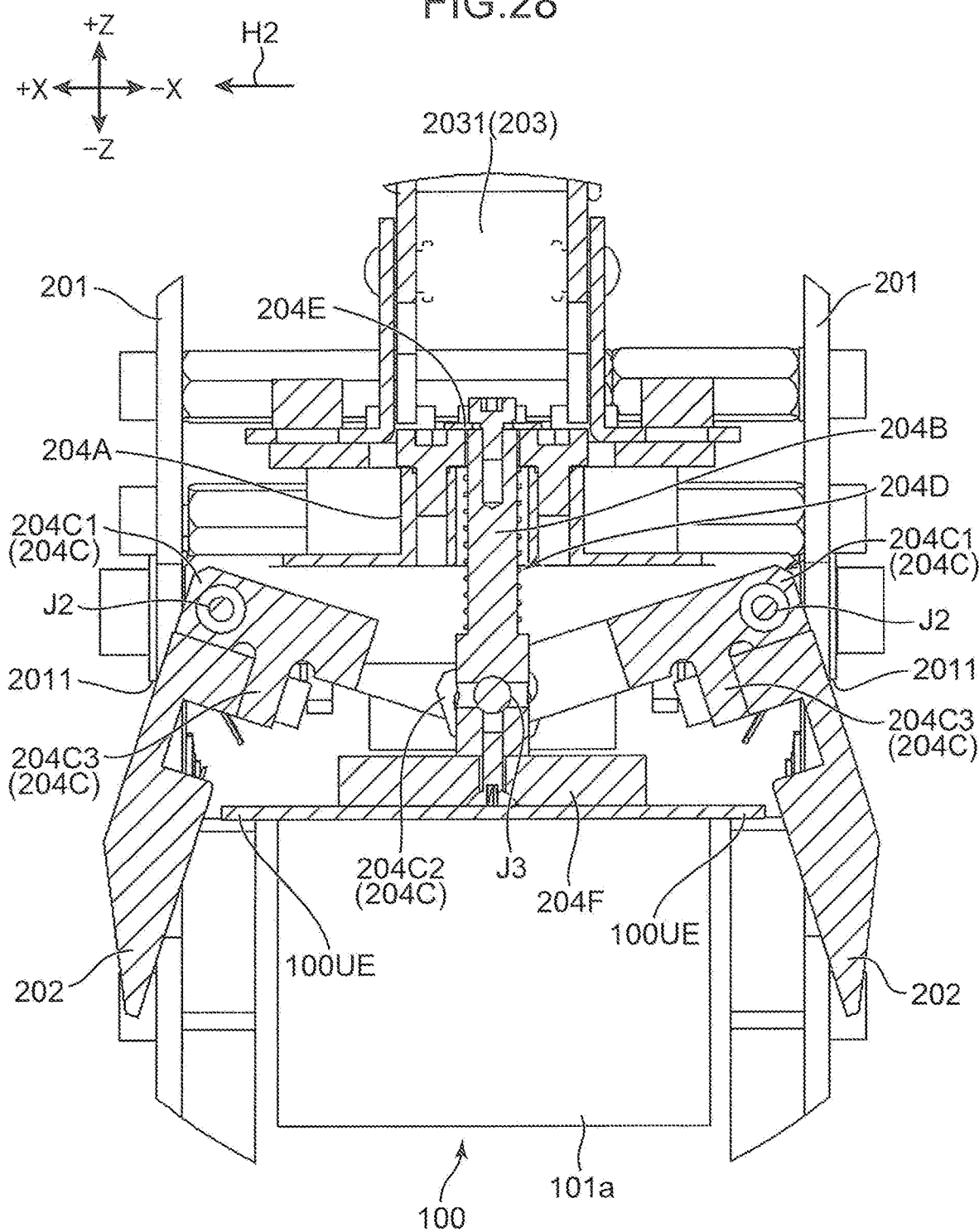
FIG. 28 is an enlarged sectional view of the vicinity of the coupling portion in the tape lead-in mechanism, showing a state in which the pair of tape holding portions are set at the send-off disabling position.

The tape lead-in mechanism 200 included in the component feeding device 1 will then be described in detail with reference to FIGS. 20 to 28. FIGS. 20 to 24 depict a configuration of the tape lead-in mechanism 200. FIGS. 20 to 22 are perspective views of the tape lead-in mechanism 200, while FIGS. 23 and 24 are side views of the tape lead-in mechanism 200. FIGS. 21 to 24 show the tape lead-in mechanism 200 from which a frame 201 is removed, the frame 201 being one of a pair of frames 201 included in the tape lead-in mechanism 200. FIGS. 25 to 28 show enlarged views of the vicinity of a coupling portion 204 included in the tape lead-in mechanism 200. FIGS. 25 and 26 are perspective views of the vicinity of the coupling portion 204, while FIGS. 27 and 28 are sectional views of the vicinity of the coupling portion 204.

The tape lead-in mechanism 200 is a mechanism that is located on the upstream side in the tape send-off direction H1 relative to the second traveling path 52 serving as the upstream-side-path making up the tape traveling path 5 and that leads the component storage tape 100 to the second traveling path 52. The tape lead-in mechanism 200 includes the pair of frames 201, the first tape send-off portion 31 described above, a pair of tape holding portions 202, an operating lever 203, and the coupling portion 204.

The pair of frames 201 are a pair of plate-like members that are set to face each other across a given gap in the X-axis direction (tape width direction H2) and that extend in the Y-axis direction (tape send-off direction H1). As shown in FIG. 20, each of the pair of frames 201 has an opening 2011. A distance between respective inner surfaces of the pair of frames 201, the inner surfaces facing each other, is determined to be larger than the tape width K2 of the component storage tape 100.

The pair of first sprockets 311 of the first tape send-off portion 31 are fitted to the pair of frames 201 such that the first sprockets 311 are located on the upper side (+Z-side) relative to the openings 2011. In FIGS. 20 to 24, out of the pair of first sprockets 311, only the first sprocket 311 fitted to the frame 201 on the −X-side is shown. At the first tape send-off portion 31, the pair of first sprockets 311 rotate to send off the component storage tape 100 toward the second traveling path 52 of the tape traveling path 5.

Between the pair of frames 201, the pair of tape holding portions 202 are set to face each other across a gap in the X-axis direction (tape width direction H2). The pair of tape holding portions 202 are located on the lower side (−Z-side) relative to the first sprockets 311. The pair of tape holding portions 202 hold both ends in the tape width direction H2 of the component storage tape 100 sent off by the first tape send-off portion 31, respectively. According to this embodiment, each of the pair of tape holding portions 202 is formed into an elongated shape extending in the tape send-off direction H1 (Y-axis direction). The tape holding portions 202 each formed into an elongated shape can hold the component storage tape 100 in a preferable manner.

The operating lever 203 is a lever formed into an elongated shape extending in the tape send-off direction H1 (Y-axis direction). The operating lever 203 is operated by the operator. The operating lever 203 is supported on the pair of frames 201 such that applying an operating force to an operation area 2031 on an upstream end in the tape send-off direction H1 causes the operating lever 203 to turn around a first pivot J1 disposed on a downstream end in the tape send-off direction H1. The first pivot J1 extends in the tape width direction H2 (X-axis direction).

The coupling portion 204 is a structure that couples each of the pair of tape holding portions 202 to the operating lever 203. The coupling portion 204 couples the pair of tape holding portions 202 to the operating lever 203 such that the tape holding portions 202 are allowed to turn together with the turned operating lever 203. Further, the coupling portion 204 couples the pair of tape holding portions 202 to the operating lever 203 such that as a result of turning together with the turned operating lever 203, the pair of tape holding portions 202 change in posture between a holding posture in which the pair of tape holding portions 202 are able to hold the component storage tape 100 and a hold releasing posture in which the pair of tape holding portions 202 release a hold on the component storage tape 100. The pair of tape holding portions 202 being in the holding posture are shown in FIGS. 21, 23, 25, and 27. The pair of tape holding portions 202 being in the hold releasing posture are shown in FIGS. 22, 24, 26, and 28.

The coupling portion 204 has a first coupling portion 2041 and a second coupling portion 2042. The first coupling portion 2041 couples upstream ends in the tape send-off direction H1 of the pair of tape holding portions 202 of elongated shapes, to the operating lever 203. The second coupling portion 2042 couples downstream ends in the tape send-off direction H1 of the pair of tape holding portions 202 of elongated shapes, to the operating lever 203.

As a result of turning together with the turned operating lever 203, the pair of tape holding portions 202 shift in position between a send-off enabling position at which the component storage tape 100 can be sent off by the first tape send-off portion 31 and a send-off disabling position at which the component storage tape 100 is released from a state of being sent off by the first tape send-off portion 31. The send-off disabling position is a position that faces the openings 2011 of the pair of frames 201 on the lower side (−Z-side) relative to the send-off enabling position. The pair of tape holding portions 202 being set at the send-off enabling position are shown in FIGS. 21, 23, 25, and 27. The pair of tape holding portions 202 being set at the send-off disabling position are shown in FIGS. 22, 24, 26, and 28.

During a period in which the pair of tape holding portions 202 turn together with the turned operating lever 203 and shift in position between the send-off enabling position and the send-off disabling position, the pair of tape holding portions 202 are subjected to posture change regulation by the pair of frames 201 and therefore keep taking the holding posture (see FIG. 27). When the pair of tape holding portions 202 are set at the send-off disabling position, however, the pair of tape holding portions 202 are released from posture change regulation by the pair of frames 201, thus taking the hold releasing posture in which the tape holding portions 202 spread outward to come out of the openings 2011 (see FIG. 28).

Now, a plurality of component storage tapes 100 can be attached to the component feeding device 1 including the above tape lead-in mechanism 200. A component feeding operation by the component feeding device 1 will be described as follows. The operator first puts a component storage tape 100 preceding in component feeding by the component feeding device 1 (which will hereinafter be referred to as "preceding component storage tape 100") in a state of being held by the pair of tape holding portions 202, which are set at the send-off enabling position and take the holding posture, while fitting a tip end of the preceding component storage tape 100 to the first sprockets 311. Subsequently, the operator operates the operation unit 22 to enter an instruction to rotate the first sprockets 311, thereby causing the first sprockets 311 to send off the preceding component storage tape 100 toward the tape traveling path 5. As a result, the preceding component storage tape 100 is lead into the tape traveling path 5. When a tip end of the preceding component storage tape 100, which has been lead into the tape traveling path 5, reaches the second sprockets 321, the tip end is fitted to the second sprockets 321.

When the tip end of the preceding component storage tape 100 is fitted to the second sprockets 321, the component feeding device 1 starts the component feeding operation. In the component feeding device 1, the second sprockets 321 rotate, thus sending off the preceding component storage tape 100 intermittently. At this time, the first sprockets 311 are left idling. The rotating second sprockets 321 thus send off the preceding component storage tape 100.

In a state in which the preceding component storage tape 100 is sent off by the second sprockets 321, the operator pushes downward the operation area 2031 on the upstream end in the tape send-off direction H1 of the operating lever 203 to turn the operating lever 203. When the operating lever 203 is turned by the operator's push, the pair of tape holding portions 202, which are coupled by the coupling portion 204 to the operating lever 203, shift downward from the send-off enabling position to the send-off disabling position. As a result, the preceding component storage tape 100 is disengaged from the first sprockets 311. At this point of time, the preceding component storage tape 100 is already fitted to the second sprockets 321. When disengaged from the first sprockets 311, therefore, the preceding component storage tape 100 is kept sent off by the second sprockets 321.

In their downward positional shift, the pair of tape holding portions 202 turn together with the turned operating lever 203 while keeping taking the holding posture in which the tape holding portions 202 are able to hold the preceding component storage tape 100, thus shifting from the send-off enabling position to the send-off disabling position. Then, when set at the send-off disabling position, the pair of tape holding portions 202 take the hold releasing posture in which the tape holding portions 202 release a hold on the preceding component storage tape 100. In this manner, after the preceding component storage tape 100 is lead into the tape traveling path 5, the preceding component storage tape 100 is shifted in position downward to release the preceding component storage tape 100 from a state of being sent off by the first sprockets 311, and during this downward positional shift, both ends in the tape width direction H2 of the preceding component storage tape 100 are held by the pair of tape holding portion 202. This prevents a case where a torsion or the like develops on the preceding component storage tape 100 during its downward positional shift. As a result, steady traveling of the preceding component storage tape 100, which is lead into the tape traveling path 5 and is sent off by the second sprockets 321, is ensured, which allows steady component feeding.

In a state in which the pair of tape holding portions 202 take the hold releasing posture and the preceding component storage tape 100 is sent off by the second sprockets 321, the operator pushes upward the operation area 2031 on the upstream end in the tape send-off direction H1 of the operating lever 203 to turn the operating lever 203. When the operating lever 203 is turned by the operator's upward push, the pair of tape holding portions 202, which are coupled by the coupling portion 204 to the operating lever 203, shift upward from the send-off disabling position to the send-off enabling position along the pair of frames 201. As a result, the pair of tape holding portions 202 change their posture from the hold releasing posture to the holding posture.

In a state in which the pair of tape holding portions 202 are set at the send-off enabling position and take the holding posture, the operator puts a component storage tape 100 that follows the preceding component storage tape 100, that is, a following component storage tape 100 in a state of being held by the pair of tape holding portions 202 while fitting a tip end of the following component storage tape 100 to the first sprockets 311. In this manner, before components in the preceding component storage tape 100 are all taken out, the following component storage tape 100 is attached to the component feeding device 1. Subsequently, at a point of time at which the preceding component storage tape 100 finishes with component feeding, sending off the following component storage tape 100 automatically starts.

As described above, in the period in which the pair of tape holding portions 202 shift in position between the send-off enabling position and the send-off disabling position, the pair of tape holding portions 202 are subjected to posture change regulation by the pair of frames 201. During their positional shift between the send-off enabling position and the send-off disabling position, therefore, the pair of tape holding portions 202 are prevented from extending out of the openings 2011 of the pair of frames 201. Thus, when a plurality of component feeding devices 1 are arranged side by side, for example, a case where respective pairs of tape holding portions 202 of adjacent component feeding devices 1 come in contact with each other during the positional shift can be avoided.

Structures of the first coupling portion 2041 and the second coupling portion 2042 of the coupling portion 204 will then be described. A structure of the second coupling portion 2042 will mainly be described with reference to FIGS. 25 to 28, as follows. FIGS. 25 to 28 depict the structure of the second coupling portion 2042 only. It should be noted, however, that the first coupling portion 2041 and the second coupling portion 2042 have the same coupling structure through which the pair of tape holding portions 202 are coupled to the operating lever 203.

Each of the first coupling portion 2041 and the second coupling portion 2042 has a holder 204A, a movable shaft 204B, a pair of link members 204C, a pressure-applying member 204D, a lower limit stopper member 204E, and a regulating plate 204F.

The holder 204A is fixed to a lower surface of the operating lever 203. The movable shaft 204B is a shaft penetrating the operating lever 203 and the holder 204A to extend in the vertical direction (Z-axis direction). The movable shaft 204B is set movable in the vertical direction (Z-axis direction).

The pair of link members 204C couple the pair of tape holding portions 202 respectively to the movable shaft 204B. Each of the pair of link members 204C is formed substantially into an L shape in a plan view in the Z-axis direction. Each of the pair of link members 204C has a supporting point portion 204C1, a force-applying point portion 204C2, and an acting-on point portion 204C3. On each of the pair of link members 204C, in a plan view in the Z-axis direction, the force-applying point portion 204C2 is located at the midpoint in the tape width direction H2 (X-axis direction), the supporting point portion 204C1 is located on the outer side in the tape width direction H2 (X-axis direction), and the acting-on point portion 204C3 is located between the supporting point portion 204C1 and the force-applying point portion 204C2.

The supporting point portion 204C1 is fixed to the holder 204A in such a way as to be capable of turning around a second pivot J2. The second pivot J2 is a shaft extending in the tape send-off direction H1 (Y-axis direction). The force-applying point portion 204C2 is fixed to the movable shaft 204B in such a way as to be capable of turning around a third pivot J3. The third pivot J3 is a shaft set parallel with the second pivot J2. In other words, the third pivot J3 extends in the tape send-off direction H1 (Y-axis direction). The force-applying point portion 204C2 has an insertion hole 204CC of an elongated shape in a view in the Y-axis direction. The third pivot J3 is inserted in this insertion hole 204CC. The acting-on point portion 204C3 is connected to one of the pair of tape holding portions 202.

The pressure-applying member 204D is a member that is fitted to the holder 204A and that applies a downward pressure to the movable shaft 204B. The pressure-applying member 204D is provided as, for example, a coil spring wound around the movable shaft 204B.

When the pair of tape holding portions 202 are set at the send-off disabling position at which the pair of tape holding portions 202 are released from a state of being prevented from changing their posture by the pair of frames 201, the send-off disabling position facing the openings 2011, a downward motion of the movable shaft 204B toward the lower side (−Z-side) caused by the pressure applied by the pressure-applying member 204D is transmitted to the force-applying point portion 204C2, at each of the pair of link members 204C. As a result, the acting-on point portions 204C3 rock on the supporting point portions 204C1, respectively, causing the pair of tape holding portions 202 to change their posture from the holding posture to the hold releasing posture. When the pair of tape holding portions 202 shift their position from the send-off disabling position to the send-off enabling position as a result of the operating lever 203 being turned, in contrast, a regulating force by the pair of frames 201 acts on the pair of tape holding portions 202 having taken the hold releasing posture. The regulating force by the pair of frames 201 that acts on the pair of tape holding portions 202 is transmitted to the movable shaft 204B via the pair of the link members 204C. When the regulating force is transmitted to the movable shaft 204B, the movable shaft 204B moves toward the upper side (+Z-side) against the pressure applied by the pressure-applying member 204D. As a result, the pair of tape holding portions 202 change their posture from the hold releasing posture to the holding posture.

The lower limit stopper member 204E, which is included in the first coupling portion 2041 and in the second coupling portion 2042, is a member that is fixed to an upper end of the movable shaft 204B and that regulates a lower limit position of the movable shaft 204B that moves in the vertical direction (Z-axis direction). At each of the pair of link members 204C, therefore, the lower limit stopper member 204E regulates an extent of a downward motion of the movable shaft 204B toward the lower side (−Z-side), the downward motion being transmitted to the force-applying point portion 204C2. As a result, an extent of rocking of the acting-on point portion 204C3 on the supporting point portion 204C1 is regulated. Hence the pair of link members 204C change a posture of the pair of tape holding portions 202 in a steady manner.

The regulating plate 204F, which is included in the first coupling portion 2041 and in the second coupling portion 2042, is a plate of an elongated shape that extends along the tape send-off direction H1 (Y-axis direction). The regulating plate 204F is fixed to a lower end of the movable shaft 204B such that the regulating plate 204F located above the component storage tape 100 (located on the +Z-side relative to the component storage tape 100), which is held by the pair of tape holding portions 202, is counter to the component storage tape 100. In other words, in a state in which the pair of tape holding portions 202 are set at the send-off enabling position, the regulating plate 204F regulates an upward positional shift (positional shift toward the +Z-side) of the component storage tape 100, which is held by the pair of tape holding portions 202. As a result, when the component storage tape 100 held by the pair of tape holding portions 202 is sent off toward the tape traveling path 5 by the first sprockets 311, the traveling posture of the component storage tape 100 becomes stable. In a state in which the pair of tape holding portions 202 are set at the send-off disabling position, on the other hand, the movable shaft 204B moves downward (toward the −Z-side). The pair of link members 204C then make a motion that follows the downward move of the movable shaft 204B, thus causing the pair of tape holding portions 202 to change their posture from the holding posture to the hold releasing posture. At this time, the regulating plate 204F moves downward (toward the −Z-side) together with the movable shaft 204B moving downward. The regulating plate 204F thus pushes downward the component storage tape 100, which is released from a hold by the pair of tape holding portions 202 when they take the hold releasing posture. Hence the component storage tape 100 is certainly separated from the pair of tape holding portions 202.

As shown in FIGS. 21 to 24, the tape lead-in mechanism 200 further includes a projecting piece 205 projecting from a lower surface of the operating lever 203, and tape support portions 206 fitted to the pair of frames 201 in such a way as to be around the openings 2011. The projecting piece 205 pushes downward (toward the −Z-side) the component storage tape 100, which is released from a hold by the pair of tape holding portions 202 when they take the hold releasing posture, in a motion that follows a turn of the operating lever 203. The tape support portions 206 regulate a positional shift of the component storage tape 100 toward the upper side (+Z-side), the component storage tape 100 being pushed downward by the projecting piece 205, while supporting the component storage tape 100.

The component storage tape 100 released from a hold by the pair of tape holding portions 202, which are set at the send-off disabling position as a result of their turn around the first pivot J1 disposed on the downstream end in the tape send-off direction H1 of the operating lever 203, deforms elastically such that the upstream end side in the tape send-off direction H1 of the component storage tape 100 droops down. However, when the component E2 stored in the component storage portion 101a has a small weight or when no component E2 is stored in the component storage portion 101a, the elasticity of the component storage tape 100 prompts it to rise upward. If the component storage tape 100 released from a hold by the pair of tape holding portions 202 rises upward (toward the +Z-side), the pair of tape holding portions 202 come to hold this component storage tape 100 when the tape holding portions 202 change their posture from the hold releasing posture to the holding posture. In this case, therefore, the component storage tape 100 cannot be certainly separated from the pair of tape holding portions 202.

To prevent such a case, the tape lead-in mechanism 200 is provided with the projecting piece 205 projecting from the lower surface of the operating lever 203 and with the tape support portions 206. The projecting piece 205 pushes downward (toward the −Z-side) the component storage tape 100 released from a hold by the pair of tape holding portions 202. The tape support portions 206 then regulate a positional shift of the component storage tape 100 toward the upper side (+Z-side), the component storage tape 100 being pushed downward by the projecting piece 205, while supporting the component storage tape 100. This allows the component storage tape 100 released from a hold by the pair of tape holding portions 202 to be separated certainly from the pair of tape holding portions 202.

As shown in FIG. 23, the tape lead-in mechanism 200 further includes a pair of tape lead-in guides 207 fitted respectively to downstream ends in the tape send-off direction H1 of the pair of frames 201. Each of the pair of tape lead-in guides 207 has a tape lead-in guide surface 2071 that guides the component storage tape 100 sent off by the first sprockets 311 to lead the component storage tape 100 into the tape traveling path 5, and a lead-in sloped surface 2072 continuous with the upstream end side of the tape lead-in guide surface 2071. The tape lead-in guide surface 2071 and the second traveling path 52 of the tape traveling path 5 (the upper end faces of the pair of the guide walls 41) lie on the same plane. A separation distance D1 along the tape send-off direction H1 between downstream side edges in the tape send-off direction H1 of the pair of tape holding portions 202 and upstream side edges in the tape send-off direction H1 of the tape lead-in guide surfaces 2071 of the pair of tape lead-in guides 207 is determined to be equal to or larger than a length D2 between respective centers of adjacent component storage portions 101a of the component storage tape 100.

The component storage tape 100 sent off by the first sprockets 311 is guided along the tape lead-in guide surfaces 2071 of the pair of tape lead-in guides 207 and is lead into the tape traveling path 5 as both ends in the tape width direction H2 of the component storage tape 100 are held by the pair of tape holding portions 202 set at the send-off enabling position. The component storage tape 100 having been lead into the tape traveling path 5 is sent off intermittently by the second sprockets 321 placed on the tape traveling path 5, toward the component take-out position 21. After the component storage tape 100 is lead into the tape traveling path 5, the pair of tape holding portions 202 holding the component storage tape 100 are shifted in position from the send-off enabling position to the send-off disabling position to let the tape holding portions 202 release their hold on the component storage tape 100. At this time, the pair of tape holding portions 202 turn around the first pivot J1 disposed on the downstream end in the tape send-off direction H1 of the operating lever 203 to make a positional shift from the send-off enabling position to the send-off disabling position. In other words, as a result of their positional shift from the send-off enabling position to the send-off disabling position, the pair of tape holding portions 202 tilt downward (toward the −Z-side) such that the downstream ends in the tape send-off direction H1 are on the upper side as the upstream ends are on the lower side. Thus, the component storage tape 100, which have been lead into the tape traveling path 5 along the tape lead-in guide surfaces 2071 of the pair of tape lead-in guides 207, is folded on an area between the tape lead-in guides 207 and the tape holding portions 202 as a result of the positional shift of the pair of tape holding portions 202.

It is difficult to fold the component storage tape 100 on its part where the component storage portion 101a is located. It is preferable, therefore, that the component storage tape 100 be folded on an area between adjacent component storage portions 101a. For example, when the pair of tape lead-in guides 207 and the pair of tape holding portions 202 are located close to each other in the tape send-off direction H1, timing to cause the pair of tape holding portions 202 to shift in position downward from the send-off enabling position to the send-off disabling position needs to be matched to timing to locate the area between adjacent component storage portions 101a of the component storage tape 100, which is sent off intermittently by the second sprockets 321, in the gap between the tape lead-in guides 207 and the tape holding portions 202.

To meet this requirement, in the tape lead-in mechanism 200, the separation distance D1 along the tape send-off direction H1 between the downstream side edges in the tape send-off direction H1 of the pair of tape holding portions 202 and the upstream side edges in the tape send-off direction H1 of the tape lead-in guide surfaces 2071 of the pair of tape lead-in guides 207 is determined to be equal to or larger than the length D2 between respective centers of adjacent component storage portions 101a of the component storage tape 100. As a result, on the component storage tape 100 sent off intermittently by the second sprockets 321, the area between adjacent component storage portions 101a constantly lies in the gap between the tape lead-in guides 207 and the tape holding portions 202. Thus, when the pair of tape holding portions 202 are shifted in position downward from the send-off enabling position to the send-off disabling position at any given point of time, the component storage tape 100 is always folded on the area between adjacent component storage portions 101a in a preferable manner.

The component feeding device and the component mounter according to the embodiment of the present disclosure have been described above. The present disclosure is, however, not limited to these component feeding device and the component mounter but may be embodied as the following modified embodiments.

First Modified Embodiment

Figure 29:
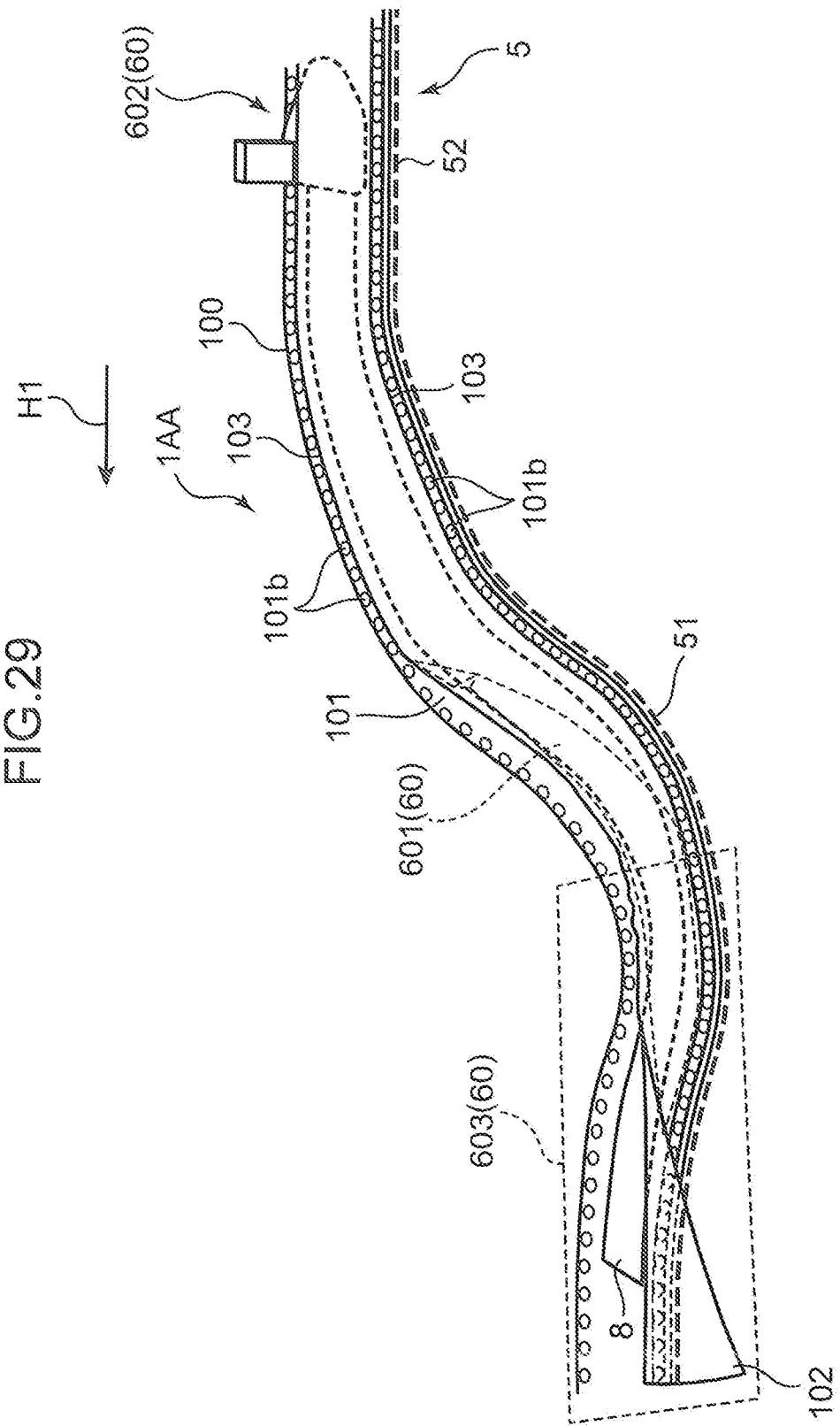
FIG. 29 is a perspective view of a component exposing unit of a cover tape separating type.

In the embodiment described above, the component exposing unit 6 of the component feeding device 1, the component exposing unit 6 being of the cover tape cutting type, includes the cover tape pre-processing portion 62 that cuts the cover tape 102 of the component storage tape 100. The present disclosure is, however, not limited to this configuration. As shown in FIG. 29, the component feeding device may be configured to include a component exposing unit 60 of a cover tape separating type. On a component feeding device 1AA shown in FIG. 29, the component exposing unit 60 lifts the cover tape 102 of the component storage tape 100, which travels as it is guided by the guide surfaces 5 of the pair of guide walls 41, along the joined portion 103 serving as a starting point, the joined portion 103 being on one end in the tape width direction, and pushes a lifted part of the cover tape 102 outward in the tape width direction while folding the lifted part downward to expose the component E2 in the component storage portion 101a.

The component exposing unit 60 of the cover tape separating type includes a cover tape lifting portion 601, a cover tape pre-processing portion 602, and a cover tape post-processing portion 603.

The cover tape lifting portion 601 is disposed between the pair of guide walls 41 such that the cover tape lifting portion 601 corresponds to the first guide surface portions 51 of the guide surfaces 5. The cover tape lifting portion 601 carries out a lifting process of lifting the cover tape 102 off the carrier tape 101 such that an extent of lifting the cover tape 102 off the carrier tape 101 increases continuously on the component storage tape 100, which travels as it is guided by the first guide surface portions 51. An upstream end in the tape send-off direction H1 of the cover tape lifting portion 601 is fixed to the lid member 8. The cover tape lifting portion 601 extends from the upstream side toward the downstream side in the tape send-off direction H1 in such a way as to head from one side to the other side in the tape width direction. In other words, on the cover tape lifting portion 601, a point of starting contact with the cover tape 102 is located on one end on one side in the tape width direction. On the cover tape lifting portion 601, a lowermost downstream end, which is a point of ending contact with the cover tape 102, is located on the other end on the other side in the tape width direction.

The cover tape pre-processing portion 602 is disposed between the pair of guide walls 41 such that the cover tape pre-processing portion 602 corresponds to the second guide surface portions 52 of the guide surfaces 5. Before the cover tape lifting portion 601 carries out the lifting process, the cover tape pre-processing portion 602 carries out pre-processing of separating the joined portion 103 where the cover tape 102 is joined to the carrier tape 101, the joined portion 103 being on the one end on the one side in the tape width direction of the cover tape 102.

The cover tape post-processing portion 603 is disposed on the upper side relative to the cover tape lifting portion 601 such that the cover tape post-processing portion 603 corresponds to the first guide surface portions 51 of the guide surfaces 5. The cover tape post-processing portion 603 carries out post-processing of pushing a lifted part of the cover tape 102 lifted by the cover tape lifting portion 601 to outside of a side edge in the tape width direction of the component storage tape 100, the side edge being on the side opposite to the side on which the cover tape 102 is separated by the cover tape pre-processing portion 602, while folding the lifted part downward to make the component storage portion 101a open to the outside.

According to the component exposing unit 60 of the cover tape separating type, the cover tape 102 of the component storage tape 100, which travels along the guide surfaces 5, is separated by the cover tape pre-processing portion 602, is lifted by the cover tape lifting portion 601, and is pushed outward by the cover tape post-processing portion 603. This exposes the component E2 in the component storage portion 101a of the component storage tape 100 so that the component E2 can be taken out.

As a tape lead-in mechanism of the component feeding device 1AA, the tape lead-in mechanism 200 included in the above component feeding device 1 may be adopted.

Second Modified Embodiment

Figure 30:
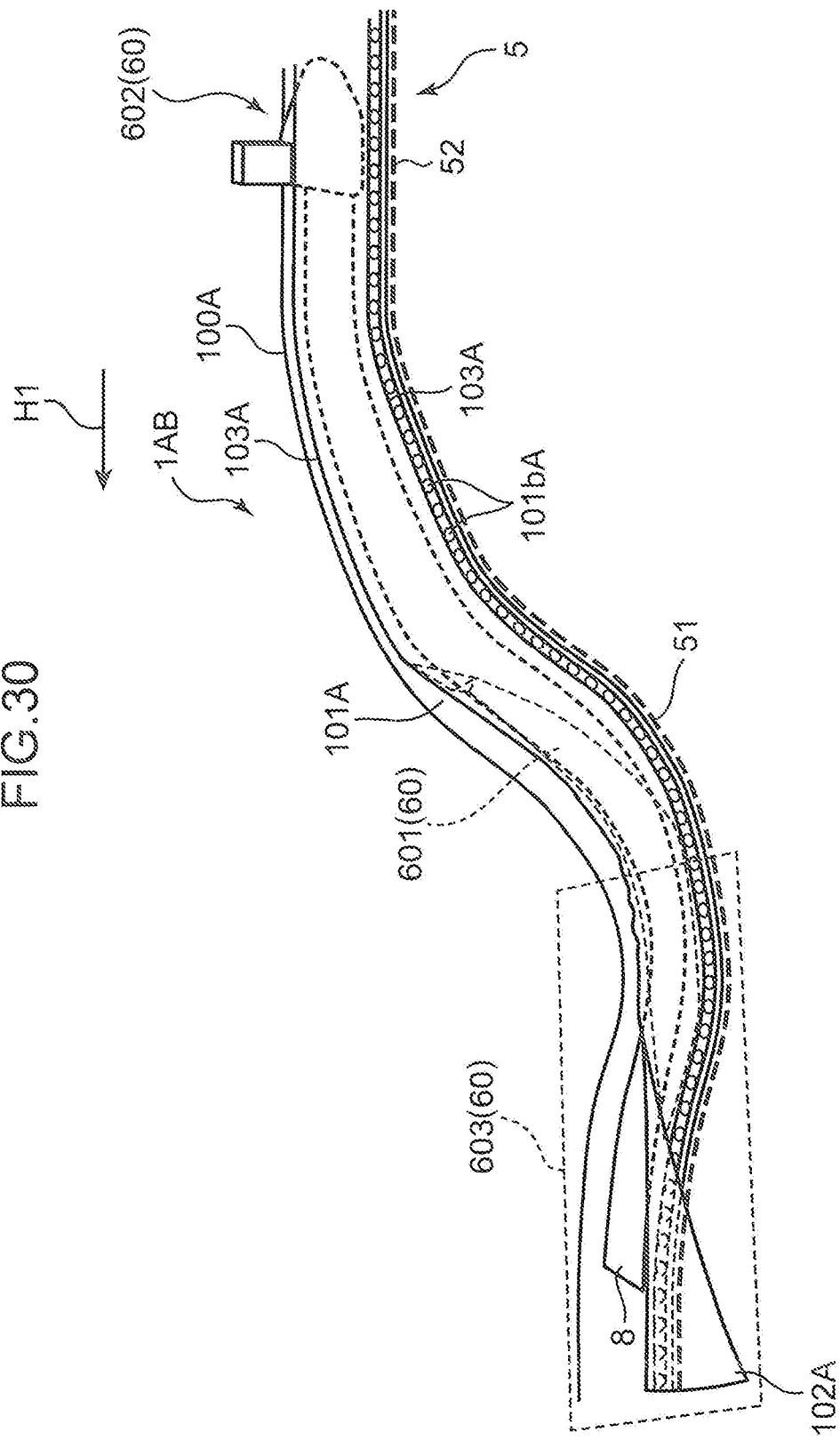
FIG. 30 is a perspective view of a component exposing unit used for a component storage tape with a small width.

In the embodiment described above, the component feeding device that feeds components using the component storage tape 100 with a large width of 32 mm or more has been described. According to the present disclosure, the configuration of the component feeding device is not limited to this. The component feeding device, for example, may be configured such that it feeds components using a component storage tape with a small width of less than 32 mm (e.g., 12 mm, 16 mm, or 24 mm). FIG. 30 is a perspective view of a component exposing unit included in a component feeding device 1AB that uses a component storage tape 100A with a small width.

The component storage tape 100A with a small width includes a carrier tape 101A and a cover tape 102A. The carrier tape 101A, which is similar to the carrier tape 101 of the component storage tape 100 with a large width, is a tape having a plurality of component storage portions in which components are stored, the component storage portions being arranged at given intervals. The carrier tape 101A has holes 101bA that are formed only on one end on one side in the width direction of the carrier tape 101A at given intervals. The cover tape 102A is a tape pasted on the carrier tape 101A in such a way as to cover the component storage portions. The cover tape 102A is pasted on the carrier tape 101A by joining both ends in the width direction of the cover tape 102A to the carrier tape 101A. As a result, on the component storage tape 100A, joined portions 103A, which result from the cover tape 102A being joined to the carrier tape 101A, are formed respectively on both ends in the width direction of an upper surface of the carrier tape 101A such that the joined portions 103A extend linearly along edges in the width direction of the cover tape 102A.

In the tape send-off unit 3 that is included in the above component feeding device 1 using the component storage tape 100 with a large width, the first tape send-off portion 31, the second tape send-off portion 32, and the third tape send-off portion 33 each include a pair of sprockets. In a tape send-off unit that is included in the component feeding device 1AB using the component storage tape 100A with a small width, in contrast, a first tape send-off portion, a second tape send-off portion, and a third tape send-off portion each include a sprocket that is disposed on the side on which the sprocket corresponds to the holes 101bA formed on the component storage tape 100A. Each sprocket of the first tape send-off portion, the second tape send-off portion, and the third tape send-off portion, which are included in the component feeding device 1AB, rotates as the teeth of the sprocket are fitted in the holes 101bA of the component storage tape 100A, thereby sending off the component storage tape 100A.

As shown in FIG. 30, the component feeding device 1AB using the component storage tape 100A with a small width includes the component exposing unit 60 of the cover tape separating type, which has been described above as the first modified embodiment. On the component exposing unit 60 of the component feeding device 1AB, the cover tape pre-processing portion 602 separates the cover tape 102A of the component storage tape 100A along the joined portion 103A opposite to the side on which the holes 101bA are formed. The cover tape lifting portion 601 lifts the separated cover tape 102A. Then, the cover tape post-processing portion 603 pushes the lifted part of the cover tape 102A to outside of the side edge opposite to the side on which the cover tape 102A is separated by the cover tape pre-processing portion 602 and folds the lifted part of the cover tape 102A downward. This exposes the component in the component storage portion of the component storage tape 100A so that the component can be taken out.

The width of the cover tape 102A of the component storage tape 100A with a small width is smaller than the width of the cover tape 102 of the component storage tape 100 with a large width. When the component exposing process is carried out on the component storage tape 100A with a tape width of 12 mm or 16 mm, using the component exposing unit 6 of the cover tape cutting type included in the component feeding device 1, it is difficult to push the lifted part of the cover tape 102A outward to an extent that the lifted part is located outside the carrier tape 101A. It is preferable, for this reason, that the component exposing unit 60 of the cover tape separating type be adopted as the component exposing unit that carries out the component exposing process on the component storage tape 100A with a small tape width of 12 mm or 16 mm. As the component exposing unit that carries out the component exposing process on the component storage tape 100A with a tape width of 24 mm, either the component exposing unit 6 of the cover tape cutting type or the component exposing unit 60 of the cover tape separating type may be used.

As a tape lead-in mechanism of the component feeding device 1AB, the tape lead-in mechanism 200 included in the above component feeding device 1 may be adopted.

The above specific embodiments include aspects of the disclosure that offer various configurations in the following manner.

A component feeding device according to one aspect of the present disclosure is a device that transfers a component to a component take-out position, using a component storage tape having a plurality of component storage portions storing the components therein, the component storage portions being arranged at given intervals. This component feeding device includes a tape traveling path that is a path leading to the component take-out position of the component storage tape, and a tape lead-in mechanism that leads the component storage tape into the tape traveling path. The tape lead-in mechanism includes: a pair of frames arranged to face each other across a gap in a tape width direction of the component storage tape, the pair of frames each having an opening; a first tape send-off portion fitted to the pair of frames in such a way as to be on an upper side relative to the opening, the first tape send-off portion sending off the component storage tape in a tape send-off direction in which the component storage tape heads for the tape traveling path; a pair of tape holding portions disposed between the pair of frames in such a way as to be on a lower side relative to the first tape send-off portion, the pair of tape holding portions holding both ends in the tape width direction of the component storage tape sent off by the first tape send-off portion, respectively; an operating lever extending in the tape send-off direction, the operating lever being supported on the pair of frames such that applying an operation force to an upstream end in the tape send-off direction of the operating lever causes the operating lever to turn around a first pivot disposed on a downstream end in the tape send-off direction and extending in the tape width direction; and a coupling portion coupling the pair of tape holding portions to the operating lever such that the pair of tape holding portions are allowed to turn together with the turned operation lever and that as a result of the turn, the pair of tape holding portions are allowed to change in posture between a holding posture in which the pair of tape holding portions are able to hold the component storage tape and a hold releasing posture in which the pair of tape holding portions release a hold on the component storage tape. As a result of turning together with the turned operating lever, the pair of tape holding portions shift in position between a send-off enabling position at which the component storage tape can be sent off by the first tape send-off portion and a send-off disabling position at which the component storage tape is released from a state of being sent off by the first tape send-off portion, the send-off disabling position facing the opening on the lower side relative to the send-off enabling position. When set at the send-off disabling position, the pair of tape holding portions take the hold releasing posture.

According to the component feeding device, the first tape send-off portion sends off the component storage tape toward the tape traveling path, the component storage tape being in a state in which its both ends in the tape width direction are held by the pair of tape holding portions set at the send-off enabling position. As a result, the tape lead-in mechanism is able to lead the component storage tape into the tape traveling path. When the operating lever is turned by an operator's push after the component storage tape is lead into the tape traveling path, the pair of tape holding portions, which are coupled by the coupling portion to the operating lever, shift downward from the send-off enabling position to the send-off disabling position. At this time, the pair of tape holding portions turn together with the turned operating lever while keeping taking the holding posture in which the tape holding portions are able to hold the component storage tape, thus shifting from the send-off enabling position to the send-off disabling position. Then, when set at the send-off disabling position, the pair of tape holding portions take the hold releasing posture in which the tape holding portions release a hold on the component storage tape. In this manner, after the component storage tape is lead into the tape traveling path, the component storage tape is shifted in position downward to release it from the state of being sent off by the first tape send-off portion, and during this downward positional shift, both ends in the tape width direction of the component storage tape are held by the pair of tape holding portions. This prevents a case where a torsion or the like develops on the component storage tape during its downward positional shift. As a result, steady traveling of the component storage tape lead into the tape traveling path is ensured, which allows steady component feeding.

In the above component feeding device, the pair of tape holding portions may be configured such that when the pair of tape holding portions turn together with the turned operating lever to shift in position between the send-off enabling position and the send-off disabling position, the pair of tape holding portions are subjected to posture change regulation by the pair of frames to keep taking the holding posture, and when the pair of tape holding portions are set at the send-off disabling position, the pair of tape holding portions are released from posture change regulation by the pair of frames to take the hold releasing posture in which the tape holding portions spread outward to come out of the openings.

In this aspect, in the period in which the pair of tape holding portions shift in position between the send-off enabling position and the send-off disabling position, the pair of tape holding portions are subjected to posture change regulation by the pair of frames. During their positional shift between the send-off enabling position and the send-off disabling position, therefore, the pair of tape holding portions are prevented from extending out of the openings of the pair of frames. Thus, when a plurality of component feeding devices are arranged side by side, for example, a case where respective pairs of tape holding portions of adjacent component feeding devices come in contact with each other during the positional shift can be avoided.

In the above component feeding device, the coupling portion includes a holder fixed to a lower surface of the operating lever, a movable shaft penetrating the operating lever and the holder to extend in a vertical direction, the movable shaft being capable of moving in the vertical direction, and a pair of link members that couple the pair of tape holding portions respectively to the movable shaft. Each of the pair of link members has a supporting point portion fixed to the holder in such a way as to be capable of turning around a second pivot extending in the tape send-off direction, a force-applying point portion fixed to the movable shaft in such a way as to be capable of turning around a third pivot parallel with the second pivot, and an acting-on point portion connected to the pair of tape holding portions.

In the above component feeding device, the coupling portion further includes a biasing member fitted to the holder, the biasing member applying a downward pressure to the movable shaft. When the pair of tape holding portions are set at the send-off disabling position, a downward motion of the movable shaft toward the lower side caused by a pressure applied by the biasing member is transmitted to the force-applying point portion, thus causing the acting-on point portion to rock on the supporting point portion, at each of the pair of link members, and, consequently, the pair of tape holding portions change in posture from the holding posture to the hold releasing posture.

In this aspect, the coupling portion couples the pair of tape holding portions to the operating lever via the holder such that the tape holding portions can turn together with the turned operating lever. On the coupling portion, the pair of link members cause the pair of tape holding portions to change their posture respectively from the holding posture to the hold releasing posture.

In the component feeding device, the coupling portion further includes a lower limit stopper member fixed to an upper end of the movable shaft, the lower limit stopper member regulating a lower limit position of the movable shaft that moves in a vertical direction, and a plate that extends along the tape send-off direction, the plate being fixed to a lower end of the movable shaft such that the plate above the component storage tape held by the pair of tape holding portions faces to the component storage tape.

In this aspect, the lower limit stopper member regulates the lower limit position of the movable shaft that moves in the vertical direction. At each of the pair of link members, therefore, an extent of a downward motion of the movable shaft toward the lower side, the downward motion being transmitted to the force-applying point portion, is regulated. As a result, an extent of rocking of the acting-on point portion on the supporting point portion is regulated. Hence the pair of link members change a posture of the pair of tape holding portions in a steady manner. The plate fixed to the lower end of the movable shaft is counter to the component storage tape, which is held by the pair of tape holding portions, such that the plate above the component storage tape is counter to the component storage tape. In other words, in a state in which the pair of tape holding portions are set at the send-off enabling position, the plate regulates an upward positional shift of the component storage tape, which is held by the pair of tape holding portions. As a result, when the component storage tape held by the pair of tape holding portions is sent off toward the tape traveling path by the first tape send-off portion, the traveling posture of the component storage tape becomes stable. In a state in which the pair of tape holding portions are set at the send-off disabling position, on the other hand, the movable shaft of the coupling portion moves downward. The pair of link members then make a motion that follows the downward move of the movable shaft, thus causing the pair of tape holding portions to change their posture from the holding posture to the hold releasing posture. At this time, the plate moves downward together with the movable shaft moving downward. The plate thus pushes downward the component storage tape, which is released from a hold by the pair of taper holding portions when they take the hold releasing posture. Hence the component storage tape is certainly separated from the pair of tape holding portions.

In the component feeding device, the tape lead-in mechanism further includes a projecting piece projecting from a lower surface of the operating lever, the projecting piece pushing downward the component storage tape in a motion that follows a turn of the operating lever, the component storage tape being released from a hold by the pair of tape holding portions when the tape holding portions take the hold releasing posture, and a tape support portion fitted to the pair of frames in such a way as to be around the opening, the tape support portion regulating a positional shift of the component storage tape toward an upper side, the component storage tape being pushed downward by the projecting piece, while supporting the component storage tape.

The component storage tape released from a hold by the pair of tape holding portions, which are set at the send-off disabling position as a result of their turn around the first pivot disposed on the downstream end in the tape send-off direction of the operating lever, deforms elastically such that the upstream end side in the tape send-off direction of the component storage tape droops down. However, when the component stored in the component storage portion has a small weight or when no component is stored in the component storage portion, the elasticity of the component storage tape prompts it to rise upward. If the component storage tape released from a hold by the pair of tape holding portions rises upward, the pair of tape holding portions come to hold this component storage tape when the tape holding portions change their posture from the hold releasing posture to the holding posture. In this case, therefore, the component storage tape cannot be certainly separated from the pair of tape holding portions.

To prevent such a case, the component feeding device is provided with the projecting piece projecting from the lower surface of the operating lever and with the tape support portions. The projecting piece pushes downward the component storage tape released from a hold by the pair of tape holding portions. The tape support portions then regulate a positional shift of the component storage tape toward the upper side, the component storage tape being pushed downward by the projecting piece, while supporting the component storage tape. This allows the component storage tape released from a hold by the pair of tape holding portions to be separated certainly from the pair of tape holding portions.

In the component feeding device, each of the pair of tape holding portions is formed to extend along the tape send-off direction. The coupling portion has a first coupling portion that couples upstream ends in the tape send-off direction of the pair of tape holding portions to the operating lever, and a second coupling portion that couples downstream ends in the tape send-off direction of the pair of tape holding portions to the operating lever.

In this aspect, the pair of tape holding portions of elongated shapes extending in the tape send-off direction can hold the component storage tape in a preferable manner. For the pair of tape holding portions of elongated shapes, the coupling portion is configured to have the first coupling portion and the second coupling portion. In this configuration, on the pair of tape holding portions of elongated shapes, the first coupling portion couples the upstream ends in the tape send-off direction of the tape holding portions to the operating lever, while the second coupling portion couples the downstream ends in the tape send-off direction of the same to the operating lever.

The component feeding device further includes a second tape send-off portion disposed on the tape traveling path, the second tape send-off portion receiving the component storage tape lead into the tape traveling path by the tape lead-in mechanism and intermittently sending off the component storage tape in such a way as to match a center of the component storage portion to the component take-out position. The tape lead-in mechanism further includes a pair of tape lead-in guides fitted respectively to downstream ends in the tape send-off direction of the pair of frames, the pair of tape lead-in guides each having a guide surface that guides the component storage tape sent off by the first tape send-off portion to lead the component storage tape into the tape traveling path. A separation distance along the tape send-off direction between downstream side edges in the tape send-off direction of the pair of tape holding portions and upstream side edges in the tape send-off direction of the guide surfaces of the pair of tape lead-in guides is determined to be equal to or larger than a length between respective centers of the component storage portions of the component storage tape, the component storage portions being adjacent to each other.

In this aspect, the component storage tape sent off by the first tape send-off portion is guided along the guide surfaces of the pair of tape lead-in guides and is lead into the tape traveling path as both ends in the tape width direction of the component storage tape are held by the pair of holding portions set at the send-off enabling position. The component storage tape having been lead into the tape traveling path is sent off intermittently by the second tape send-off portion placed on the tape traveling path, toward the component take-out position. After the component storage tape is lead into the tape traveling path, the pair of tape holding portions holding the component storage tape are shifted in position from the send-off enabling position to the send-off disabling position to let the pair of tape holding portions release their hold on the component storage tape. At this time, the pair of holding portions turn around the first pivot disposed on the downstream end in the tape send-off direction of the operating lever to make a positional shift from the send-off enabling position to the send-off disabling position. In other words, as a result of their positional shift from the send-off enabling position to the send-off disabling position, the pair of holding portions tilt downward such that the downstream ends in the tape send-off direction are on the upper side as the upstream ends are on the lower side. Thus, the component storage tape, which has been lead into the tape traveling path along the guide surfaces of the pair of tape lead-in guides, is folded on an area between the tape lead-in guides and the pair of tape holding portions, as a result of the positional shift of the pair of tape holding portions.

It is difficult to fold the component storage tape on its part where the component storage portion is located. It is preferable, therefore, that the component storage tape be folded on an area between adjacent component storage portions. For example, when the pair of tape lead-in guides and the pair of tape holding portions are located close to each other in the tape send-off direction, timing to cause the pair of tape holding portions to shift in position downward from the send-off enabling position to the send-off disabling position needs to be matched to timing to locate the area between adjacent component storage portions of the component storage tape, which is sent off intermittently by the second tape send-off portion, in the gap between the tape lead-in guides and the tape holding portions.

To meet this requirement, in the tape lead-in mechanism, the separation distance along the tape send-off direction between the downstream side edges in the tape send-off direction of the pair of tape holding portion and the upstream side edges in the tape send-off direction of the guide surfaces of the pair of tape lead-in guides is determined to be equal to or larger than the length between respective centers of adjacent component storage portions of the component storage tape. As a result, on the component storage tape sent off intermittently by the second tape send-off portion, the area between adjacent component storage portions constantly lies in the gap between the tape lead-in guides and the tape holding portions. Thus, when the pair of tape holding portions are shifted in position downward from the send-off enabling position to the send-off disabling position at any given point of time, the component storage tape is always folded on the area between adjacent component storage portions in a preferable manner.

A component mounter according to another aspect of the present disclosure includes: the above component feeding device; and a head unit that takes out a component transferred to the component take-out position by the component feeding device.

This component mounter includes the component feeding device that can transfer components stored in the component storage tape steadily to the component take-out position. A drop in the efficiency of production of component-carrying boards by the component mounter is, therefore, prevented.

As described above, according to the present disclosure, the component feeding device that ensures steady traveling of the component storage tape lead into the tape traveling path to allow steady component feeding and the component mounter having the component feeding device can be provided.

What is claimed is:

1. A component feeding device that transfers a component to a component take-out position, using a component storage tape having a plurality of component storage portions storing the components therein, the component storage portions being arranged at given intervals, the component feeding device comprising:
   a tape traveling path that is a path leading to the component take-out position of the component storage tape; and
   a tape lead-in mechanism configured to lead the component storage tape into the tape traveling path,
   wherein the tape lead-in mechanism includes:
   a pair of frames arranged to face each other across a gap in a tape width direction of the component storage tape, the pair of frames each having an opening;
   a first tape send-off portion fitted to the pair of frames on an upper side relative to the opening, the first tape send-off portion being configured to send off the component storage tape in a tape send-off direction in which the component storage tape heads for the tape traveling path;
   a pair of tape holding portions disposed between the pair of frames on a lower side relative to the first tape send-off portion, the pair of tape holding portions being configured to hold both ends in the tape width direction of the component storage tape sent off by the first tape send-off portion, respectively;
   an operating lever extending in the tape send-off direction, the operating lever being supported on the pair of frames such that applying an operation force to an upstream end in the tape send-off direction of the operating lever causes the operating lever to turn around a first pivot disposed on a downstream end in the tape send-off direction and extending in the tape width direction; and
   a coupling portion coupling the pair of tape holding portions to the operating lever such that the pair of tape holding portions are allowed to turn together with the turned operation lever and that as a result of the turn, the pair of tape holding portions are allowed to change in posture between a holding posture in which the pair of tape holding portions are able to hold the component storage tape and a hold releasing posture in which the pair of tape holding portions release a hold on the component storage tape,
   wherein as a result of turning together with the turned operating lever, the pair of tape holding portions shift in position between a send-off enabling position at which the component storage tape can be sent off by the first tape send-off portion and a send-off disabling position at which the component storage tape is released from a state of being sent off by the first tape send-off portion, the send-off disabling position facing the opening on the lower side relative to the send-off enabling position, and
   wherein when set at the send-off disabling position, the pair of tape holding portions take the hold releasing posture.

2. The component feeding device according to claim 1, wherein when the pair of tape holding portions turn together with the turned operating lever to shift in position between the send-off enabling position and the send-off disabling position, the pair of tape holding portions are subjected to posture change regulation by the pair of frames to keep taking the holding posture, and when the pair of tape holding portions are set at the send-off disabling position, the pair of tape holding portions are released from posture change regulation by the pair of frame to take the hold releasing posture in which the tape holding portions spread outward to come out of the opening.

3. The component feeding device according to claim 2, wherein the coupling portion includes:
a holder fixed to a lower surface of the operating lever;
a movable shaft penetrating the operating lever and the holder to extend in a vertical direction, the movable shaft being capable of moving in the vertical direction; and
a pair of link members that couple the pair of tape holding portions respectively to the movable shaft, and
wherein each of the pair of link members has:
a supporting point portion fixed to the holder turn around a second pivot extending in the tape send-off direction;
a force-applying point portion fixed to the movable shaft to turn around a third pivot parallel with the second pivot; and
an acting-on point portion connected to the pair of tape holding portions.

4. The component feeding device according to claim 3, wherein the coupling portion further includes a biasing member fixed to the holder, the biasing member applying a downward pressure to the movable shaft, and
wherein when the pair of tape holding portions are set at the send-off disabling position, a downward motion of the movable shaft toward a lower side caused by a pressure applied by the biasing member is transmitted to the force-applying point portion, thus causing the acting-on point portion to rock on the supporting point portion, at each of the pair of link members, and, consequently, the pair of tape holding portions change in posture from the holding posture to the hold releasing posture.

5. The component feeding device according to claim 4, wherein the coupling portion further includes:
a lower limit stopper member fixed to an upper end of the movable shaft, the lower limit stopper member regulating a lower limit position of the movable shaft that moves in a vertical direction; and
a plate that extends along the tape send-off direction, the plate being fixed to a lower end of the movable shaft such that the plate above the component storage tape held by the pair of tape holding portions faces to the component storage tape.

6. A component mounter comprising:
the component feeding device according to claim 2; and
a head unit configured to take out a component transferred to the component take-out position by the component feeding device.

7. A component mounter comprising:
the component feeding device according to claim 3; and
a head unit configured to take out a component transferred to the component take-out position by the component feeding device.

8. A component mounter comprising:
the component feeding device according to claim 4; and
a head unit configured to take out a component transferred to the component take-out position by the component feeding device.

9. A component mounter comprising:
the component feeding device according to claim 5; and
a head unit configured to take out a component transferred to the component take-out position by the component feeding device.

10. The component feeding device according to claim 1, wherein the tape lead-in mechanism further includes:
a projecting piece projecting from a lower surface of the operating lever, the projecting piece pushing downward the component storage tape in a motion that follows a turn of the operating lever, the component storage tape being released from a hold by the pair of tape holding portions when the tape holding portions take the hold releasing posture; and
a tape support portion fitted to the pair of frames around the opening, the tape support portion regulating a positional shift of the component storage tape toward an upper side, the component storage tape being pushed downward by the projecting piece, while supporting the component storage tape.

11. A component mounter comprising:
the component feeding device according to claim 10; and
a head unit configured to take out a component transferred to the component take-out position by the component feeding device.

12. The component feeding device according to claim 1, wherein each of the pair of tape holding portion is formed to extend along the tape send-off direction, and
wherein the coupling portion includes:
a first coupling portion that couples upstream ends in the tape send-off direction of the pair of tape holding portions to the operating lever; and
a second coupling portion that couples downstream ends in the tape send-off direction of the pair of tape holding portions to the operating lever.

13. The component feeding device according to claim 12, further comprising
a second tape send-off portion disposed on the tape traveling path, the second tape send-off portion being configured to receive the component storage tape lead into the tape traveling path by the tape lead-in mechanism and intermittently send off the component storage tape to match a center of the component storage portion to the component take-out position,
wherein the tape lead-in mechanism further includes a pair of tape lead-in guides fitted respectively to downstream ends in the tape send-off direction of the pair of frames, the pair of tape lead-in guides each having a guide surface configured to guide the component storage tape sent off by the first tape send-off portion to lead the component storage tape into the tape traveling path, and
wherein a separation distance along the tape send-off direction between downstream side edges in the tape send-off direction of the pair of tape holding portions and upstream side edges in the tape send-off direction of the guide surfaces of the pair of tape lead-in guides is determined to be equal to or larger than a length between respective centers of the component storage portions of the component storage tape, the component storage portions being adjacent to each other.

14. A component mounter comprising:
the component feeding device according to claim 13; and
a head unit configured to take out a component transferred to the component take-out position by the component feeding device.

15. A component mounter comprising:
the component feeding device according to claim 12; and a head unit configured to take out a component transferred to the component take-out position by the component feeding device.

16. A component mounter comprising:

the component feeding device according to claim 1; and a head unit configured to take out a component transferred to the component take-out position by the component feeding device.

* * * * *